(12) United States Patent  
Seo et al.

(10) Patent No.: US 10,317,478 B2  
(45) Date of Patent: Jun. 11, 2019

(54) MAGNETIC FIELD SENSOR PACKAGE

(71) Applicant: LG INNOTEK CO., LTD., Seoul (KR)

(72) Inventors: Sang Won Seo, Seoul (KR); Jeong Gi Seo, Seoul (KR); Chul Kim, Seoul (KR); Yong Jun Ko, Seoul (KR); Wan Seop Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 500 days.

(21) Appl. No.: 14/913,558

(22) PCT Filed: Aug. 21, 2014

(86) PCT No.: PCT/KR2014/007746  
§ 371 (c)(1),  
(2) Date: Jun. 13, 2016

(87) PCT Pub. No.: WO2015/026167  
PCT Pub. Date: Feb. 26, 2015

(65) Prior Publication Data  
US 2016/0282423 A1    Sep. 29, 2016

(30) Foreign Application Priority Data

Aug. 21, 2013  (KR) .................. 10-2013-0099296  
Jan. 28, 2014  (KR) .................. 10-2014-0010735  
Jan. 28, 2014  (KR) .................. 10-2014-0010736

(51) Int. Cl.  
*G01R 33/06* (2006.01)  
*G01R 33/00* (2006.01)

(52) U.S. Cl.  
CPC ......... *G01R 33/06* (2013.01); *G01R 33/0052* (2013.01)

(58) Field of Classification Search  
CPC ............... G01R 33/06; G01R 33/0052; G01R 33/0286; G01R 33/028; G01R 33/0283;  
(Continued)

(56) References Cited

U.S. PATENT DOCUMENTS 4,680,544 A * 7/1987 Rudolf ................. G01R 33/028  
324/259  
8,395,252 B1    3/2013 Yang  
(Continued)

FOREIGN PATENT DOCUMENTS

JP    2013011469 A    1/2013  
KR    1019990023635 A    3/1999

OTHER PUBLICATIONS

International Search Report in International Application No. PCT/KR2014/007746, filed Aug. 21, 2014.

*Primary Examiner* — Lee E Rodak  
(74) *Attorney, Agent, or Firm* — Saliwanchik, Lloyd & Eisenschenk

(57) ABSTRACT

A magnetic field sensor package according to an embodiment includes: a package body; a magnetic field sensor disposed on top of the package body and including a sensor assembly in which a displacement is generated by a magnetic field; and a conductive line formed on the package body, which is for making current to be measured flow and generating a magnetic field for displacing the sensor assembly, wherein the conductive line generates a magnetic field applied in a perpendicular direction to the sensor assembly.

19 Claims, 37 Drawing Sheets

(58) Field of Classification Search
CPC ... G01R 33/02; G01P 15/125; G01P 15/0802; G01P 15/132; G01P 15/105; G01P 15/11; G01P 15/08; H03H 9/2463; H03H 9/02244; H03H 9/02259; H03H 9/2457; H03H 9/02377; H03H 9/02393; H03H 9/2405
See application file for complete search history.

(56) References Cited

U.S. PATENT DOCUMENTS

| | | | |
|---|---|---|---|
| 2003/0030527 A1* | 2/2003 | Mhani | H03H 9/02259 336/130 |
| 2003/0030998 A1* | 2/2003 | Mhani | H01H 50/005 361/760 |
| 2005/0270014 A1 | 12/2005 | Zribi et al. | |
| 2009/0033314 A1 | 2/2009 | Berkcan et al. | |
| 2010/0134101 A1 | 6/2010 | Riva et al. | |
| 2012/0086433 A1 | 4/2012 | Cheng et al. | |
| 2014/0111196 A1 | 4/2014 | Sakai et al. | |

* cited by examiner

[Fig. 1]
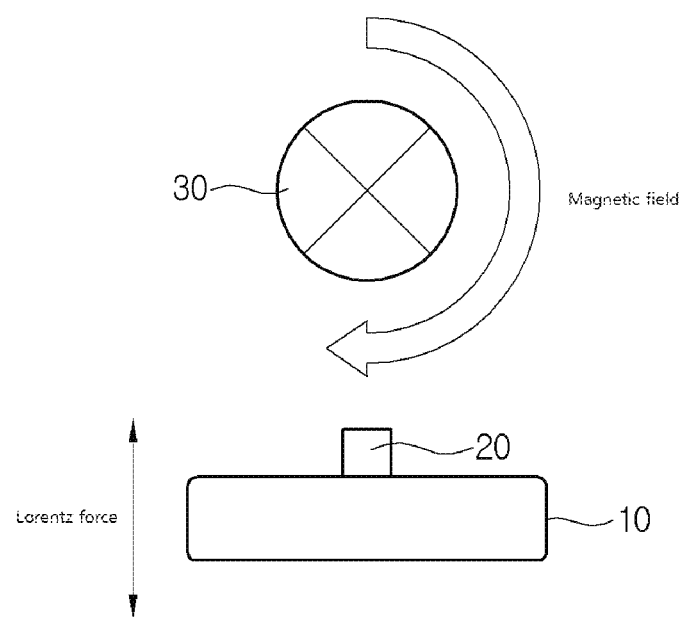

[Fig. 2]
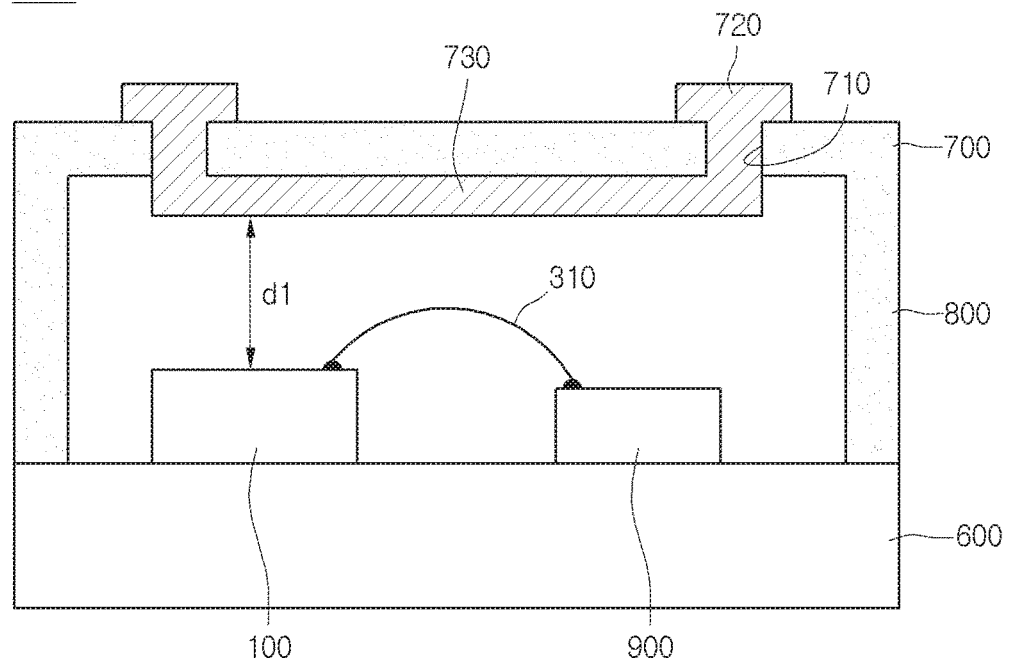
[Fig. 3]
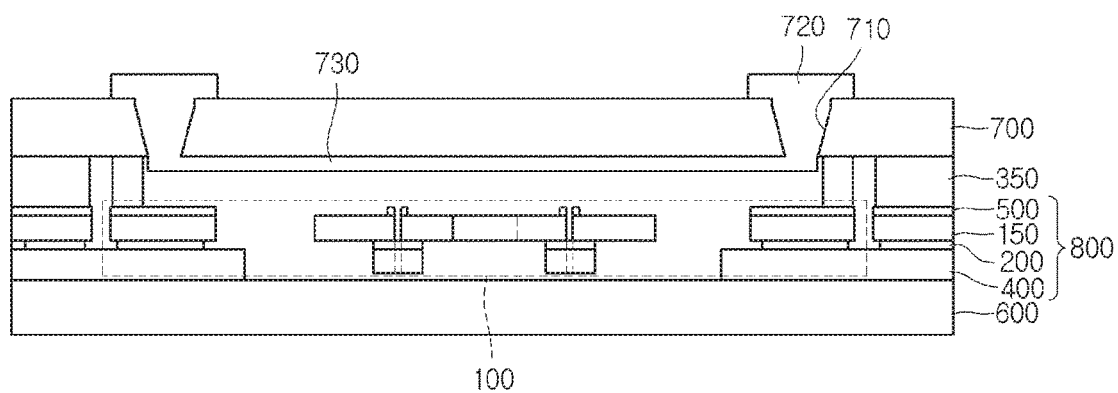

[Fig. 4]
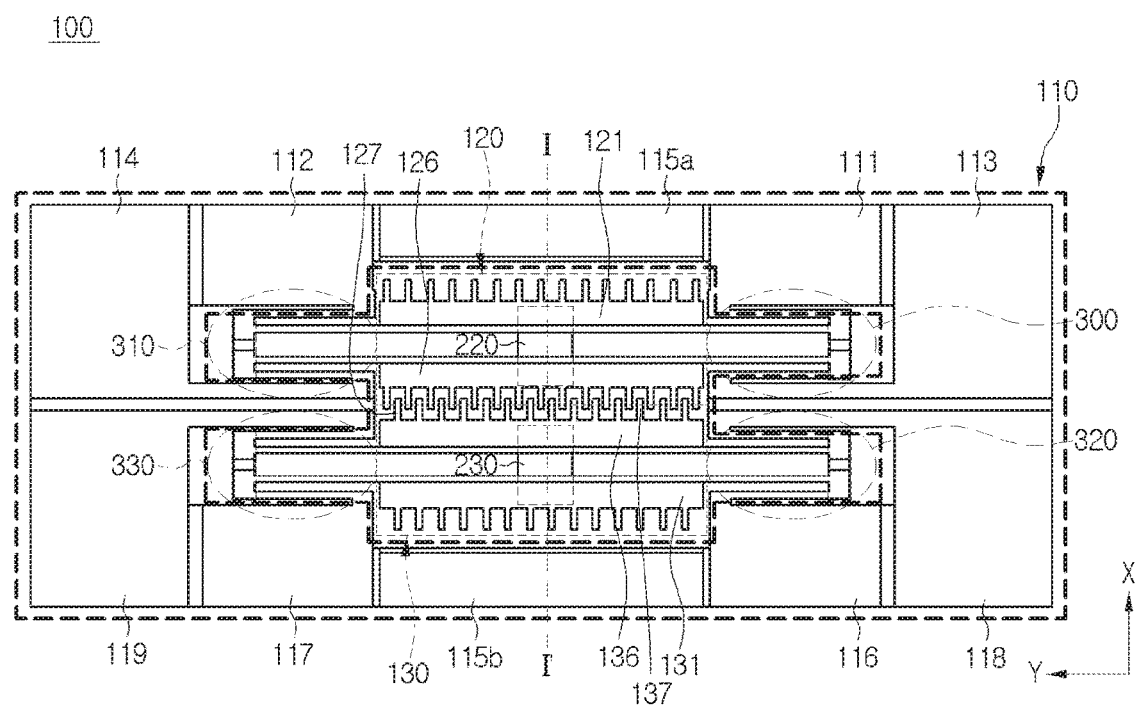

[Fig. 5]
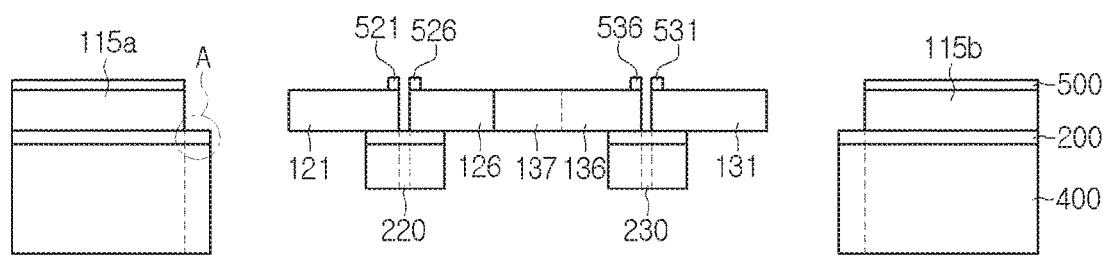
[Fig. 6]
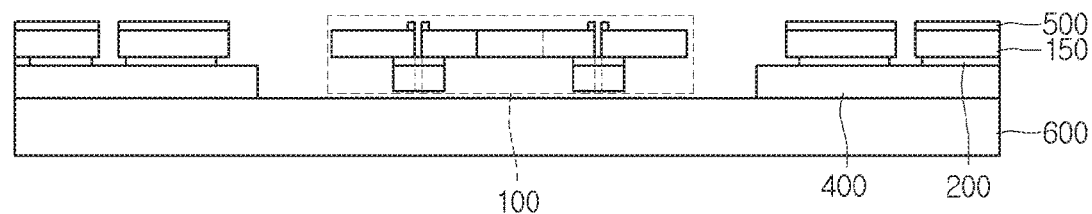
[Fig. 7]
[Fig. 8]

[Fig. 9]
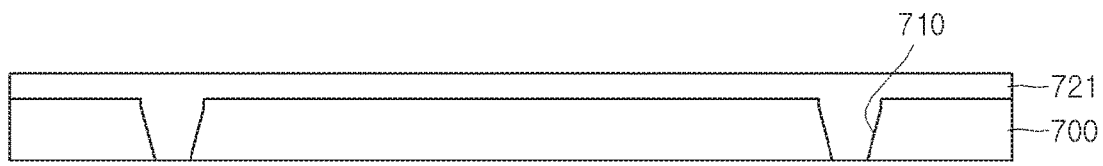
[Fig. 10]
[Fig. 11]
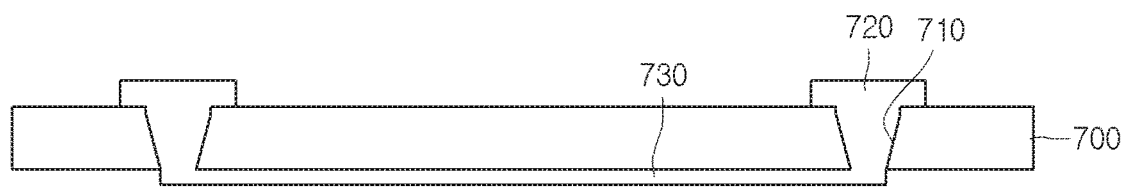
[Fig. 12]
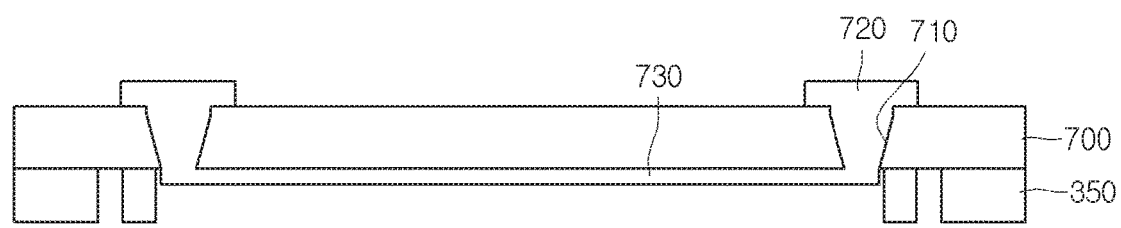

[Fig. 13]
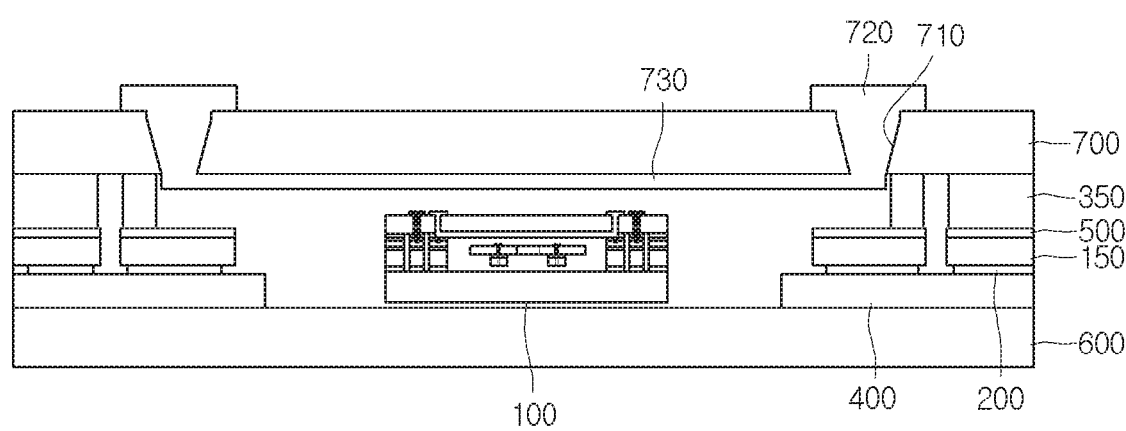

[Fig. 14]
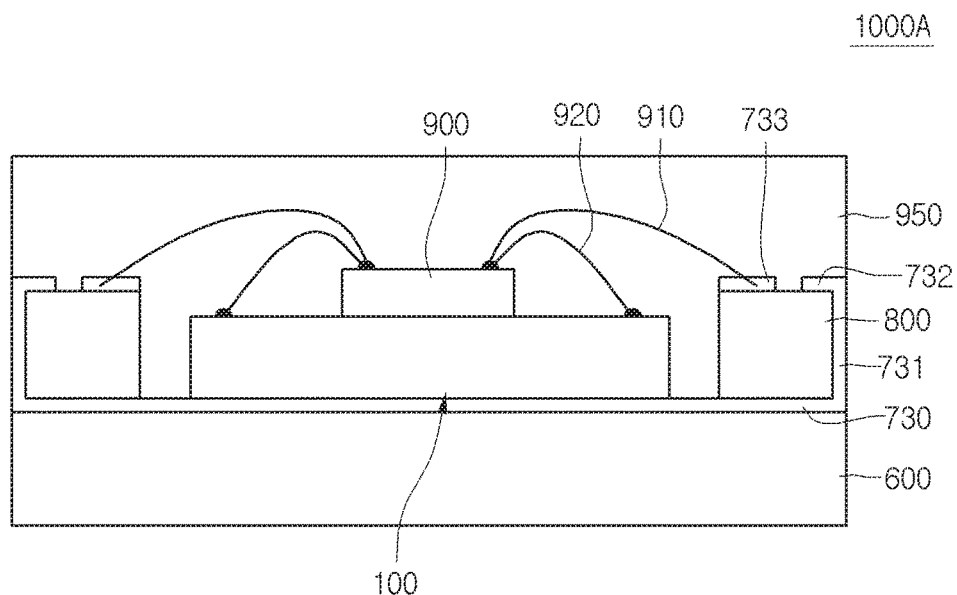
[Fig. 15]
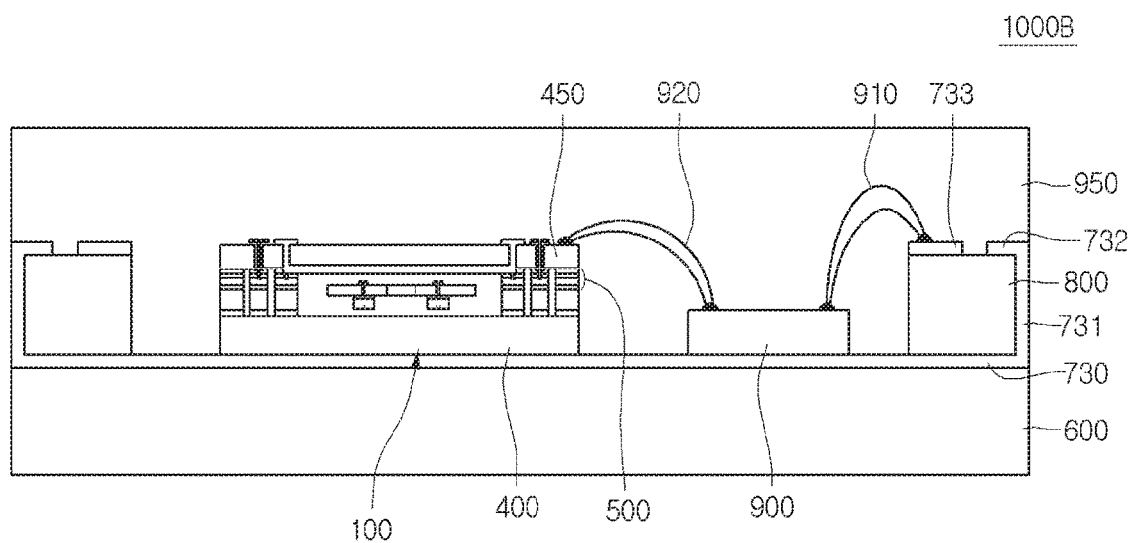

[Fig. 16]
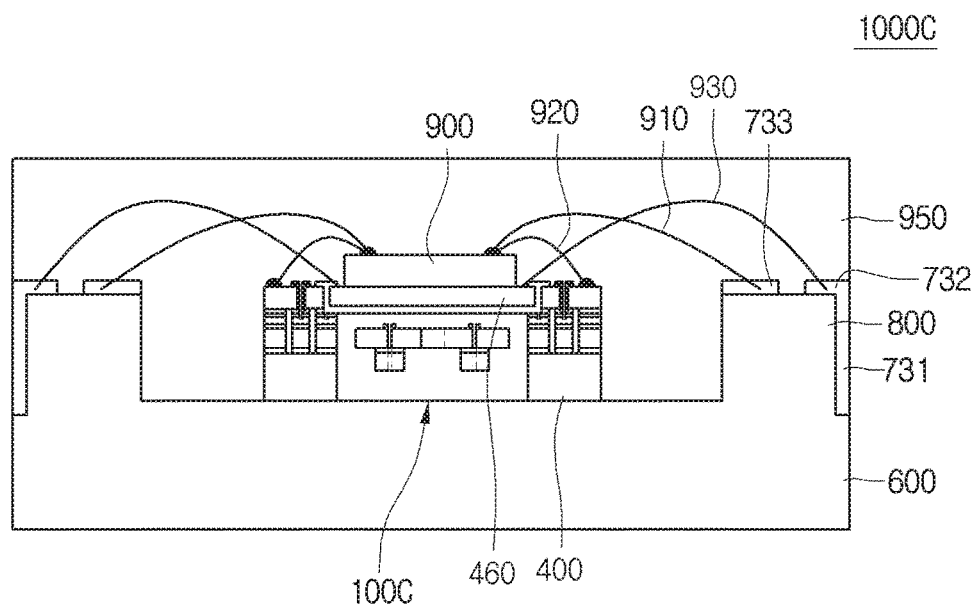
[Fig. 17]
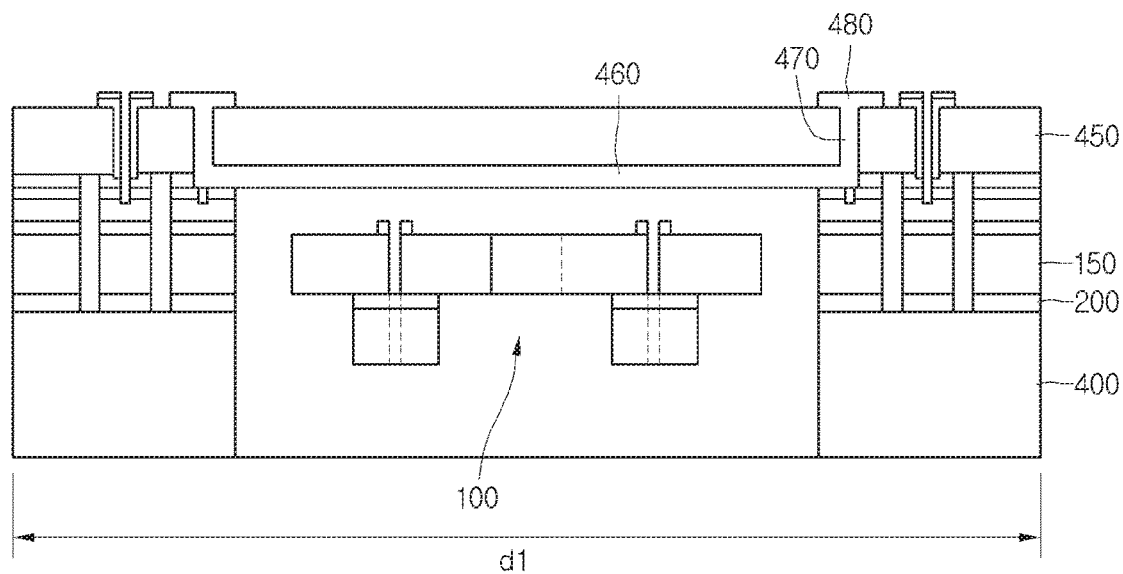

[Fig. 18]
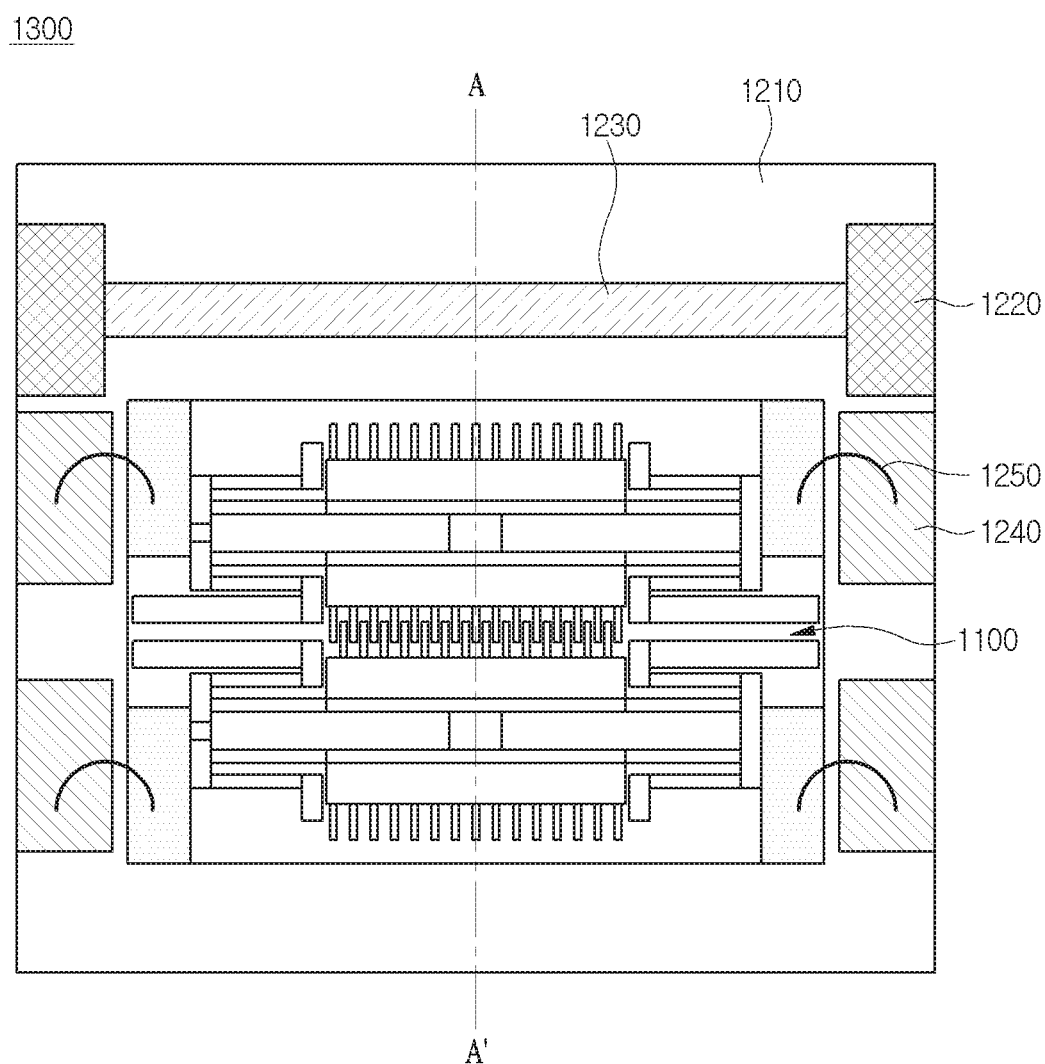

[Fig. 19]
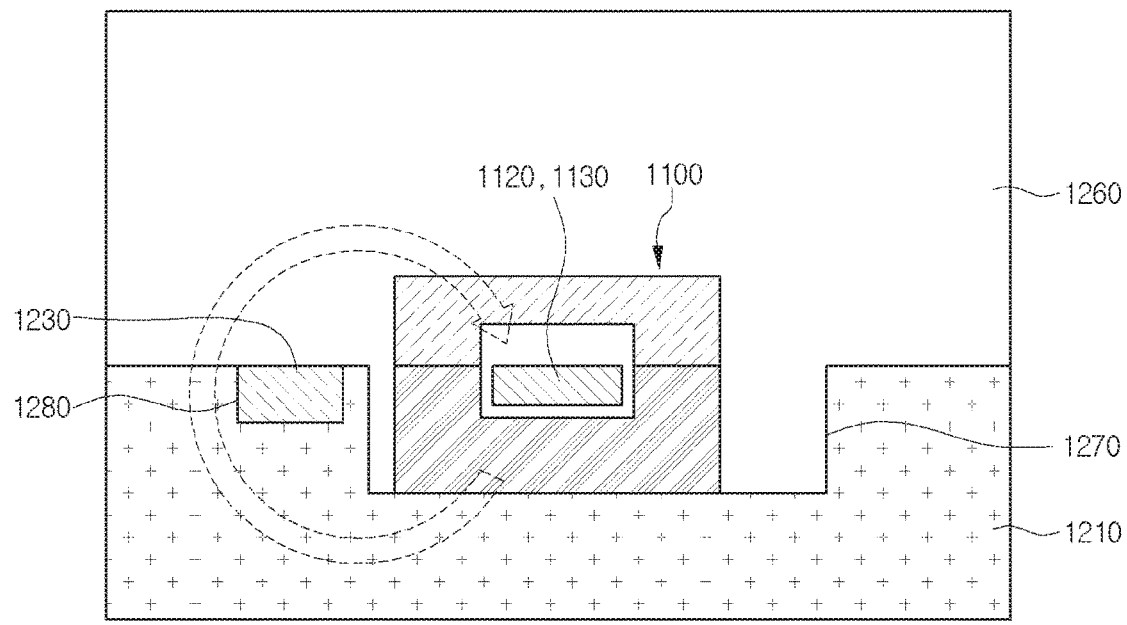
[Fig. 20]
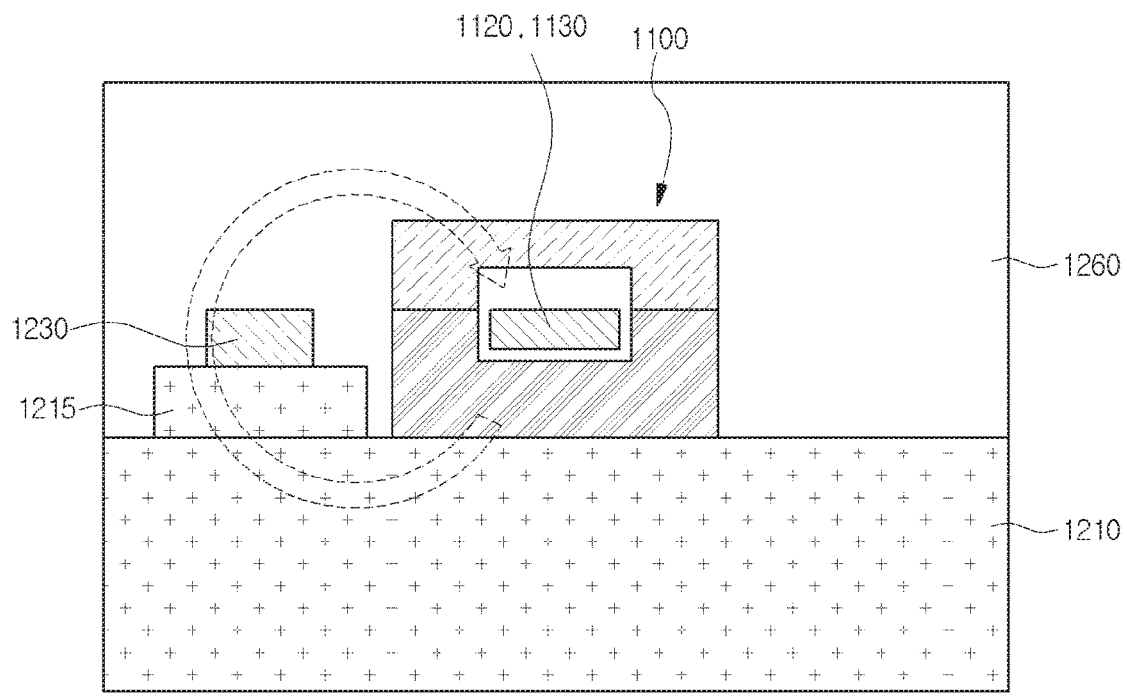

[Fig. 21]
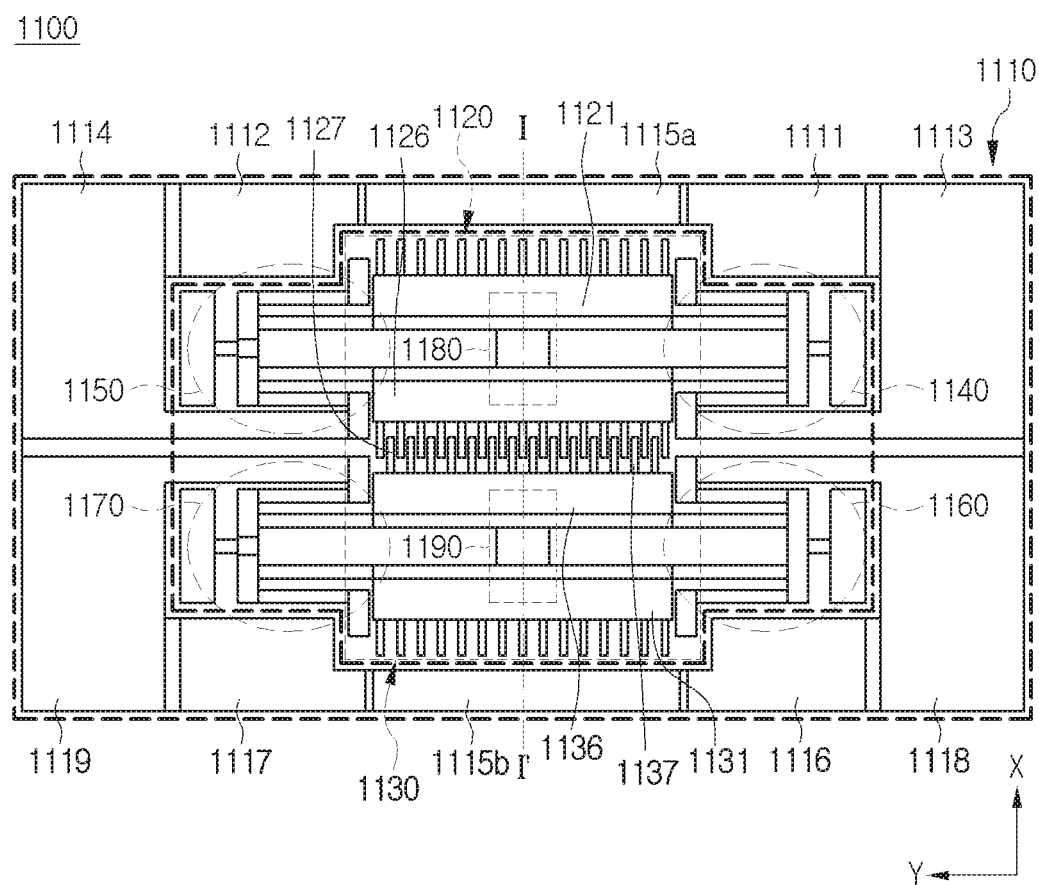

[Fig. 22]
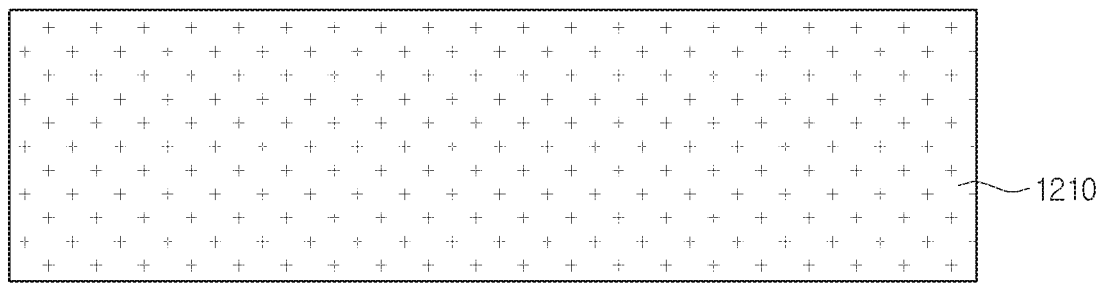
[Fig. 23]
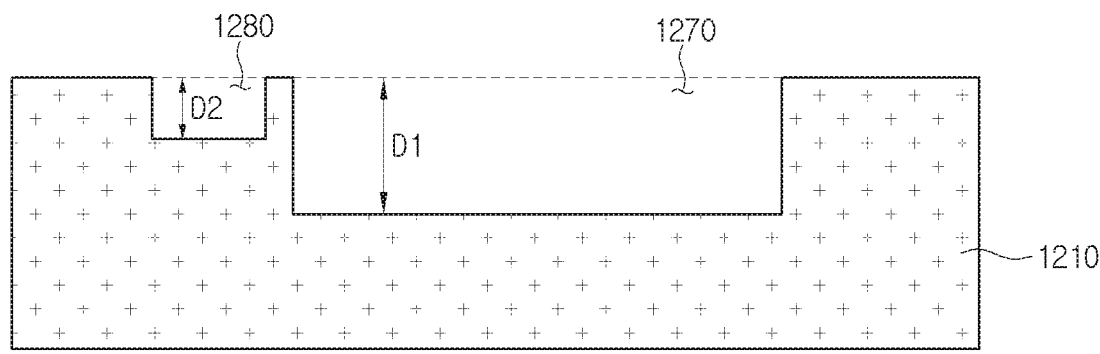

[Fig. 24]
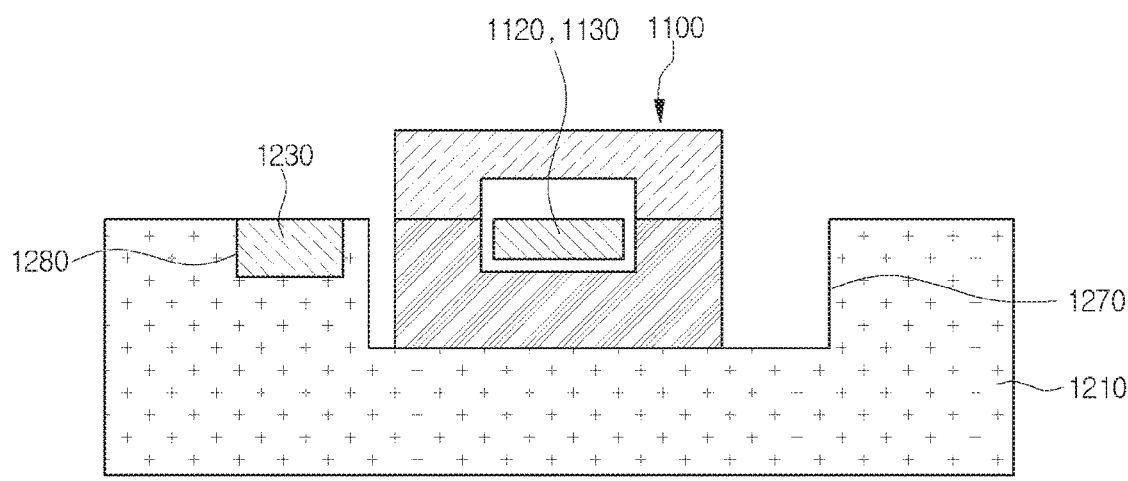
[Fig. 25]
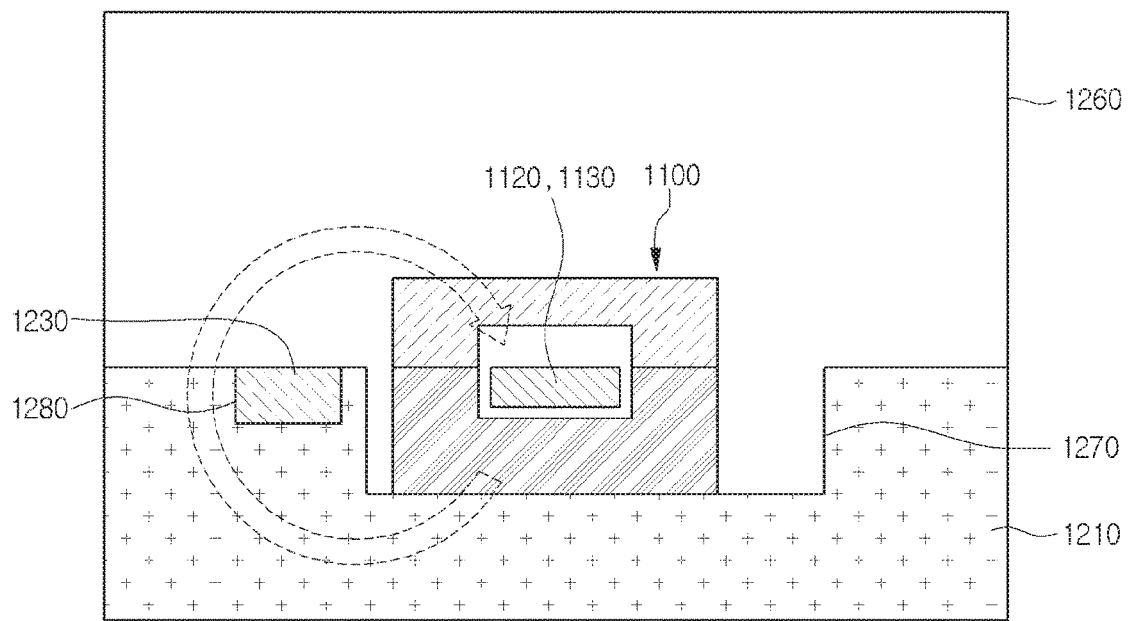

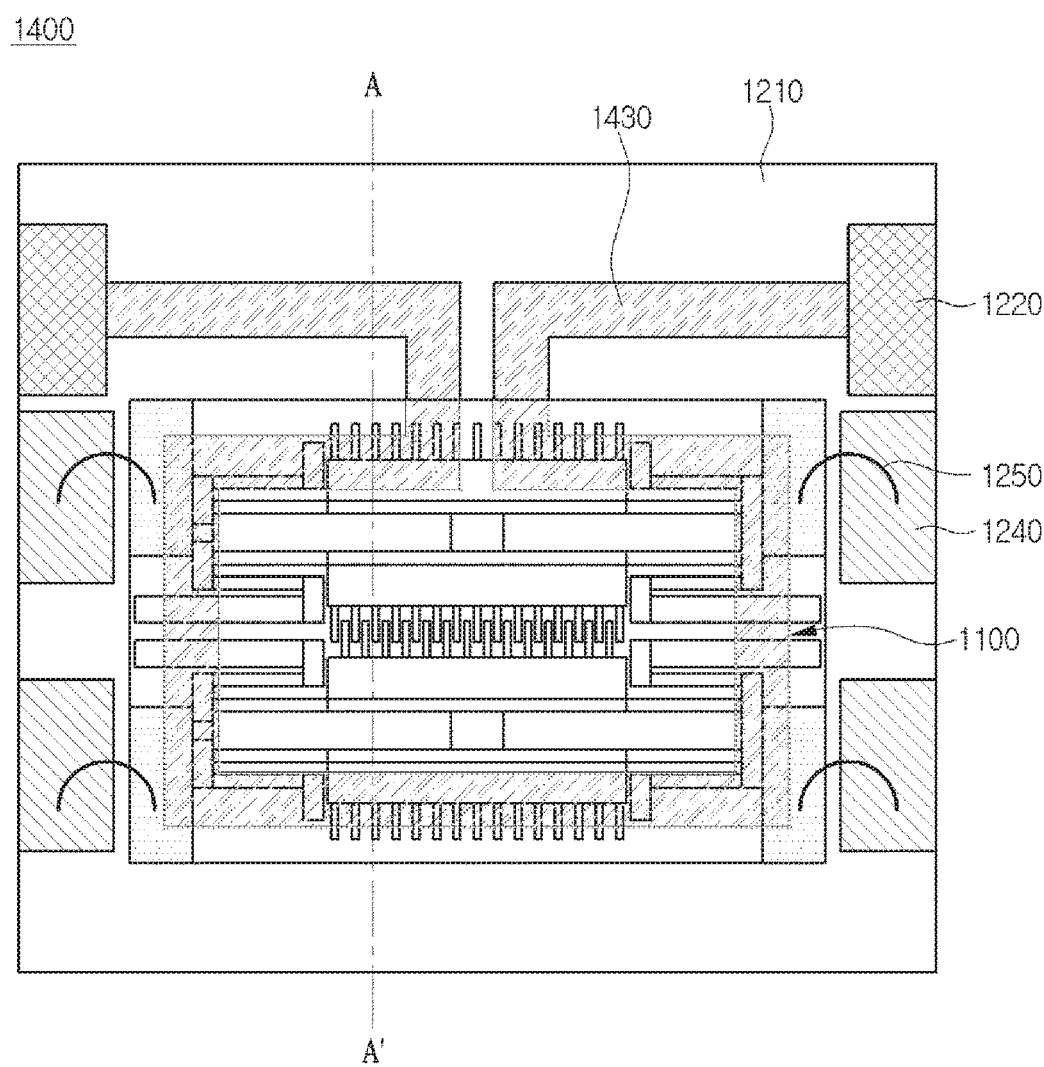
[Fig. 26]

[Fig. 27]
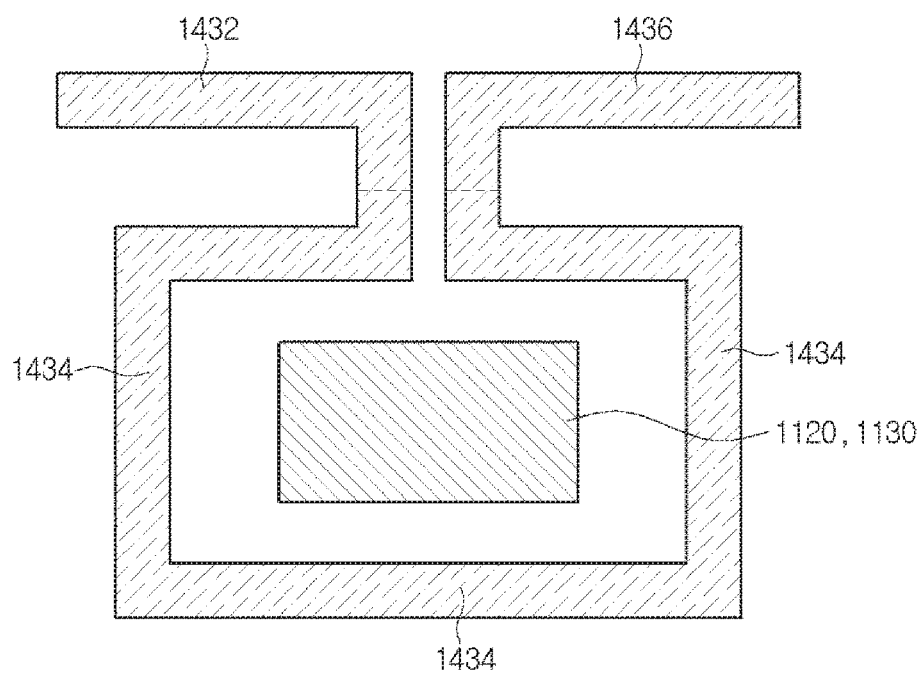

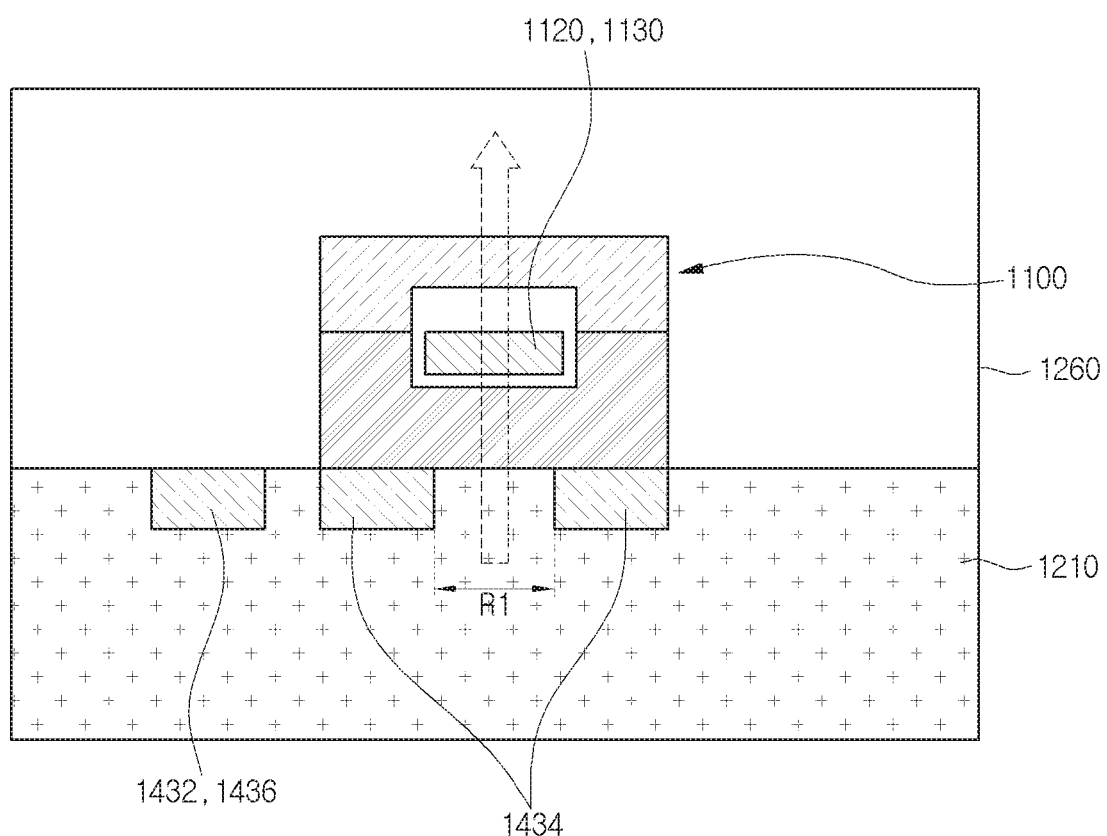
[Fig. 28]

[Fig. 29]
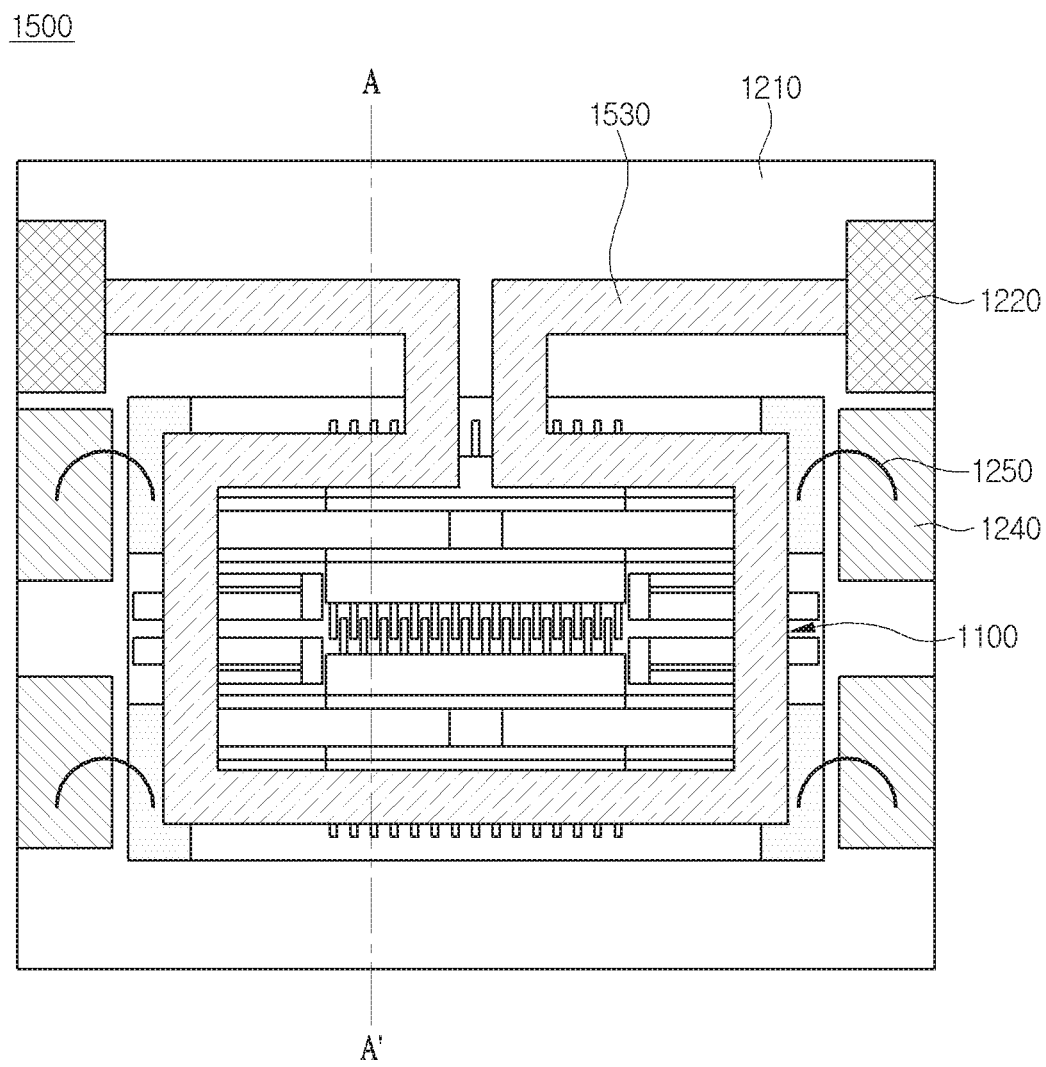

[Fig. 30]
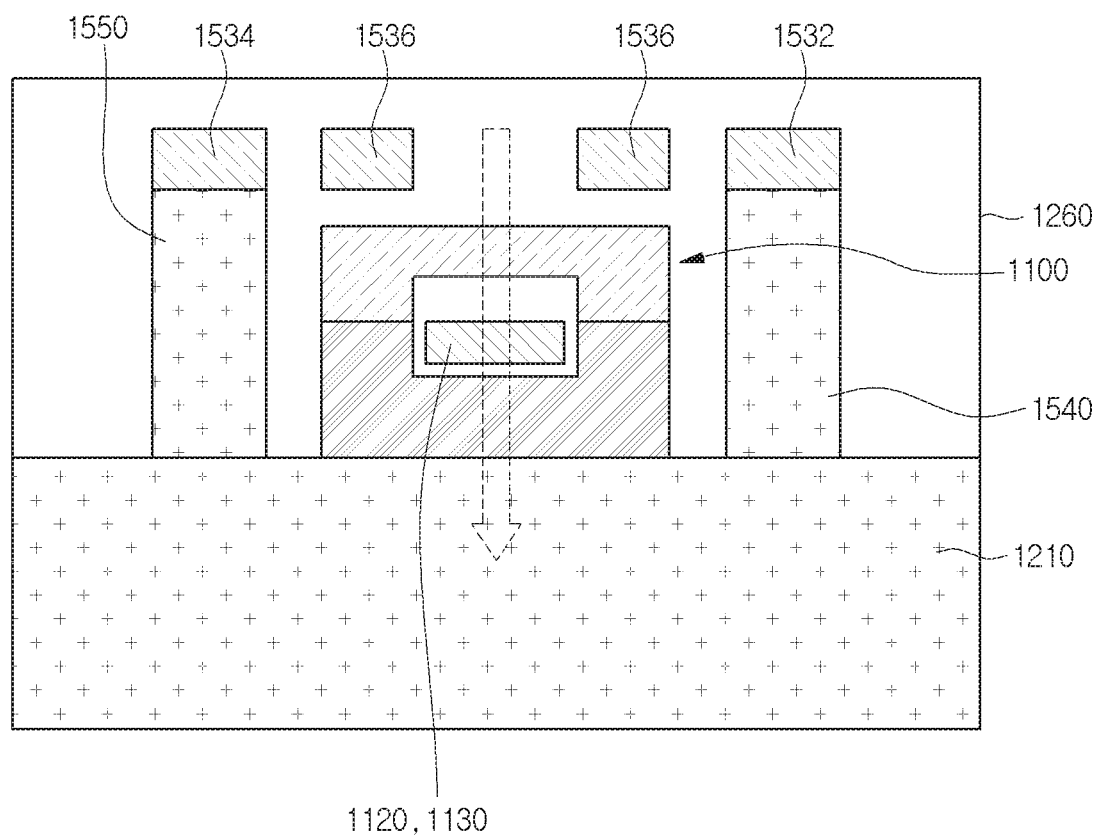

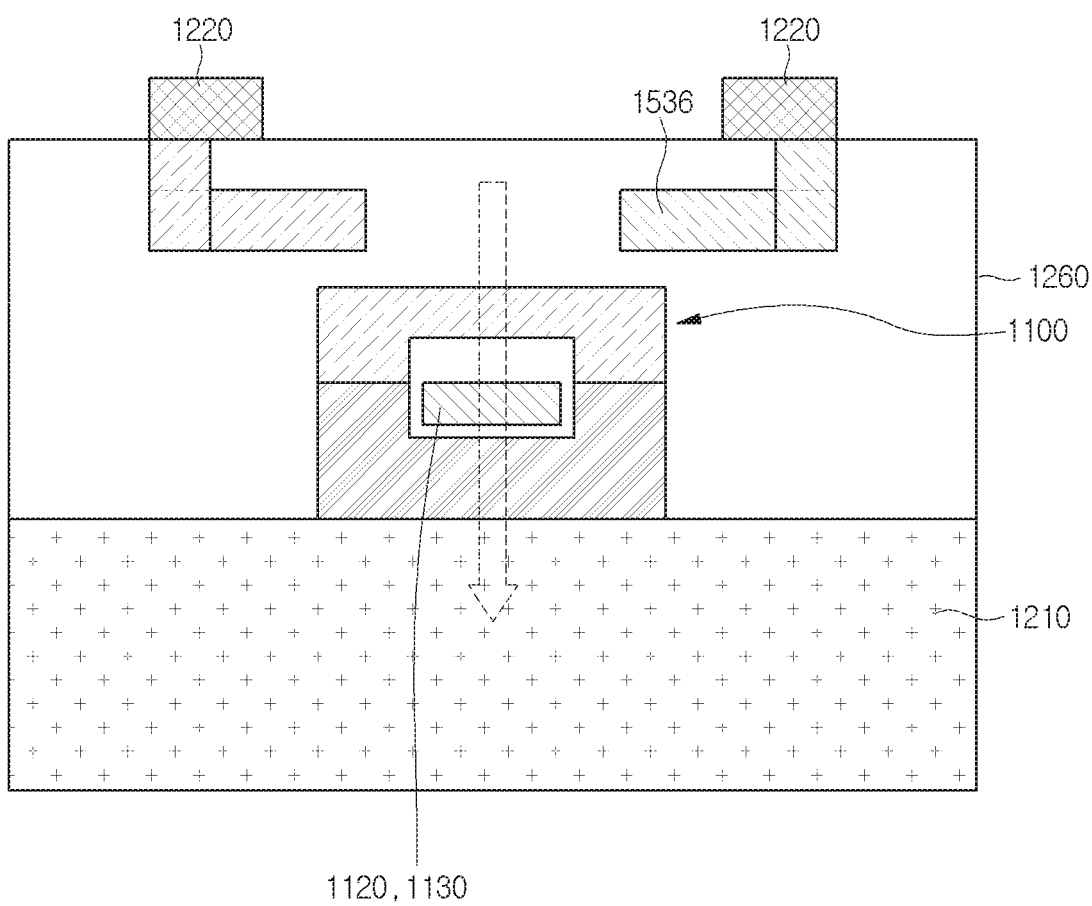
[Fig. 31]

[Fig. 32]
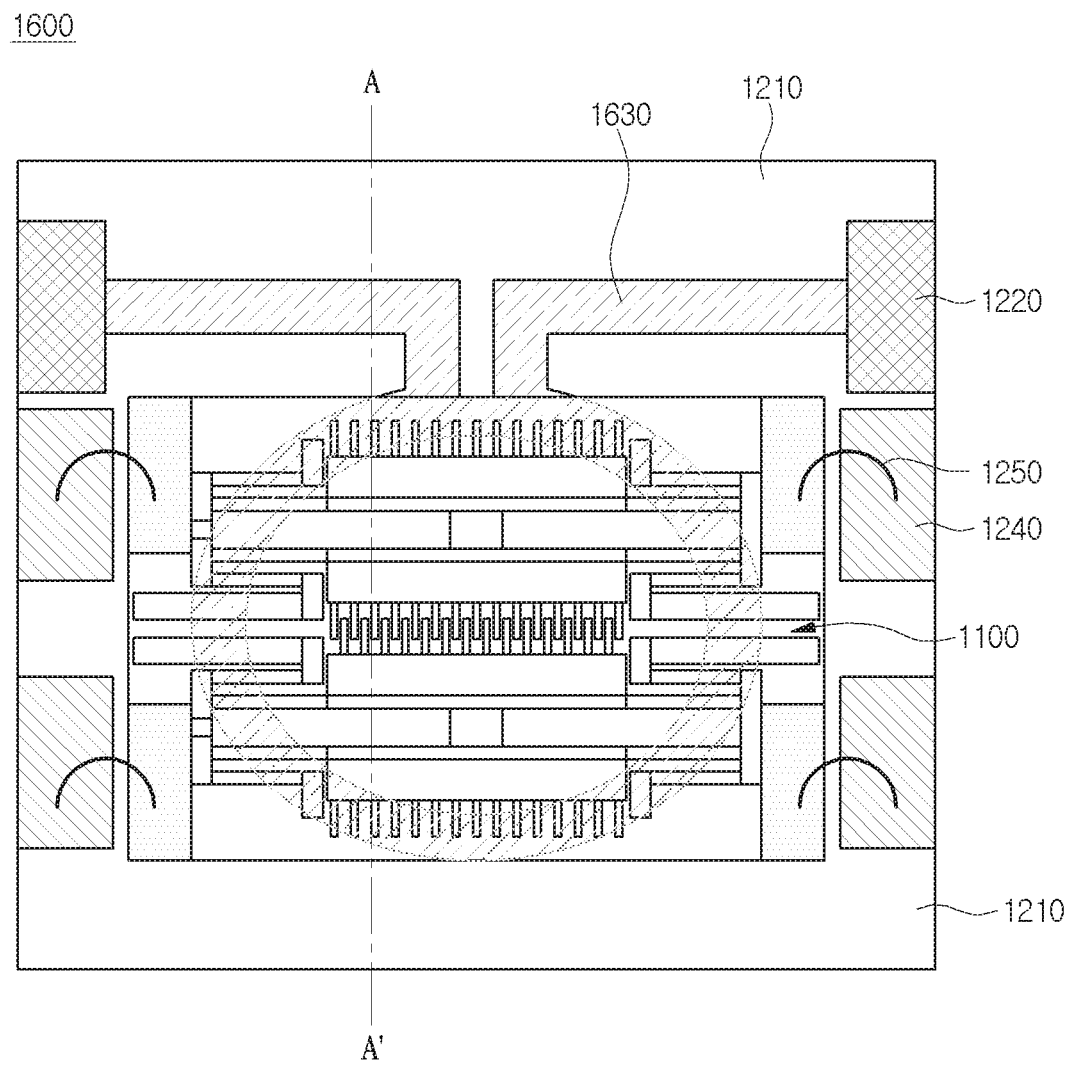

[Fig. 33]
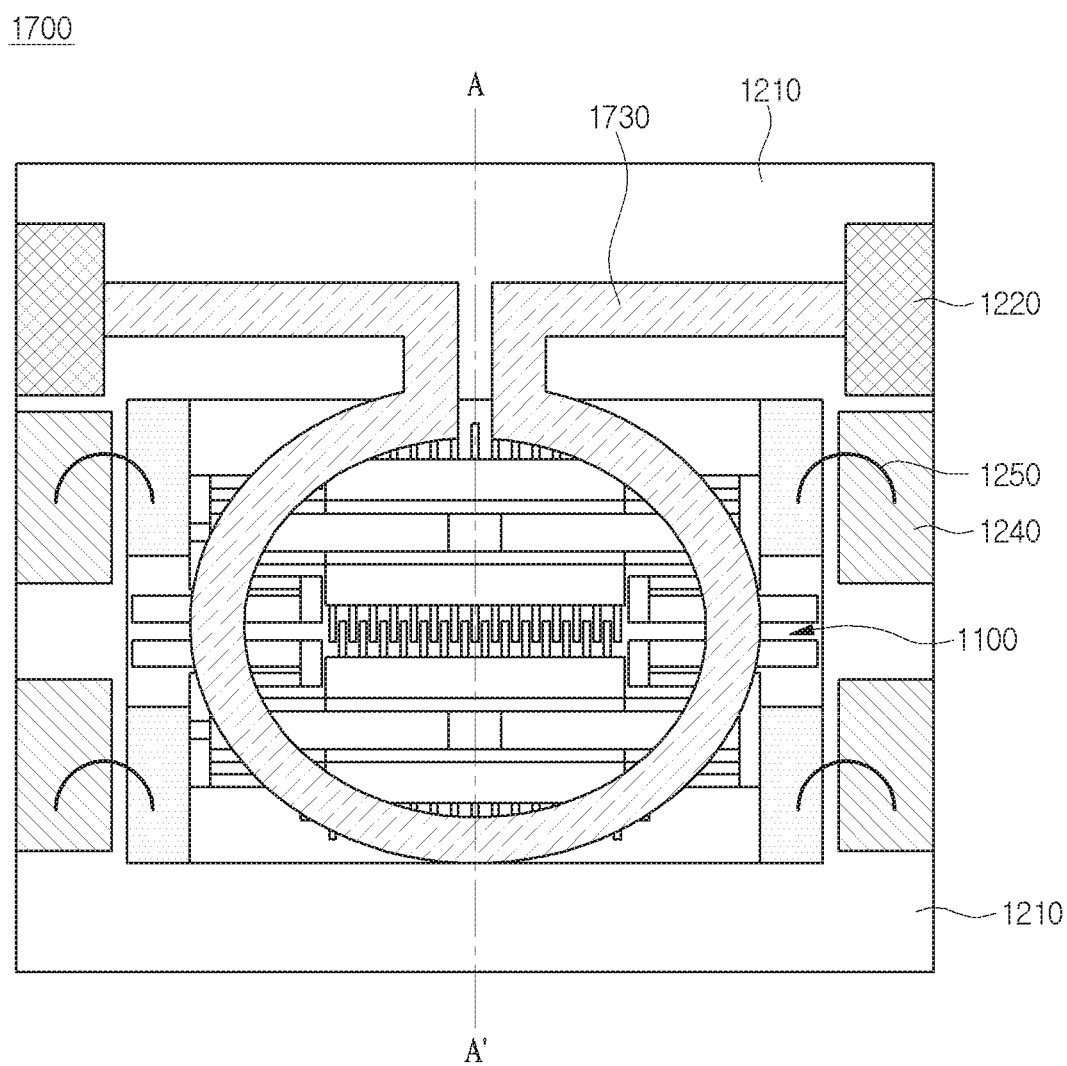

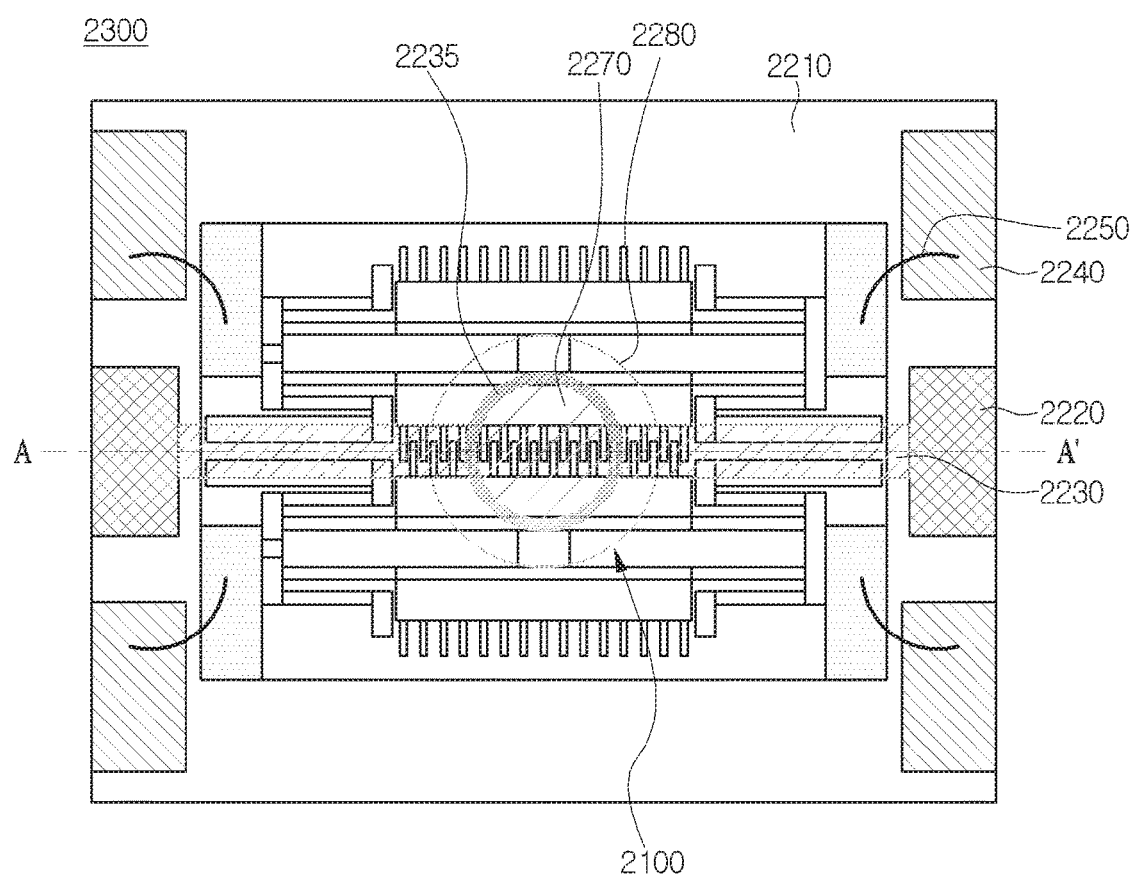
[Fig. 34]

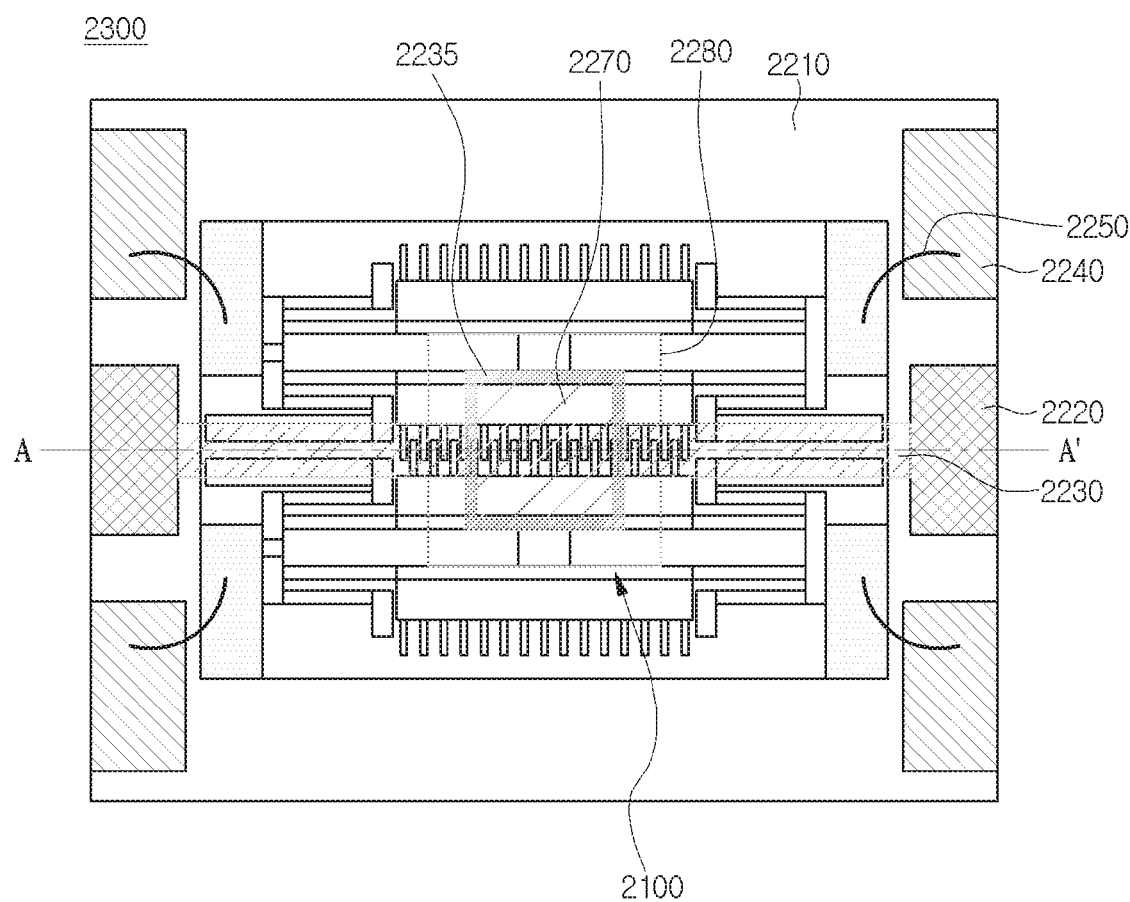

[Fig. 36]
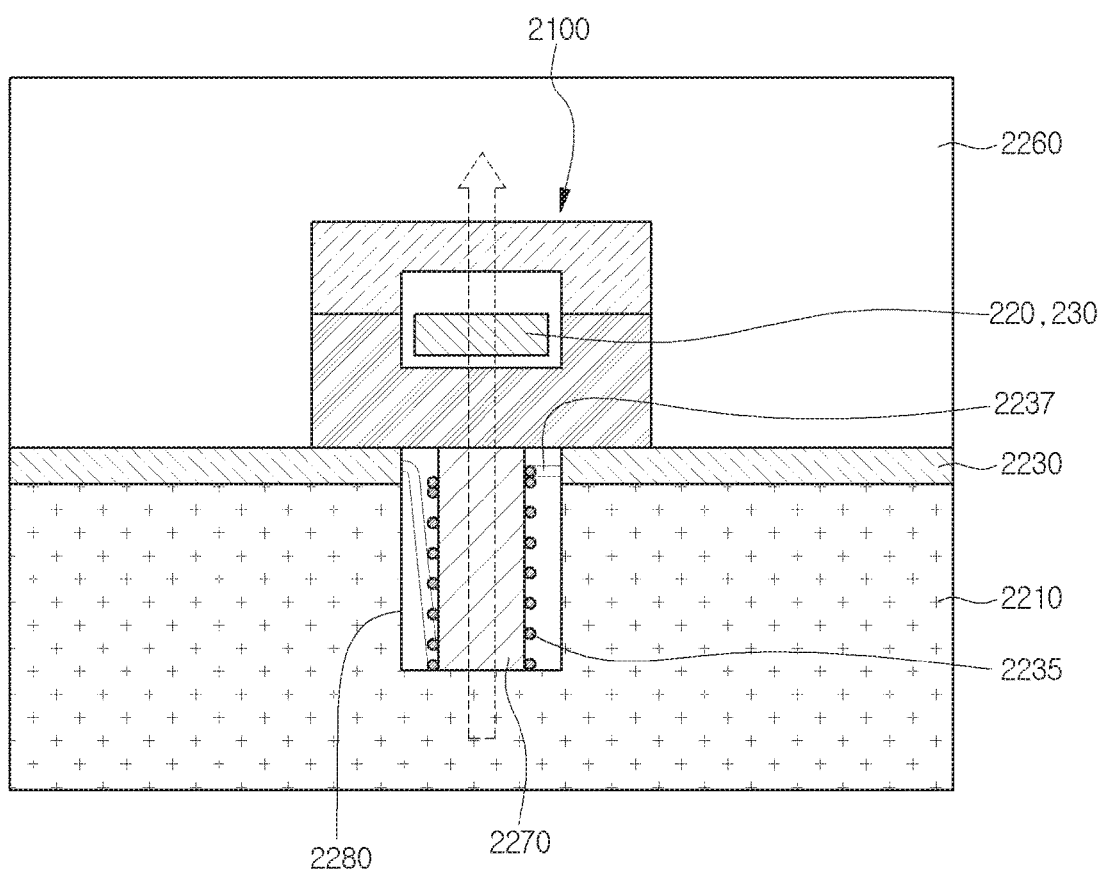

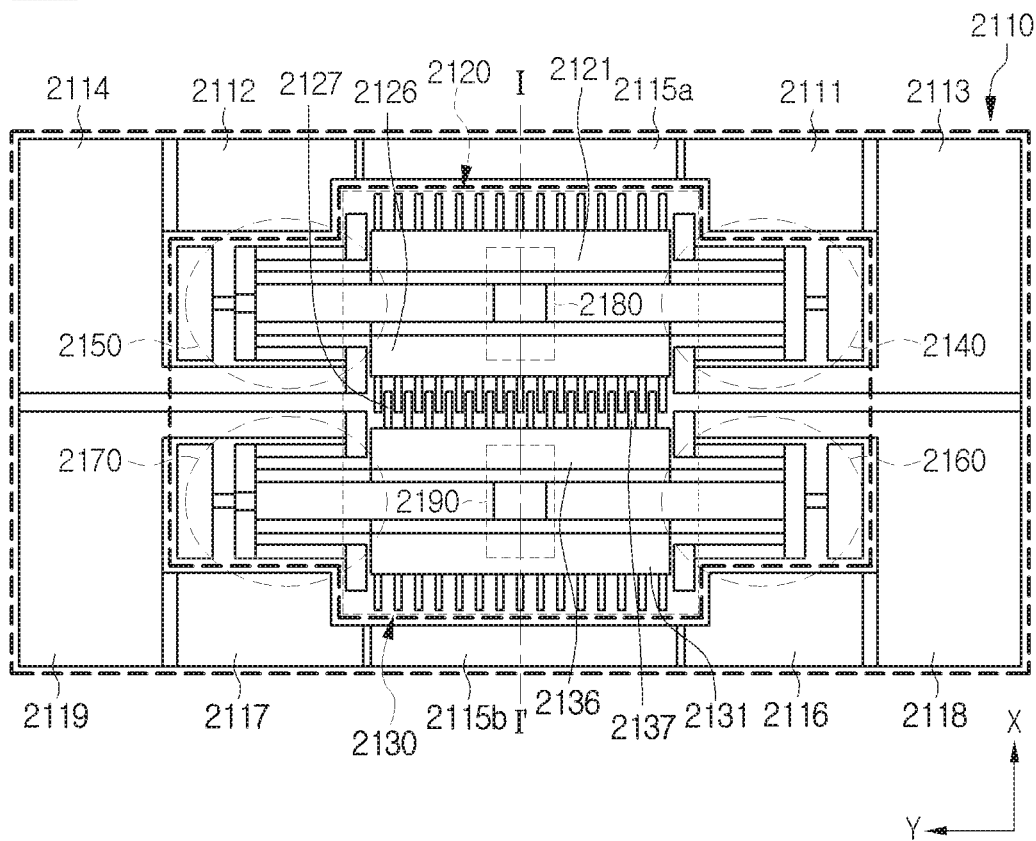
[Fig. 37]

[Fig. 38]
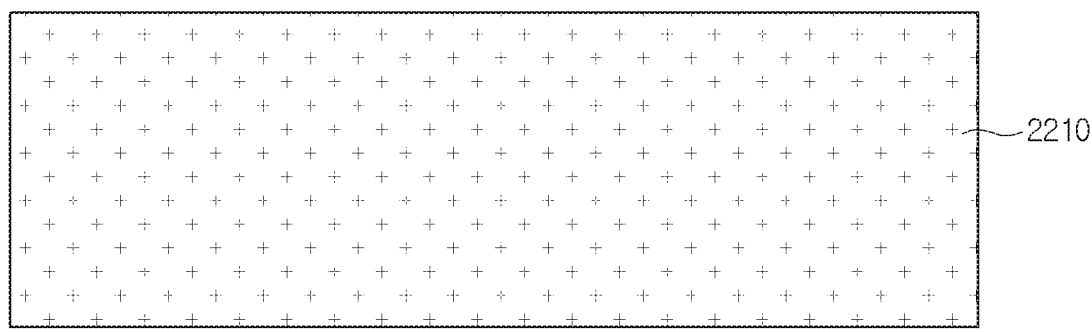
[Fig. 39]
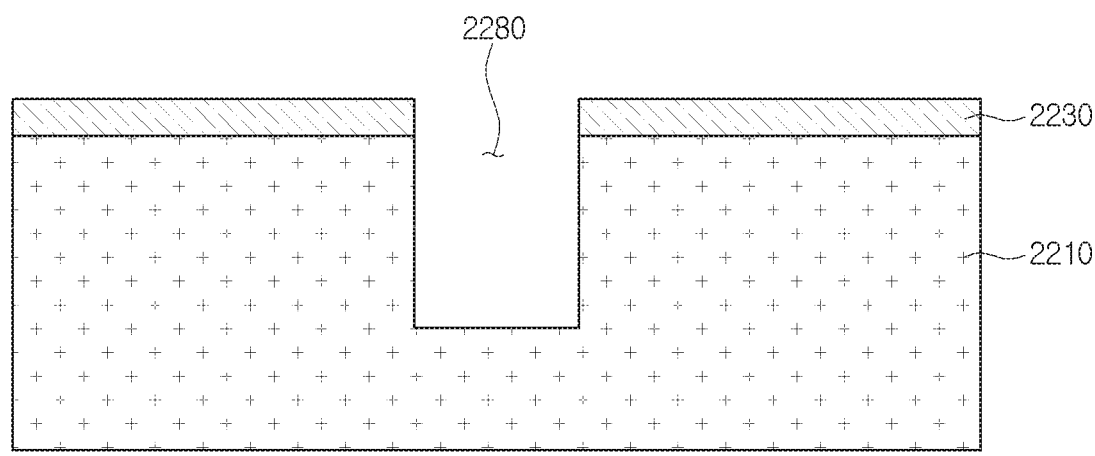

[Fig. 40]
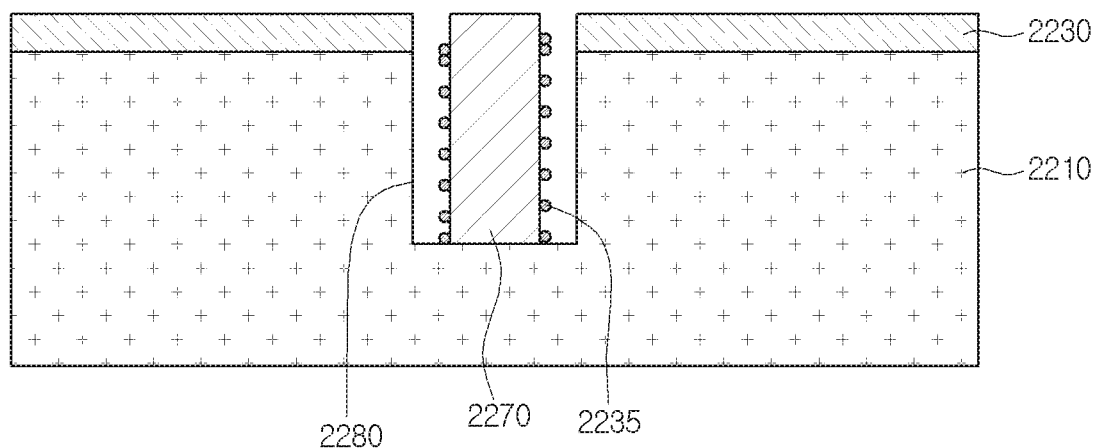
[Fig. 41]
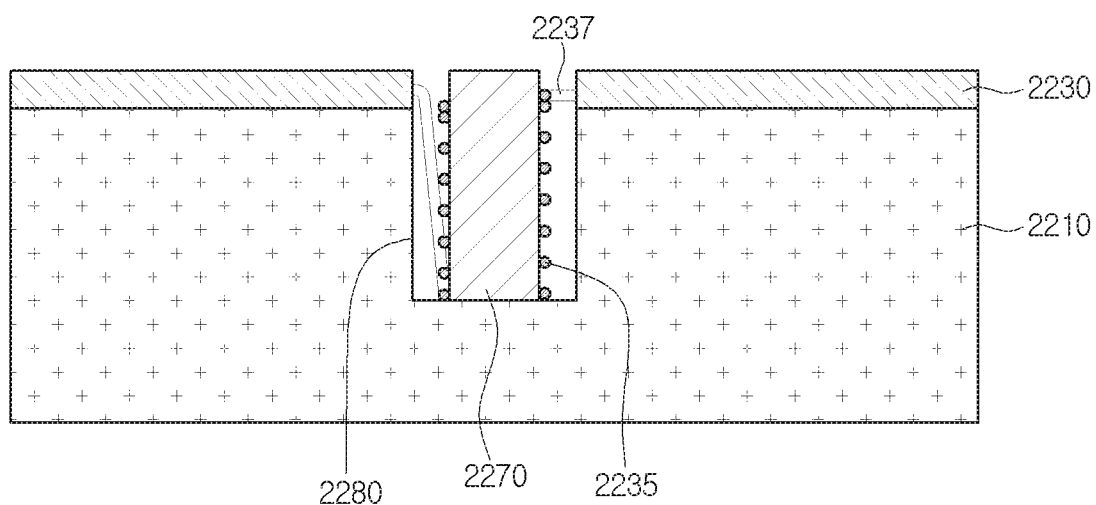

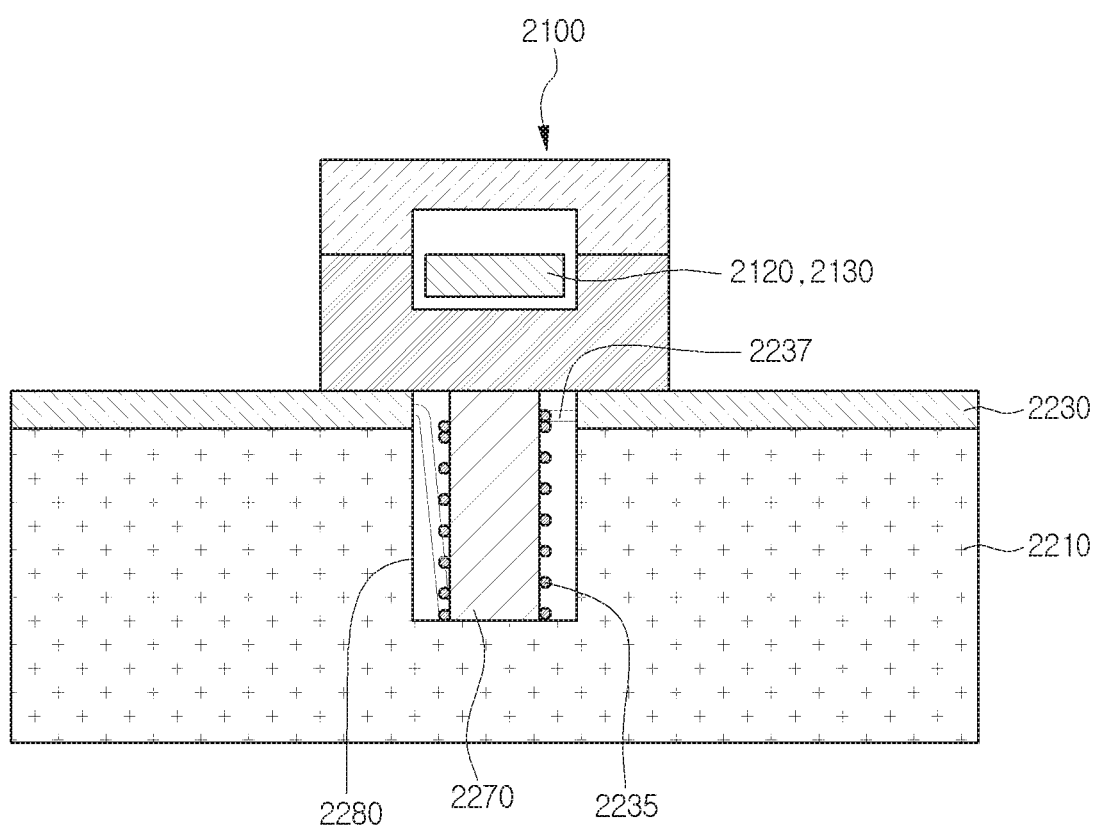
[Fig. 42]

[Fig. 43]
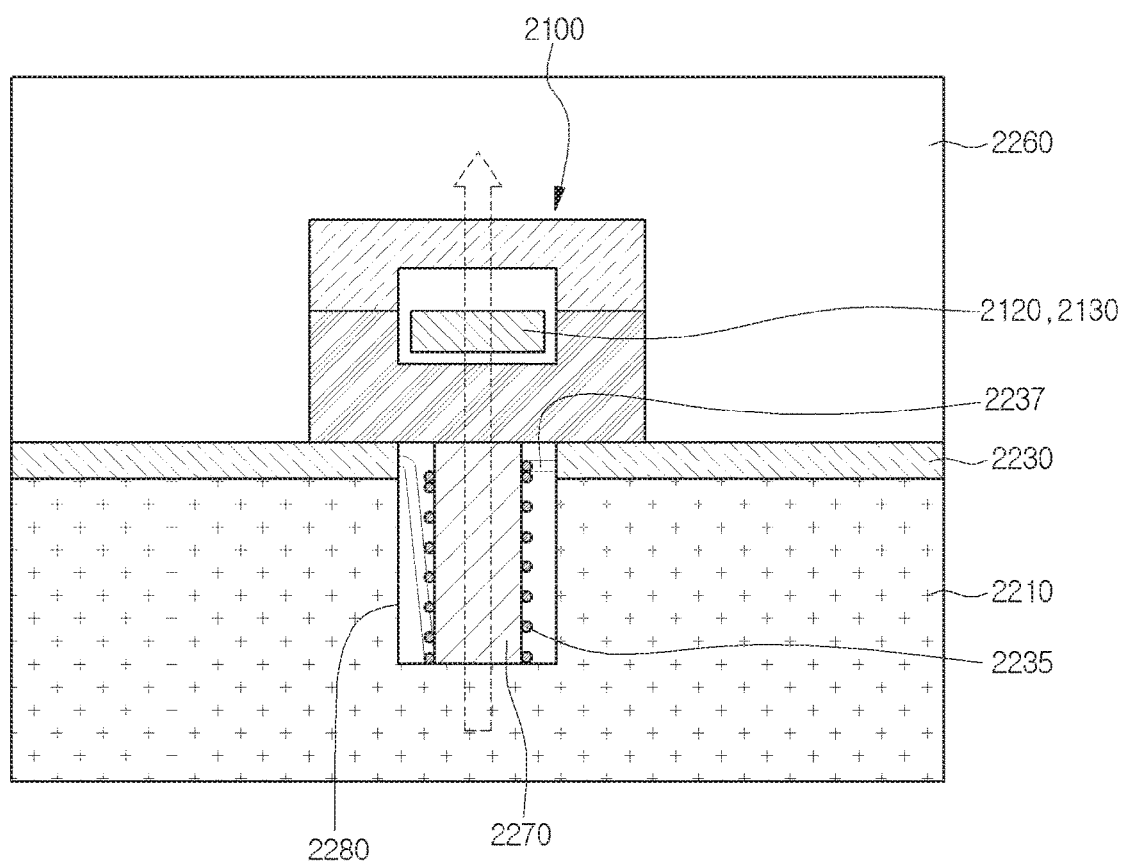

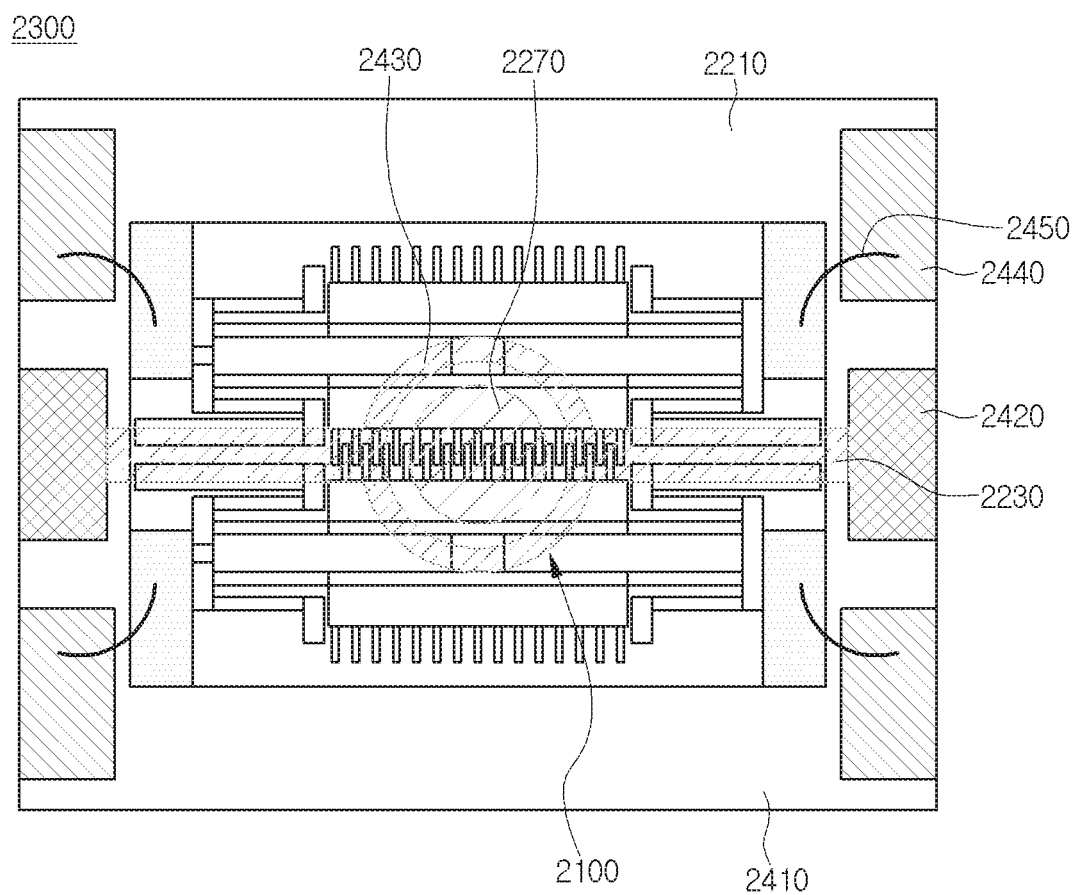
[Fig. 44]

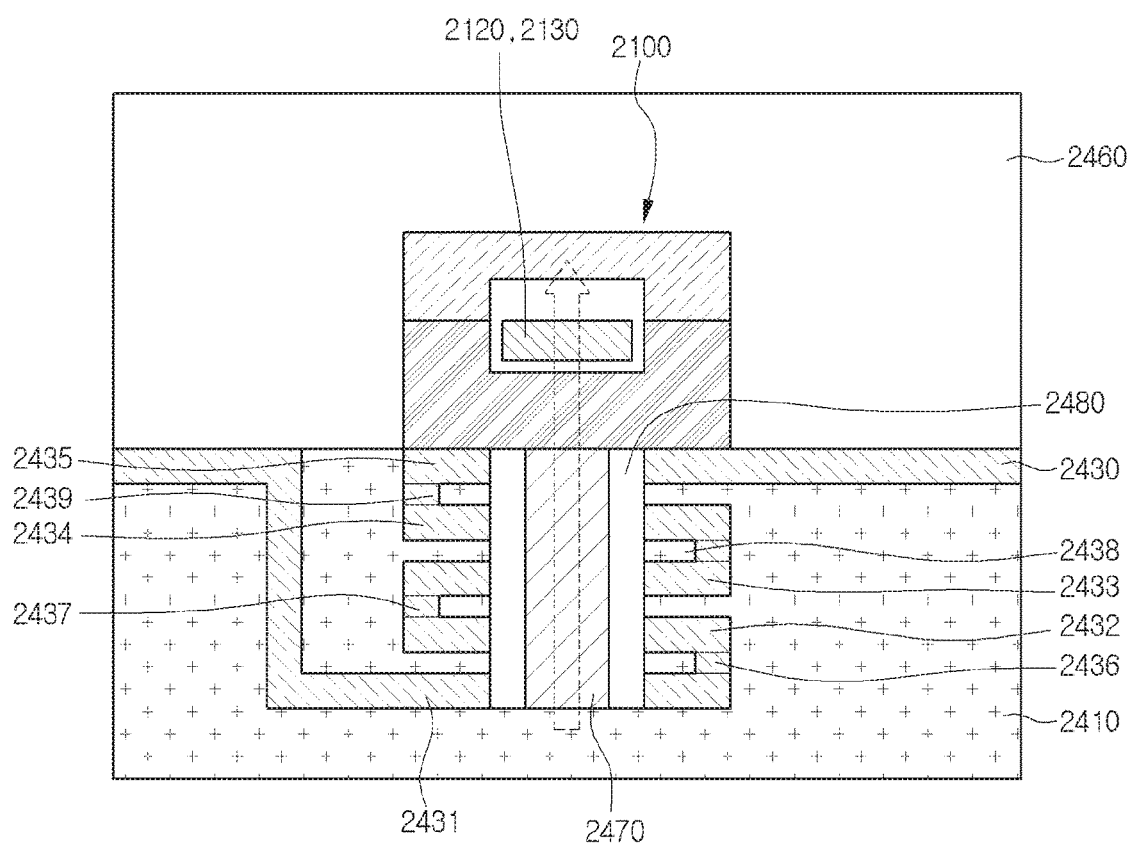
[Fig. 45]

[Fig. 46]
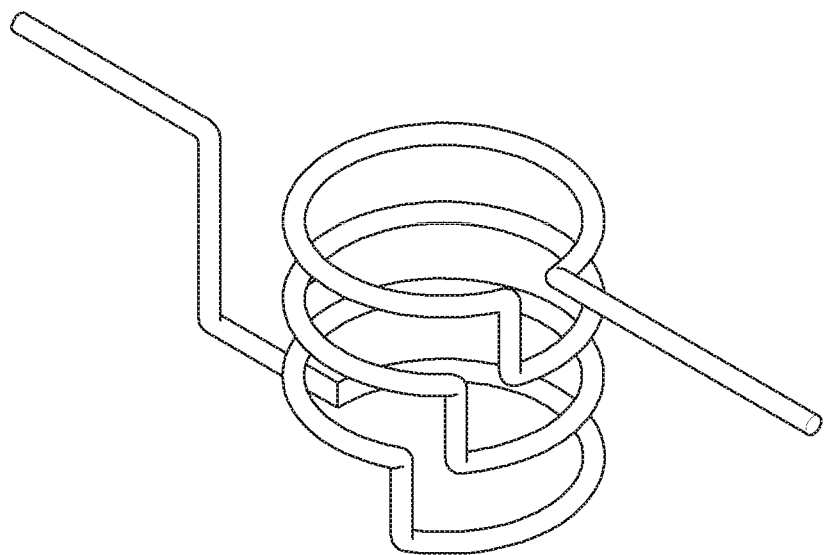

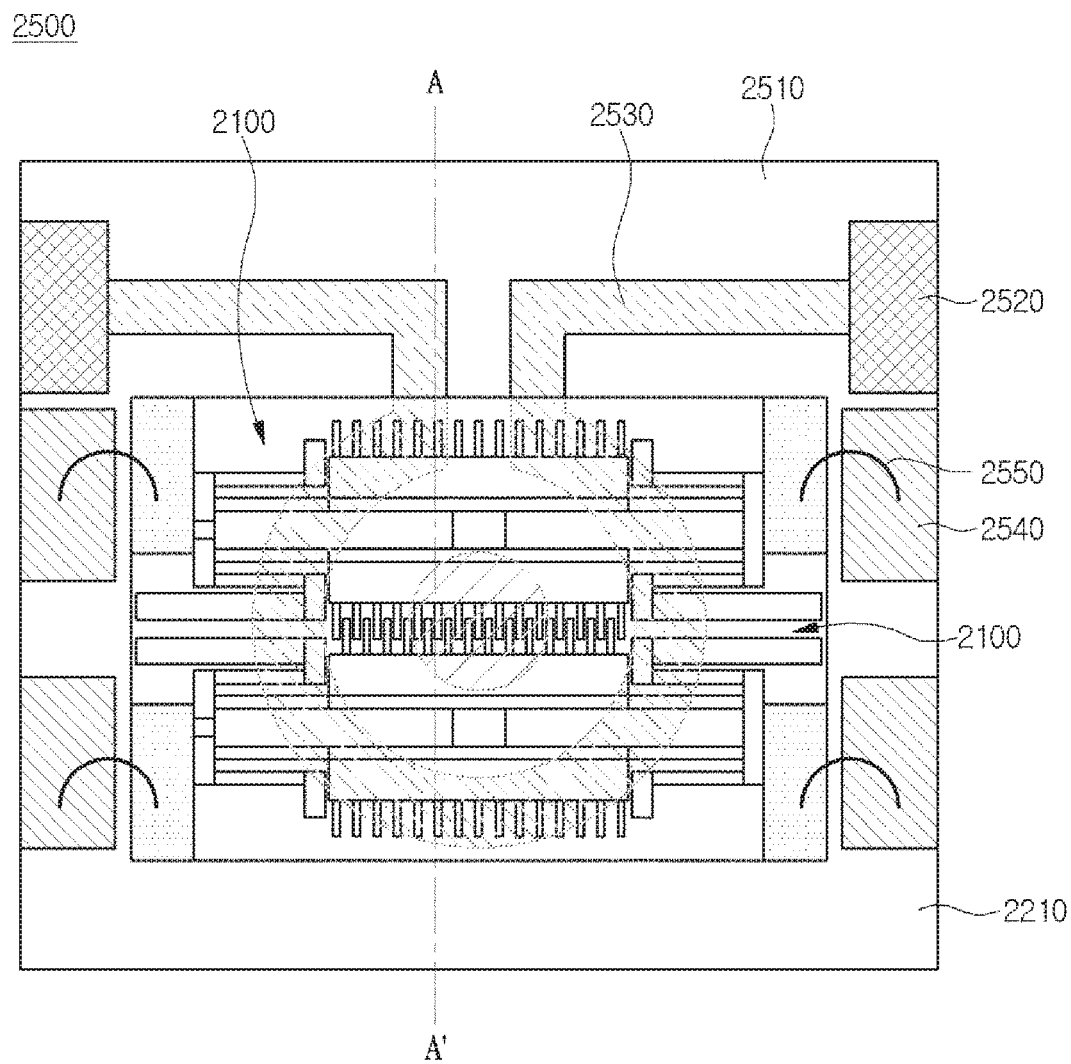
[Fig. 47]

[Fig. 48]
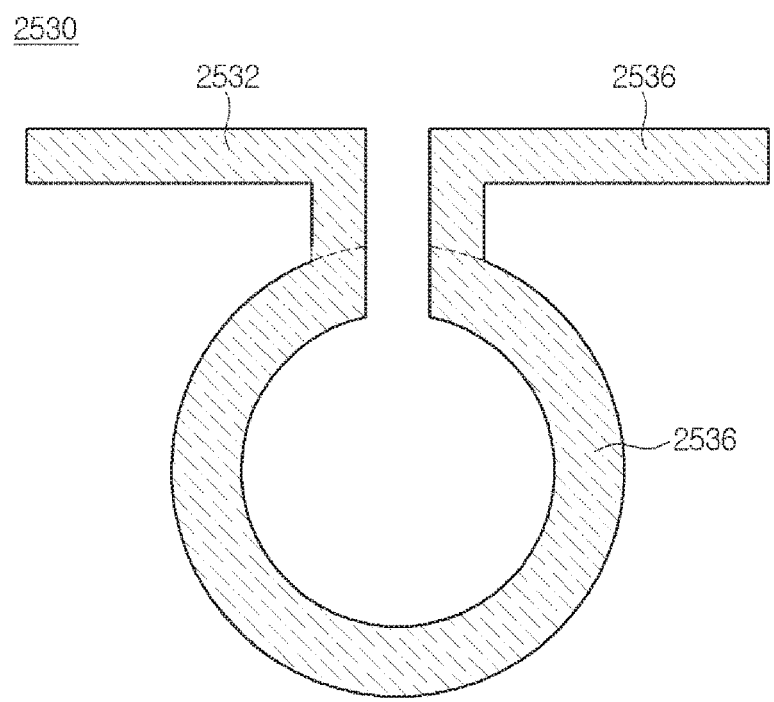

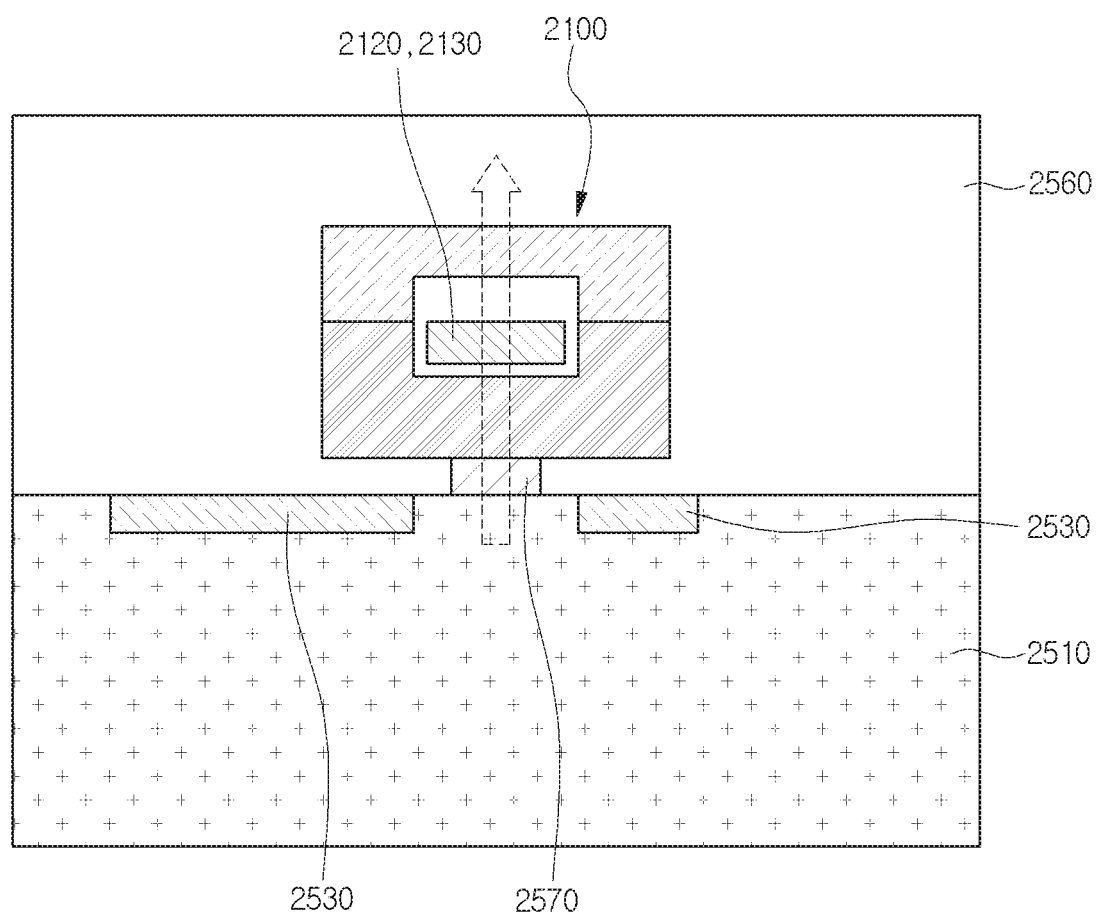
[Fig. 49]

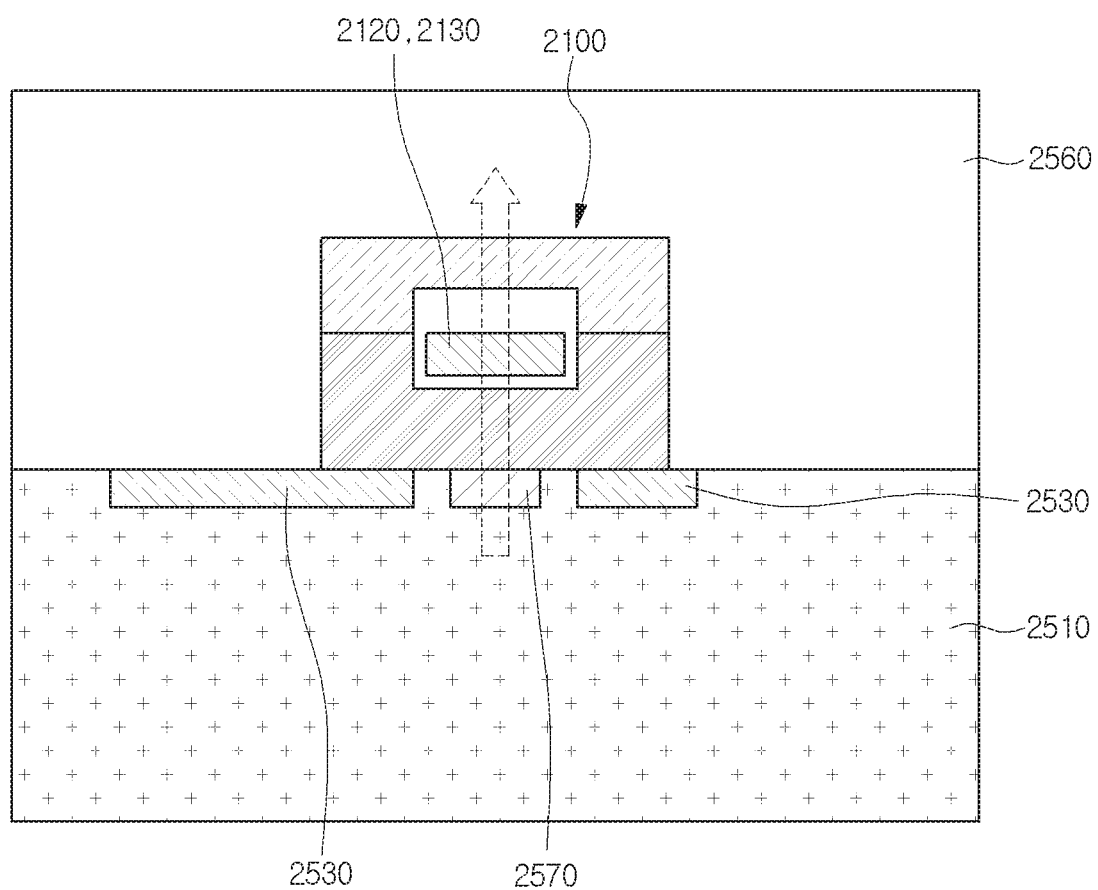
[Fig. 50]

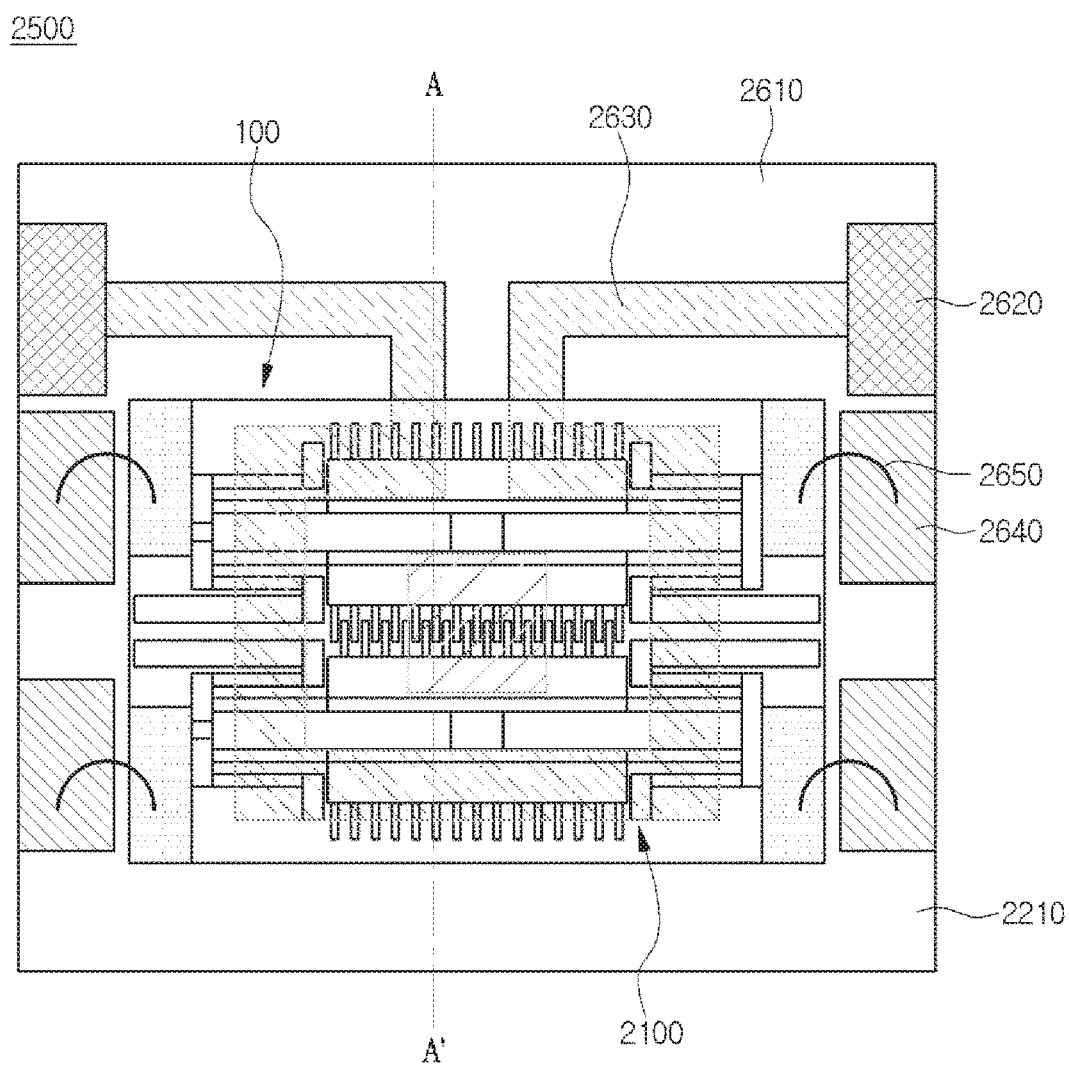
[Fig. 51]

MAGNETIC FIELD SENSOR PACKAGE

CROSS-REFERENCE TO RELATED APPLICATIONS

This application is the U.S. national stage application of International Patent Application No. PCT/KR2014/007746, filed Aug. 21, 2014, which claims priority to Korean Application Nos. 10-2013-0099296, filed Aug. 21, 2013, 10-2014-0010735, filed Jan. 28, 2014, and 10-2014-0010736, filed Jan. 28, 2014, the disclosures of each of which are incorporated herein by reference in their entirety.

TECHNICAL FIELD

The embodiment relates to a magnetic field sensor package, and more particularly to a MEMS magnetic field sensor package.

BACKGROUND ART

In general, a magnetic field sensor based on a MEMS (micro electro mechanical systems) capacitive sensing technology includes a driving electrode movable in reaction to a magnetic field and a fixing electrode to sense capacitance variation corresponding to the movement of the driving electrode.

According to the principle on the magnetic field sensor, when reference current is applied to the driving electrode in a predetermined direction, the driving is moved from the fixing electrode in a positive or negative direction due to the Lorentz force based on the direction and the intensity of an external magnetic field.

In this case, the variation in the distance between two electrodes or the overlap area between the two electrodes is made to vary the capacitance. The variation of the capacitance or the signal varied corresponding to the variation of the capacitance is detected to sense the magnetic field.

However, since the Lorentz force used to sense the magnetic field is relatively significantly small as compared to gravity, the design for a sensor assembly including a spring is limited, so that it is difficult to obtain sufficient mechanical displacement.

In addition, as the distance between a conductor through which current to be measured flows and the sensor is increased, the sensitivity of the magnetic field is decreased, so that the signal may not be exactly detected.

Meanwhile, recently, the conductor and the magnetic field sensor are formed in one package. As the conductor and the magnetic field sensor are arranged together in one receiving space, the intensity of the magnetic field is increased.

In the case of the magnetic field sensor, since the displacement difference of the driving electrode is made according to the direction of the magnetic field coming into the sensor assembly, the arrangement of the sensor assembly and the conductor must be appropriately performed.

FIG. 1 is a view showing the arrangement of a conductor through which current to be measured flows, and a sensor assembly in a sensor package according to the related art.

Referring to FIG. 1, the sensor package according to the related art includes a magnetic field sensor 10 including a sensor assembly 20, and a conductive line 30 provided on the magnetic field sensor 10 so that the current to be measured flows.

The conductive line 30 is vertically parallel to the sensor assembly 20 at a predetermined distance from the sensor assembly 20.

However, according to the sensor package described above, since the conductive line 30 is vertically parallel to the sensor assembly 20, the magnetic field comes into the sensor assembly 20 in a horizontal direction or an inclination direction.

Accordingly, since the magnetic field has the horizontal direction or the inclination direction, Lorentz force is vertically applied to the sensor assembly 20, so that the displacement of the sensor assembly may be reduced or abnormally driven.

If the displacement of the sensor assembly is reduced or abnormally driven as described above, the output single of the magnetic field sensor is reduced even under the current intensity, and the output value of the magnetic field sensor may be unstable.

DISCLOSURE

Technical Problem

The embodiment of the disclosure provides a sensor package having a novel structure and a method of fabricating the same.

In addition, the embodiment of the disclosure provides a sensor package, capable of generating a magnetic field from a conductive line, through which current to be measured flows, perpendicularly to a sensor assembly, and a method of fabricating the same.

In addition, the embodiment of the disclosure provides a sensor package capable of applying a magnetic field generated from a conductive line to a sensor assembly by increasing the intensity of the magnetic field.

Meanwhile, the objects accomplished by the embodiments may not be limited to the above objects, and those skilled in the art may clearly understand other objects from following description.

Technical Solution

According to the embodiment, a magnetic field package includes a package body having a space therein, a conductive line provided in the space of the package body to allow current to be measured to flow, and a magnetic field sensor provided in the package body, including a sensor assembly displaced by a magnetic field, and sensing the magnetic field generated by the current to be measured.

According to the embodiment, a magnetic field sensor package includes a package body, a magnetic field sensor provided on the package body and including a sensor assembly in which a displacement is generated by a magnetic field, and a conductive line formed on the package body, which is for making current to be measured flow and generating a magnetic field for displacing the sensor assembly, wherein the conductive line generates a magnetic field applied in a perpendicular direction to the sensor assembly.

Advantageous Effects

According to the magnetic field sensor package according to the embodiment, since the distance between the conductive line serving as a current source and the magnetic field sensor is constantly maintained in the wafer level step, the distance between the conductive line and the magnetic field sensor is not changed depending on conditions, so that sensing can be exactly performed. In addition, the conductive line is inserted into the package or the chip, so that the distance between the magnetic field sensor and the conductive line can be minimized.

Therefore, according to the magnetic field sensor package according to the embodiment, the sensibility and the resolution of the sensor can be improved, so that robust can be improved against an unnecessary external magnetic field.

According to the embodiment of the disclosure, as the arrangement of the conductive line through which the current to be measured flows and the arrangement of the sensor assembly are optimized, the magnetic field is generated perpendicularly to the sensor assemblies, thereby minimizing the loss in the intensity of the magnetic field required to generate the Lorentz force.

According to the embodiment of the disclosure, an electromagnet is provided between a conductive line through which the current to be measured flows and the sensor assembly to increase the intensity of the magnetic field under the same current, so that the output signal of the magnetic field sensor can be maximized.

In addition, according to the embodiment of the disclosure, the direction of the magnetic field is formed perpendicularly to a reference current conductive line of the driving electrode, thereby obtaining a stable output value while reducing a probability that the driving electrode receives the Lorentz force in a different direction instead of the horizontal direction to abnormally drive.

In addition, according to the embodiment of the disclosure, the Lorentz force is concentrated in the horizontal direction, so that the displacement of the driving electrode can be maximized. Accordingly, the output value can be maximized for the same current and an equal intensity of the magnetic field, so that the resolution can be improved.

DESCRIPTION OF DRAWINGS

FIG. 1 is a view showing the arrangement of a conductor through which current to be measured flows, and a sensor assembly in a sensor package according to the related art.

FIG. 2 is a schematic view showing a magnetic field sensor package according to a first embodiment of the disclosure.

FIG. 3 is a detailed sectional view showing the magnetic field sensor package according to the first embodiment of the disclosure.

FIG. 4 is a top view showing the magnetic field sensor in the magnetic field sensor package of FIG. 3.

FIG. 5 is a sectional view taken along line of the magnetic field sensor shown in FIG. 4.

FIGS. 6 to 13 are sectional views to explain a method of fabricating the magnetic field sensor package of FIG. 3.

FIG. 14 is a schematic view showing a first modification of the magnetic field sensor package according to the first embodiment of the disclosure.

FIG. 15 is a schematic view showing a second modification of the magnetic field sensor package according to the first embodiment of the disclosure.

FIG. 16 is a schematic view showing a third modification of the magnetic field sensor package according to the first embodiment of the disclosure.

FIG. 17 is an enlarged view showing a magnetic field sensor chip in the magnetic field sensor package of FIG. 16.

FIG. 18 is a top view showing the magnetic field sensor package according to a second embodiment of the disclosure.

FIG. 19 is a first sectional view taken along line A-A of a MEMS magnetic field sensor package of FIG. 18.

FIG. 20 is a second sectional view taken along line A-A of the MEMS magnetic field sensor package of FIG. 18.

FIG. 21 is a top view showing the magnetic field sensor shown in the magnetic field sensor package of FIG. 18.

FIGS. 22 to 25 are views to explain a method of fabricating the magnetic field sensor package shown in FIGS. 18 and 19 in process sequence.

FIG. 26 is a top view showing a MEMS magnetic field sensor package according to a third embodiment of the disclosure.

FIG. 27 is an enlarged top view showing a conductor and a sensor assembly shown in FIG. 20.

FIG. 28 is a second sectional view taken along line A-A' of the magnetic field sensor package of FIG. 26.

FIG. 29 is a top view showing a MEMS magnetic field sensor package according to a fourth embodiment of the disclosure.

FIG. 30 is a sectional view taken along line A-A' of the MEMS magnetic field sensor package of FIG. 29.

FIG. 31 is a sectional view showing the modification of the MEMS magnetic field sensor package of FIG. 29.

FIG. 32 is a top view showing a MEMS magnetic field sensor package according to a fifth embodiment of the disclosure.

FIG. 33 is a top view showing a MEMS magnetic field sensor package according to a sixth embodiment of the disclosure.

FIG. 34 is a top view showing a MEMS magnetic field sensor package according to a seventh embodiment of the disclosure.

FIG. 35 is a top view showing a MEMS magnetic field sensor package according to an eighth embodiment of the disclosure.

FIG. 36 is a sectional view taken along line A-A' of the MEMS magnetic field sensor package of FIGS. 34 and 35.

FIG. 37 is a top view showing a magnetic field sensor in the magnetic field sensor package of FIG. 34.

FIGS. 38 to 43 are flowcharts to explain a method of fabricating a MEMS magnetic field sensor package shown in FIGS. 34 and 36.

FIG. 44 is a top view showing a MEMS magnetic field sensor package according to a ninth embodiment of the disclosure.

FIG. 45 is a second sectional view taken along line A-A of the magnetic field sensor package of FIG. 44.

FIG. 46 is an enlarged view showing a conductive line shown in FIGS. 44 and 45.

FIG. 47 is a top view showing a MEMS magnetic field sensor package according to a tenth embodiment of the disclosure.

FIG. 48 is an enlarged view showing a conductive line shown in FIG. 47.

FIG. 49 is a sectional view taken along line A-A' of the magnetic field sensor package of FIG. 47.

FIG. 50 is a view showing a deformation of FIG. 49.

FIG. 51 is a top view showing a MEMS magnetic field sensor package according to an eleventh embodiment of the disclosure.

BEST MODE

Mode for Invention

Hereinafter, the embodiments of the disclosure will be described in detail with reference to accompanying drawings to the extent that those skilled in the art can easily reproduce the disclosure. However, the disclosure may be realized in various forms, but is not limited to the following embodiments.

In the following description, when a predetermined part "includes" a predetermined component, the predetermined part does not exclude other components, but may further include other components unless otherwise indicated.

The disclosure provides a MEMS magnetic field sensor package including a sensor having improved sensibility.

Hereinafter, a magnetic field sensor correction package according to the embodiment of the disclosure will be described with reference to FIGS. 2 to 5.

FIG. 2 is a schematic view showing a magnetic field sensor package according to the first embodiment of the disclosure. FIG. 3 is a detailed sectional view showing the magnetic field sensor package according to the first embodiment of the disclosure. FIG. 4 is a top view showing the magnetic field sensor in the magnetic field sensor package of FIG. 3. FIG. 5 is a sectional view taken along line of the magnetic field sensor shown in FIG. 4.

Referring to FIG. 2, a magnetic field sensor package 1000 according to the first embodiment of the disclosure includes a magnetic field sensor of a MEMS device, and includes a package body 600, a magnetic field sensor 100, a control device 900, an upper layer 700, and a lateral side part 800.

The package body 600, which serves as a support substrate, may be formed of an insulating material. Specifically, the package body 600 may include multi-layer ceramic (MLC), a glass substrate, a resin substrate, or a heavily-doped silicon substrate.

The package body 600 is provided thereon with a plurality of devices.

The package body 600 may be provided thereon with the magnetic field sensor 100 and the control device 900.

The magnetic field sensor 100 and the control device 900 may be arranged in line with each other as shown in FIG. 2, but the disclosure is not limited thereto. In other words, the magnetic field sensor 100 and the control device 900 may be variously arranged depending on designs.

The magnetic field sensor 100 includes a magnetic field sensor to sense the magnetic field, and may be connected with the adjacent control device 900 through a connection line 310 to transceive a signal.

The control device 900, which is an integrated circuit, supplies reference power to the magnetic field sensor 100, receives a sensing signal from the magnetic field sensor 100, and analyzes the sensing signal to create a magnetic field signal.

Although FIG. 2 shows that the magnetic field sensor 100 is connected with the control device 900 through one connection line 310, the disclosure is not limited thereto. In other words, the magnetic field sensor 100 may be connected with the control device 900 through a plurality of connection lines 310.

The lateral side part 800 is formed on the body 600 while surrounding the magnetic field sensor 100 and the control device 900.

The lateral side part 800 is interposed between the body 600, which is provided at a lower portion, and the upper layer 700 as shown in FIG. 2 to seal the inner part of the magnetic field sensor 100 and supports the upper layer 700.

In detail, when the magnetic field sensor 100 includes a plurality of silicon layers as shown in FIG. 3, the silicon layers may be provided on the body 600, and the lateral side part 800 may be formed on the silicon layers and the upper layer 700.

The lateral side part 800 may serve as a bonding layer, and may be used after being coated with a film such as dry film resist (DFR) and patterned.

The upper layer 700 is provided on the lateral side part 800 as shown in FIGS. 2 and 3 to cover the magnetic field sensor 100 and the control device 900 in the magnetic field sensor package.

The upper layer 700 may be formed of an insulating material. Specifically, the upper layer 700 may include multi-layer ceramic (MLC), a glass substrate, a resin substrate, or a heavily-doped silicon substrate.

As described above, the upper layer 700 is formed to form the magnetic field sensor package 1000 in which the magnetic field sensor 100 and the control device 900 are mounted in one package.

The upper layer 700 has a conductive line serving as a source that supplies current to the magnetic field sensor to form a target magnetic field.

The conductive line includes a pad 720 exposed through an outer surface of the upper layer 700, a conductive line part 730 extending along an inner surface of the upper layer 700 and formed corresponding to the upper portion of the magnetic field sensor 100, and a via passing through the upper layer 700 to connect the conductive line part 730 with the pad 720.

The upper layer 700 includes a plurality of via holes 710 to receive vias, and the via holes 710 may have inclination when viewed from the cross-sectional view as shown in FIG. 3.

Two pads 720 may be funned on the outer surface of the upper layer, and current flows through both ends to form a magnetic field.

The conductive line part 730 is provided corresponding to the magnetic field sensor 100 and bonded to the inner surface of the upper layer 700. Accordingly, the conductive line part 730 may be formed while maintaining a uniform distance from the magnetic field sensor 100.

In this case, the intensity of the magnetic field reaching the magnetic field sensor 100 is expressed as the following equation.

$$B = \frac{\mu_0 I}{2\pi R} \qquad \text{[Equation 1]}$$

In this case, B, I, μ0, and R refer to intensity of a magnetic field, current flowing through the conductive line part 730, relative permeability, and a distance between the conductive line part 730 and the magnetic field sensor, respectively.

Accordingly, as the distance is reduced, the intensity of the magnetic field sensed by the magnetic field sensor 100 is increased.

According to the disclosure, the distance between the sensor chip 100 and the conductive line part 730 may satisfy the range of 5 μm to 20 μm, and preferably the range of 10 μm to 15 μm.

The conductive line part 730 is provided while maintaining a predetermined distance from the magnetic field sensor 100 as described above, there preventing the sensitivity of the magnetic field from being varied depending on positions of the source that supplies a target magnetic field.

In addition, when comparing with the case that the magnetic field source is provided outside the magnetic field sensor package 1000, the conductive line part is provided inside the magnetic field sensor package 1000 while maintaining the uniform distance from the magnetic field sensor 100 to generate a sensing signal by the magnetic field having a stronger intensity, so that the sensing power can be improved.

The magnetic field sensor 100 may have the structures shown in FIGS. 3 to 5.

The magnetic field sensor 100 serves as a MEMS device, and includes a fixed substrate 110, a driving electrode part 120, and a plurality of elastic parts 300, 310, 320, and 330.

The MEMS (MICRO ELECTRO MECHANICAL SYSTEMS) refers to a technology of manufacturing a micro mechanical structure such as a high-density integrated circuit, a micro gear or a hard disk by machining silicon, crystal, or glass. The micro machine manufactured through the MEMS has the accuracy of a micrometer (millionth of a meter) or less. In structure, a semiconductor micro-processing technology is applied in which deposition and etching processes are repeated. In addition, a principle of significantly lowering power consumption by generating current using electrostatic force, which is pulling force between charges, and surface tension as driving force is applied.

The fixed substrate 110 of the MEMS magnetic field sensor 100 including the MEMS device supports the driving electrode part 120 and the elastic parts 300, 310, 320, and 330.

The fixed substrate 110 may have a plate shape, that is, a rectangular frame shape. The fixed substrate 110 may have a rectangular shape extending lengthwise, and may have an area of 3 mm×1 mm.

The fixed substrate constitutes a base part of the lateral side part 800 of the package as shown in FIG. 3.

The fixed structure 110 may have a multiply-layered structure, and may include a support substrate 400, an insulating layer 200 on the support substrate 400, and electrode layers 115a and 115b on the insulating layer 200 as shown in FIG. 3.

The support substrate 400 may include a silicon substrate, a glass substrate, or a polymer substrate, and the silicon substrate will be representatively described below in the first embodiment.

The support substrate 400 may have the thickness in the range of 100 µm to 500 µm, and preferably have the thickness of 400 µm.

An insulating layer 200 is formed on the support substrate 400.

The insulating layer 200 may be formed of a silicon oxide film or a silicon nitride film, and may have the thickness in the range of 1 µm to 1.5 µm when the support substrate 400 is a silicon substrate.

An electrode layer 115 is formed on the insulating layer 200.

The fixed substrate 110 includes a plurality of electrodes 111 to 119 provided along the sides of a rectangle by patterning the electrode layer on the support substrate 400 having a cavity to receive the driving electrode part 120 at the center thereof, and separated from each other.

The electrodes 111 to 119 may be formed of a conductive material, such as silicon (Si), copper (Cu), aluminum (Al), molybdenum (Mo), or tungsten (W). Preferably, when the support substrate 400 is a silicon substrate, the electrodes 111 to 119 may be formed of silicon. The electrodes 111 to 119 may have the thickness in the range of 10 µm to 100 µm, and preferably, may have the thickness of about 50 µm.

The electrodes 111 to 119 include four sensing electrodes 113, 114, 118, and 119 provided at four corner regions and power electrodes 111, 112, 116, and 117 adjacent to the sensing electrodes 113, 114, 118, and 119 while protruding the cavity 215.

In more detail, the first and second sensing electrodes 113 and 114 are formed at corner regions arranged in line with each other along an y axis. The first power electrode 111 is formed with a width narrower than that of the first sensing electrode 113 while being adjacent to the first sensing electrode 113 in an x axis. The second power electrode 112 is formed in line with the first power electrode 111, and has a width narrower than that of the second sensing electrode 114 in the x axis while being adjacent to the second sensing electrode 114.

Although the first and second sensing electrodes 113 and 114 are provided at the corner regions according to the embodiment, the first and second sensing electrodes 113 and 114 extend to the corner regions. In addition, when the first and second power electrodes 111 and 112 are formed adjacent to the first and second sensing electrodes 113 and 114, the first and second sensing electrodes 113 and 114 may have the widths that are not wider than those of the first and second power electrodes 111 and 112.

The first power electrode 111 is spaced apart from the second power electrode 112 by a predetermined distance. When the predetermined distance goes beyond a predetermined range, a dummy electrode 115a may be further formed between the first and second power electrodes 111 and 112 as shown in FIG. 3.

When the dummy electrode 115a is formed, the dummy electrode 115a is formed with a width narrower than those of the first and second power electrodes 111 and 112 in the x axial direction.

Meanwhile, a third sensing electrode 118 arranged in line with the first sensing electrode 113 in the x axis and a fourth electrode 119 provided at the corner region in line with the third sensing electrode 118 in the y axis are further provided.

In addition, the third power electrode 116 is formed adjacent to the third sensing electrode 118 and has a width narrower than that of the third sensing electrode 118, and the fourth power electrode 117 is formed in line with the third power electrode 116 while being adjacent to the fourth sensing electrode 119 and has a width narrower than that of the fourth sensing electrode 119.

The third power electrode 116 is spaced apart from the fourth power electrode 117 by a predetermined distance. When the predetermined distance goes beyond a predetermined range, the dummy electrode 115b may be further formed between the third and fourth power electrodes 116 and 117 as shown in FIG. 4.

When the dummy electrode 115b is formed, the dummy electrode 115 may have width narrower than those of the third and fourth power electrodes 116 and 117.

When the dummy electrodes 115a and 115b are formed as described above, the support substrate 400 under the dummy electrodes 115a and 115b may be formed to protrude toward the cavity 215, and may be equal to or smaller than the dummy electrodes 115a and 115b in size as shown in FIG. 3A.

In other words, the widths of the dummy electrodes 115a and 115b are controlled to expose the support substrate 400 through the lateral side having the cavity 215, thereby preventing the dummy electrode 115a and 115b from being electrically shorted with respect to the reference electrodes 121 and 131.

Small cavities are formed due to the difference in width between of the sensing electrodes 113, 114, 118, and 119 and power electrodes 111, 112, 116, and 117 adjacent to the sensing electrodes 113, 114, 118, and 119, respectively, and elastic parts 300, 310, 320, and 330 are formed in the cavities, respectively.

In order to support adjacent elastic parts 300, 310, 320, and 330, protrusion parts, which protrude from the sensing electrodes 113, 114, 118, and 119 toward the cavity 215, are further formed to form small cavities together with the power electrodes 111, 112, 116, and 117.

The protrusion parts may be connected with adjacent protrusion parts through structures under the insulating layer 200. The four small cavities have shapes to open toward the cavity 215.

In addition, a metallic layer 500 may further formed on the sensing electrodes 113, 114, 118, and 119, and the power electrodes 111, 112, 116, and 117.

The metallic layer 500 is formed of high conductive material, such as Cu, Al, Mo, W, and Ag. When the electrode layer is formed of Si, the metallic layer 500 is formed of a material having electrical conductivity higher than that of Si.

A material having higher electrical conductivity is further formed in the above electrode region, so that the current spreading can be smoothly performed, thereby increasing a reaction speed.

The driving electrode parts 120 and 130 are provided in the cavity 215 of the fixed substrate 110.

The driving electrode parts 120 and 130 includes a first driving electrode 120 surrounded by the first and second sensing electrodes 113 and 114 and the first and second power electrodes 111 and 112 to receive power, and a second driving electrode 130 surrounded by the third and fourth sensing electrodes 118 and 119 and the third and fourth power electrodes 116 and 117 to receive power.

The first driving electrode 120 includes a first reference electrode 121 extending along the y axis in the cavity 215, a first variable electrode 126, and at least one first connection part 229 to connect the first reference electrode 121 with the first variable electrode 126.

The first reference electrode 121 and the first variable electrode 126 include electrode layers extending from the two elastic parts 300 and 310.

The first reference electrode 121 includes a bar type of a body 600 extending between the first and second elastic parts 300 and 310, and has a width wider than those of the first and second elastic parts 300 and 310.

The body 600 expands while protruding in the x axial direction, which means the expansion to the space formed by the step difference formed in the x axis direction between the first and second power electrodes 111 and 112 and the dummy electrode 115a.

The length of the first reference electrode 121 may be in the range of 500 to 5000 μm, and preferably, in the range of 1500 to 2500 μm.

The first reference electrode 121 includes a plurality of first reference electrode protrusions 122 protruding toward the dummy electrode 115a.

The first reference electrode protrusions 122 may have a comb shape, and the width of the first reference electrode protrude 212 having a predetermined length may satisfy the range of 1 to 30 μm, and preferably, the range of 3 to 4 μm.

The number of the first reference electrode protrusions 122 is determined depending on the length of the first reference electrode 121, the width of the first reference electrode protrusion 122, and the distance between the first reference electrode protrusions 122.

Meanwhile, the first variable electrode 126 has the same shape as that of the first reference electrode 121, and the first variable electrode 126 and the first reference electrode 121 are symmetrical to each other about the first connection part 220. Accordingly, the first driving electrode 120 may maintain the center of gravity in the x axial direction.

In other words, the first variable electrode 126 has a bar type of the body 600 to connect the first and second elastic parts 300 and 310 with each other, and is formed to have the width greater than legs of the first and second elastic parts 300 and 310.

The width expands while protruding in the x axial direction, which means the expansion the step difference of the cavity 215 by the protrusions of the first and second sensing electrodes 113 and 114.

The length of the first variable electrode 126 may be in the range of 500 to 5000 μm, and preferably in the range of 1500 to 2500 μm.

The first variable electrode 126 includes a plurality of first variable electrode protrusions 127 protruding toward the second variable electrode 136.

The first variable electrode protrusion 127 may have a comb shape, and the width of the first variable electrode protrusion 127 may satisfy the range of 1 to 30 μm, and preferably, the range of 3 to 4 μm.

The number of the first variable electrode protrusions 127 is determined depending on the length of the first reference electrode 121, the width of the first variable electrode protrusions 127, and the distance between the first variable electrode protrusions 127.

Meanwhile, the first connection part 220 has a region exposed between the body 600 of the first reference electrode 121 and the body 600 of the first variable electrode 126, and extends over portions or entire portions of the body 600 of the first reference electrode 121 and the body 600 of the first variable electrode.

At least one first connection part 220 may be provided as shown in FIG. 4. Alternatively, a plurality of first connection parts 220 may be provided at a predetermined interval.

The first connection part 220 is used to electrically insulate the first reference electrode 121 from the first variable electrode 126 while mechanically connect the first reference electrode 121 from the first variable electrode 126, and includes only the support substrate 400 and the insulating layer 200 under the electrode layer 150.

In this case, the support substrate 400 of the first connection part 220 is partially etched to have a thickness thinner than that of the support substrate 400 under the fixed substrate 110, so that the first connection part 220 is lifted from the lowest point of the fixed substrate 400.

The first connection part 220 may have an area of 100-300 μm, and is arranged in such a manner that the longer side of the first connection part 220 traverses the body 600 of the reference elect ode 121 and the body 600 of the first variable electrode 126.

Meanwhile, the second driving electrode 130 includes a second reference electrode 131 extending in the y axis in the cavity 215, a second variable electrode 136, and at least one second connection part 230 to connect the second reference electrode 131 with the second variable electrode 136.

The second reference electrode 131 and the second variable electrode 136 include electrode layers extending from the elastic parts 320 and 330.

The second reference electrode 131 and the first reference electrode 121 have the same shape, and are symmetrical to each other.

The second reference electrode 131 includes a bar type of a body 600 to connect the first and second elastic parts 300 and 310 with each other, and includes a plurality of second reference electrode protrusion 132 protruding from the longer side of the body 600 to the dummy electrode 150b.

The second variable electrode 136 and the second reference electrode 131 have the same shape and are symmetrical to each other about the second connection part 230. Accordingly, the second driving electrode 130 maintains the center of gravity in the x axial direction.

In other words, the second variable electrode 136 includes a bar type of the body 600 to connect the third and fourth elastic parts 320 and 330 with each other, and includes a plurality of second variable electrode protrusion 137 protruding toward the first variable electrode 126.

The first variable electrode protrusion 127 and the second variable electrode protrusion 137 are arranged to cross each other.

In this case, the electrode protrusions 127 and 137 of the first and second variable electrodes 126 and 136 are arranged to face each other about the central al region of the magnetic field sensor to form a variable capacitor.

The variable capacitor has capacitance varied depending on the area of the region where the first variable electrode protrusion 127 of the first variable electrode 126 crosses the second variable electrode protrusion 137 of the second variable electrode 136. Although the variable capacitor is realized by a comb drive which is a driver having a comb shape according to the present embodiment, the disclosure is not limited thereto. In other words, the variable capacitor may be realized using various structures including the structure based on the distance difference between facing members.

The first variable electrode protrusion 127 and the second variable electrode protrusion 137 have an overlap distance of about 30 μm in the state that voltage is not applied to or Lorentz force is not generated from the first to fourth power electrodes 111, 116, and 117.

The distance between one first variable electrode protrusion 127 and the second variable electrode protrusion 137 adjacent to the first variable electrode protrusion 127 may be in the range of 1 to 10 μm, preferably, the range of 2 to 3 μm.

Meanwhile, the second connection part 230 is formed identically to the first connection part 220, has a region exposed to the body 600 of the second reference electrode 131 and the second variable electrode 136, and is formed throughout apart or the entire part of the second reference electrode 131 and the second variable electrode 136.

The second connection part 230 is used to electrically insulate the second reference electrode 131 from the second variable electrode 136 while mechanically connect the second reference electrode 131 with the second variable electrode 136, and includes only the support substrate 400 and the insulating layer 200 under the electrode layer 150.

In this case, the support substrate 400 of the second connection part 230 is partially etched to have a thickness thinner than that of the support substrate 400 under the fixed substrate 110, so that the second connection part 230 is lifted from the lowest point of the fixed substrate 400.

Metallic patterns 521, 526, 531, and 536 may be formed at parts of the body 600 of the first reference electrode 121, the first variable electrode 126, the second reference elect ode 131, and the second variable electrode 136 while extending from the metallic layer 500 of the fixed substrate 110. Accordingly, the current spreading efficiency of each variable electrode and each reference electrode are enhanced to improve the conductivity, so that the reaction speed is increased and the reliability of an output value is improved.

Meanwhile, the magnetic field sensor 100 includes the first elastic part 300 and the second elastic part 310 to connect the fixed substrate 110 and the first driving electrode 120 with each other, and the third and fourth elastic parts 320 and 330 to connect the fixed substrate 110 with the second driving electrode 130.

The first to fourth elastic parts 300, 310, 320, and 330 may be formed by double folded-type springs.

The first to fourth elastic parts 300, 310, 320, and 330 are arranged in small cavities in which the power electrodes 111, 112, 116, and 117, and the sensing electrodes 113, 114, 118, and 119 are formed.

The first elastic part 300 is provided in the small cavity where the first power electrode 111 and the first sensing electrode 113 are formed, and the second elastic part 310 is provided in the small cavity where the second power electrode 112 and the second sensing electrode 114 are formed. The third elastic part 320 is provided in the small cavity where the third power electrode 116 and the third sensing electrode 118 are formed, and the fourth elastic part 330 is provided in the small cavity where the fourth power electrode 117 and the fourth sensing electrode 119 are formed.

The first elastic part 300 includes two fixing parts.

Each fixing part includes two springs, connects the first sensing electrode 114 with the first variable electrode 126, and connects the first power electrode 111 with the first reference electrode 121.

The fixed substrate 110 is electrically and mechanically connected with the first driving electrode 120 by the first elastic part 300.

The fixing part of the second elastic part 310 connects the second sensing electrode 114 with the second variable electrode 136, and connects the second power electrode 112 with the first reference electrode 121.

The fixed substrate 110 and the first driving electrode 120 are electrically and mechanically connected with each other by the second elastic part 310.

The fixing part of the third elastic part 320 connects the third sensing electrode 118 with the second variable electrode 136, and connects the third power electrode 116 with the second reference electrode 131.

The fixed substrate 110 and the second driving electrode 130 are electrically and mechanically connected with each other by the third elastic part 320.

The fixing part of the fourth elastic part 330 connects the fourth sensing electrode 118 with the second variable electrode 136, and connects the fourth power electrode 117 with the second reference electrode 131.

The fixed substrate 110 and the second driving electrode 130 are electrically and mechanically connected with each other by the fourth elastic part 330.

The four elastic parts 300, 310, 320, and 330 formed in such a manner include equal numbers of springs, and face each other on both ends of the driving electrode parts 120 and 130 of the magnetic field sensor 100 to disperse tensile force.

In addition, the four elastic parts 300, 310, 320, and 330 are formed symmetrically to each to make balance through the The four elastic parts 300, 310, 320, and 330 include only the electrode layer 500 except for connection islands between the four elastic parts 300, 310, 320, and 330 to connect components with each other electrically as well as mechanically, and provides resilience force resulting from elastic force after driving.

In addition, the fourth elastic parts 300, 310, 320, and 330 have the same configuration, and the metallic layer 500 extending from the electrodes of the fixed substrate 110 is formed throughout the entire portion except for the connection island to enhance electrical conductivity.

In the MEMS magnetic field sensor 100, the stack structure of the support substrate 400, the insulating layer 200, the electrode layer 150, and the metallic layer 500 remain at the lateral side of the magnetic field sensor package 1000 to form the lateral side part 800 of the magnetic field sensor package 1000.

In this case, the space between the region for the fixed substrate 110 and the lateral side part 800 may be formed.

In other words, as shown in FIG. 3, a bonding layer may be further formed on the metallic layer 500 of the fixed substrate 110 even though the space is provided between the region for the fixed substrate 110 and the lateral side part 800.

Hereinafter, a method of fabricating the magnetic field sensor package 1000 of FIG. 2 will be described with reference to FIGS. 6 to 13.

First, the package body 600 is attached to the lower portion of the magnetic field sensor 100 as shown in FIG. 6. The package body 600 may be formed of an insulating material, similarly to that of a glass substrate. When the package body 600 is the glass substrate, an anodic bonding process is performed with respect to the space between the lower portion of the support substrate of the magnetic field sensor 100 and the package body 600 so that the magnetic field sensor 100 may be bonded to the package body 600.

Next, a base substrate is prepared to constitute the upper layer 700 as shown in FIG. 7.

The base substrate may be a non-conductive substrate, such as a glass substrate.

A via hole 710 is formed in the base substrate as shown in FIG. 8.

The vial hole 710 may be formed through sand blasting. Two via holes 710 may be formed corresponding to a region for the magnetic field sensor 100.

The top surface of the via hole 710 may have the size of several µm to several tens of µm, and the via hole 710 may have an inclination so that the via hole 710 is reduced downward.

Thereafter, a pad 720 is formed on a top surface of the base substrate as shown in FIGS. 9 and 10.

First, a plating layer 721 is formed on the entire top surface of the base substrate by performing a plating process to fill the via hole 710.

Next, as shown in FIG. 10, the plating layer 721 is etched to form the pad 720 on the upper portion of the via hole 710 through a photolithography process, and the plating layer 721 except for the pad 720 is removed.

Subsequently, as shown in FIG. 11, after forming a metallic layer on a bottom surface of the base substrate through a plating process or a sputtering process, the metallic layer is patterned to form the conductive line part 730 between vias to connect two vias with each other.

The upper metallic layer and the lower metallic layer may include conductive metal, for example, Al, Au, or Cu.

If the connection line part is completely formed on the bottom surface of the base substrate, the upper layer 700 is completed.

Next, as shown in FIG. 12, the bonding layer 350 is formed on the bottom surface of the upper layer 700.

The bonding layer 350 may be an adhesive film such as DFR. After coating the adhesive film on the entire surface of the upper layer 700, the resultant may be patterned using an etchant.

In this case, the distance between the magnetic field sensor 100 and the connection line part 730 may be adjusted depending on the type, the thickness, and the bonding method of the film.

The bonding layer 350 is formed at an edge region constituting the lateral side part 800, and the connection island may be further formed inward from the lateral side part 800 at a predetermined distance from the bonding layer 350

The connection island may be attached to the fixed substrate of the magnetic field sensor 100 as shown in FIG. 3.

Finally, as shown in FIG. 13, the lateral side part 800 and the upper layer 700 of the magnetic field sensor 100 are bonded to each other using the bonding layer 350.

In this case, for the bonding method, heat and pressure may be applied or an adhesive is used to perform the bonding.

The magnetic field sensor package 1000 is formed by forming the connection line part 730 therein, so that the distance between the supply source and the sensor may be minimized, thereby improving the sensing power.

Hereinafter, various embodiments will be described with reference to FIGS. 14 to 16.

As shown in FIG. 14, a magnetic field sensor package 1000A according to a first modification includes a magnetic field sensor 100 of a MEMS device, and includes a package body 600, a control device 900, an upper layer 700, and a molding part.

Since the magnetic field sensor 100 has the same structure as that described above, the details thereof will be omitted.

The package body 600 is provided thereon with a plurality of devices.

The package body 600 may be provided thereon with the magnetic field sensor 100 and the control device 900.

Regarding the magnetic field sensor 100 and the control device 900, the control device 900 may be provided on the magnetic field sensor 100, different from those shown in FIG. 2.

The control device 900, which is an integrated circuit, supplies reference power to the magnetic field sensor 100, receives a sensing signal from the magnetic field sensor 100, and analyzes the sensing signal to create a magnetic field signal.

When the control device 900 is provided on the magnetic field sensor 100 as shown in FIG. 14, the magnetic field sensor 100 may be provided in opposition to the magnetic field sensor 100 of FIG. 13.

In other words, the support substrate 400 may be provided toward the upper layer 700.

Accordingly, the control device 900 is attached onto the support substrate, so that the movement of the magnetic field sensor 100 may be performed without the affect by the control device 900.

Meanwhile, the lateral side part 800 to surround the magnetic field sensor 100 and the control device 900 may be formed on the package body 600.

In this case, the connection line part 730 may be formed between the lateral side part 800 and the package body 600, and on the package body 600.

The connection line part 730 includes a lateral side region 731 extending from a pad region 732 on the top surface of the lateral side part 800 to the bottom surface of the lateral side part 800 through a lateral side region 731 to surround the lateral side of the lateral side part 800. Subsequently, the connection line part 730 traverses the package body 600 while extending to the top surface of an opposite lateral side part 800.

As shown in FIG. 14, when the connection line part 730 is formed on the package body 600, the magnetic field sensor 100 floating on the package body 600 senses the magnetic field generated from the connection line part 730 to output the sensing signal to the control device 900.

In this case, the control device 900 may transceive an electrical signal through a first connection line 910 attached to the pad 733 of the package body 600 and a second connection line 920 connected with the magnetic field sensor 100.

As shown in FIG. 14, when the connection line part 730 traverses the package body 600, the connection line part 730 may be molded by a molding material.

Meanwhile, the magnetic field sensor 100 of FIG. 14 may be attached onto the connection line part 730 without the floating on the package body 600.

In this case, the support substrate 400 may be attached to the connection line part 730, and the upper layer may be further formed on the fixed substrate 110 of the magnetic field sensor to cover the magnetic field sensor to space the magnetic field sensor apart from the control device 900.

The above structure will be described in more detail with reference to FIG. 15.

As shown in FIG. 15, a magnetic field sensor package 1000B according to a second modification includes a magnetic field sensor 100 of a MEMS device, and includes a package body 600, a control device 900, and a molding material 950.

The package body 600 is provided thereon with a plurality of devices.

The package body 600 may be provided thereon with the magnetic field sensor 100 and the control device 900.

As shown in FIG. 15, the magnetic field sensor 100 and the control device 900 are arranged in such a manner that the control device 900 is adjacent to the magnetic field sensor 100.

Since the lateral side part 800 and the connection line part 730 have the same shapes as those of FIG. 14, the details thereof will be omitted.

As shown in FIG. 15, the magnetic field sensor 100 provided on the connection line part 730 includes a magnetic field sensor on the support substrate 400, and a plurality of bonding layers 500 are formed with a predetermined height on a fixed substrate region of the magnetic field sensor to support an upper layer 450.

Accordingly, the magnetic field sensor floats between the upper layer 700 and the support substrate 400, and horizontally moves due to the magnetic field generated from the connection line part 730 to sense the magnetic field.

As shown in FIGS. 16 and 17, a magnetic field sensor package 1000C according to a third modification includes a magnetic field sensor 100 of a MEMS device, and includes a package body 600, a control device 900, an upper layer 700, and a molding part 950.

The package body 600 is provided thereon with a plurality of devices.

The package body 600 may be provided thereon with the magnetic field sensor 100 and the control device 900.

As shown in FIG. 14, the magnetic field sensor 100 and the control device 900 are arranged in such a manner that the control device 900 is provided on the magnetic field sensor 100, but the disclosure is not limited thereto.

As shown in FIG. 16, a connection line part 460 is provided in the magnetic field sensor 100.

In more detail, referring to FIG. 17, the magnetic field sensor 100 includes a magnetic field sensor provided on the support substrate 400, and a plurality of bonding layers 500 are formed with a predetermined height on a fixed substrate region of the magnetic field sensor to support an upper layer 450.

In this case, the upper layer 450 is formed therein with a via hole, and the connection line part 480 is formed on a bottom surface of the upper layer 450 while extending from a pad 480 on a top surface of the upper layer 450 through a via 470 filled in the via hole.

Accordingly, the connection line part 460 may be provided in the magnetic field sensor 100, and may be maintained at a distance significantly close to the magnetic field sensor floating in the magnetic field sensor 100, so that micro-current of 1 A or less may be measured.

When the connection line part 460 is provided in the magnetic field sensor 100, the connection line part 460 may perform electrical connection through a first connection line 920 to connect the control device 900 and the magnetic field sensor adjacent to each other with each other, a second connection line 910 to connect the control device 900 with the outside, and a third connection line 930 to connect the connection line part 460 with the outside.

As described above, the magnetic field sensor 100 and the connection line part 460 to supply the magnetic field to the magnetic field sensor 100 are formed together in the magnetic field sensor package 1000C, so that the magnetic field sensor 100 is maintained at a predetermined distance from the connection line part 460 and the predetermined distance is minimized, thereby improving the sensing power.

FIG. 18 is a top view showing a MEMS magnetic field sensor package according to a second embodiment of the disclosure. FIG. 19 is a first sectional view taken along line A-N of THE MEMS magnetic field sensor package of FIG. 18. FIG. 20 is a second sectional view taken along line A-A' of the MEMS magnetic field sensor package of FIG. 18. FIG. 21 is a top view showing the magnetic field sensor shown in the magnetic field sensor package of FIG. 18.

Among them, FIG. 19 is a first sectional view taken along line A-A' of the MEMS magnetic field sensor package of FIG. 18. FIG. 20 is a second sectional view taken along line A-A' of the MEMS magnetic field sensor package of FIG. 18, different from the embodiment of FIG. 19.

Referring to FIGS. 18 to 20, a magnetic field sensor package 1300 according to the embodiment includes a magnetic field sensor 1100 of a MEMS device, a package body 1210, a conductive line pad 1220, a conductive line 1230, a control device 1240, a connection line 1250, and a protective layer 1260.

The package body 1210, which serves as a support substrate, may be formed of an insulating material. In detail, the package body 1210 may be formed of multi-layer ceramic (MIX), a glass substrate, a resin substrate, or a heavily-doped silicon substrate.

The package body 1210 is provided thereon with a plurality of devices. In other words, a plurality of devices are attached onto the package body 1210, and the plurality of devices are electrically connected with through the connection line 1250.

The devices may include a magnetic field sensor 1100 and a control device 1240.

The magnetic field sensor 1100 and the control device 1240 may be arranged in line with each other as shown in FIG. 18, but the disclosure is not limited thereto. In other words, the magnetic field sensor 1100 and the control device 1240 may be arranged variously depending on designs.

The magnetic field sensor 1100 includes sensor components to sense the magnetic field, and the sensor components include sensor assemblies 1120 and 1130 to be displaced depending on the intensities of the magnetic field. The magnetic field sensor 1100 is connected with the control device 1240 adjacent to the magnetic field sensor 1100 through a connection line 1250 to receive a signal mutually.

Preferably, the control device 1240 is provided adjacent to a plurality of sensing electrodes 1113, 1114, 1118, and 1119 constituting the magnetic field sensor 1100, and electrically connected with the sensing electrodes 1113, 1114, 1118, and 1119.

Alternatively, the control device 1240 may be provided adjacent to a plurality of power electrodes 1111, 1112, 1116, and 1117 constituting the magnetic field sensor 1100 and electrically connected with the power electrodes 1111, 1112, 1116, and 1117.

The control device 1240 is connected with the magnetic field sensor 1100 to supply reference power to the magnetic field sensor 1100, to receive the sensing signal transmitted thereto from the magnetic field sensor 1100, to analyze the sensing signal to generate a signal corresponding to the intensity of the magnetic field.

Although FIG. 18 shows that one control device 1240 is connected with the magnetic field sensor 1100 through one connection line 1250, the disclosure is not limited thereto. In other words, the one control device 1240 may be connected with the magnetic field sensor 1100 through a plurality of connection lines 1250.

The connection line 1250 may include a wire as shown in FIG. 18, but the disclosure is not limited thereto. In other words, the connection line 1250 may be realized using an electrode formed in the magnetic field sensor 1100 and a conductive line pad (not shown) to traverse the electrode of the control device 124.

The protective layer 1260 is formed on the package body 1210. Preferably, the protective layer 1260 is formed on the package body 1210 while surrounding the magnetic field sensor 1100 and the control device 1240.

The protective layer 1260 is formed on the package body 1210 as shown in FIG. 19 to seal an upper space of the package body 1210 as shown in FIG. 19.

A conductive line 1230 is formed in the package body 1210 to transfer current to be measured. Preferably, the conductive line 1230 generates a magnetic field to be sensed by the magnetic field sensor 1100.

A plurality of conductive line pads 1220 are formed in the package body 1210. In this case, one end of the conductive line 1230 is connected with one conductive line pad 1220, and an opposite end of the conductive line 1230 is connected with another conductive line pad 1220.

In this case, the conductive line 1230 according to the second embodiment of the disclosure extends in a substantially linear shape, so that one end of the conductive line 1230 is connected with the one conductive line pad 1220, and an opposite end of the conductive line 1230 is connected with another conductive line pad 1220.

In this case, the conductive line 1230 is spaced apart from the magnetic field sensor 1100 by a predetermined distance.

The current to be measured flows through the conductive line 1230. If the current to be measured flows through the conductive line 1230, a magnetic field is generated around the conductive line 1230.

Meanwhile, if reference current is applied to the magnetic field sensor 1100, the sensor assemblies 1120 and 1130 constituting the magnetic field sensor 1100 react to the magnetic field generated from the conductive line 1230 and displaced.

In other words, Lorentz force based on the direction and the intensity of the magnetic field generated from the conductive line 1230 is applied to the sensor assemblies 1120 and 1130, and the sensor assemblies 1120 and 1130 moves by the generated Lorentz force. In this case, variation occurs in the distance and the overlap area between the sensor assemblies 1120 and 1130, so that variation occurs in capacitance.

Accordingly, the control device 1240 detects the intensity of current by detecting the variation in the capacitance or the electrical signal varying corresponding to the capacitance.

In this case, the intensity of the magnetic field generated by the current flowing through the conductive line 1230 is expressed as the above equation 1.

As described above, as the distance between the magnetic field sensor 1100 and the conductive line 1230 is decreased, the intensity of the magnetic field generated from the conductive line 1230 is increased. Accordingly, the distance between the conductive line 1230 and the magnetic field sensor 1100 may satisfy the range of 5 μm to 20 μm, preferably, the range of 10 μm to 15 μm.

Meanwhile, when the Lorentz force applied to the magnetic field sensor 1100 acts horizontally to the sensor assemblies 1120 and 1130 constituting the magnetic field sensor 1100, the displacement of the sensor assemblies 1120 and 1130 may be maximized even under the equal intensity of the magnetic field.

In this case, the acting direction of the Lorentz force is determined depending on the direction of the magnetic field generated from the conductive line 1230.

Therefore, according to the disclosure, the conductive line 1230 and the magnetic field sensor 1100 are arranged in such a manner that the Lorentz force acts horizontally, or the direction of the magnetic field is perpendicular to the magnetic field sensor 1100.

In this case, the direction of the magnetic field is determined by the direction of current flowing through the conductive line 1230. In other words, according to the Ampere's law, if the conductive line 1230 through which current flows is gripped with a right hand, and a thumb points in a direction that the current flows, the other fingers indicate the direction of a magnetic field. In this case, the magnetic field is represented in the shape of a concentric circle on the plane perpendicular to the direction of the current, and the direction of the magnetic field becomes a direction of turning a right handed screw when the right handed screw bores the way thereof in the direct on of the current.

As described above, in order for the direction of the magnetic field generated by the current flowing through the conductive line 1230 to become perpendicular to the sensor assemblies 1120 and 1130 constituting the magnetic field sensor 1100, the conductive line 1230 and the magnetic field sensor 1100 must be formed on the same plane and the conductive line 1230 must be formed in parallel to the arrangement direction of the magnetic field sensor 1100.

In this case, although the conductive line 1230 is formed on the same plane as that of the magnetic field sensor 1100, the magnetic field generated by the current flowing the conductive line 1230 is not perpendicular to the sensor assemblies 1120 and 1130. In other words, when the conductive line 1230 is formed on the same plane as that of the sensor assemblies 1120 and 1130 constituting the magnetic field sensor 1100 instead of the magnetic field sensor 1100 in parallel to the arrangement directions of the sensor assemblies 1120 and 1130, the magnetic field is generated perpendicularly to the sensor assemblies 1120 and 1130.

Therefore, according to the second embodiment of the disclosure, the conductive line 1230 is arranged on the same plane as those of the sensor assemblies 1120 and 1130 in parallel to the arrangement directions of the sensor assemblies 1120 and 1130.

Due to the arrangement of the conductive line 1230 and the sensor assemblies 1120 and 1130, the magnetic field generated by the current flowing through the conductive line 1230 is generated perpendicularly to the sensor assemblies 1120 and 1130. Accordingly, the Lorentz force acts horizontally, the displacement of the sensor assemblies 1120 and 1130 is maximized.

For the above arrangement, the package body 1210 is formed therein with a first groove 1270 and a second groove 1280.

The magnetic field sensor 1100 is inserted into the first groove 1270. That is to say, according to the disclosure, in order to minimize the volume of the magnetic field sensor package, the groove is formed in the package body 1210, so that the magnetic field sensor 1100 may be inserted into the formed groove.

The sensor assemblies 1120 and 1130 are formed in the magnetic field sensor 1100, and the sensor assemblies 1120 and 1130 are lifted at a predetermined height in the magnetic field sensor 1100.

Accordingly, in order to form the sensor assemblies 1120 and 1130 and the conductive line 1230 on the same plane, the first groove 1270 must be essentially formed.

In this case, the depth of the first groove 1270 may be determined depending on the heights at which the sensor assemblies 1120 and 1130 are provided in the magnetic field sensor 1100.

For example, when the sensor assemblies 1120 and 1130 are formed at the height of A from the bottom surface of the magnetic field sensor 1100, the first groove 1270 may be formed with a depth corresponding to the height of A.

In this case, the second groove 1280 to be formed in the package body 1210 may be omitted. In other words, since the depth of the first groove 1270 is formed corresponding to the heights of the sensor assemblies 1120 and 1130, when the conductive line 1230 is directly formed on the top surface of the package body 1210, the conductive line 1230 and the sensor assemblies 1120 and 1130 are provided on the same plane.

However, in this case, the lateral side of the conductive line 1230 may be exposed to the outside, which may cause the reduction in the intensity of current flowing through the conductive line 1230.

Therefore, according to the disclosure, the conductive line 1230 is buried in the package body 1210.

To this end, the second groove 1280 is formed in the package body 1210, and the conductive line 1230 is buried in the second groove 1280.

In this case, the depth of the second groove 1280 may be determined depending on the depth of the first groove 1270 and the heights at which the sensor assemblies 1120 and 1130 are formed in the magnetic field sensor 1100.

The depth of the second groove 1280 may be determined through the following equation.

$$D2 - D1 - D3 \qquad \text{Equation 2}$$

In this case, D1, D3, and D2 refer to the depth of the first groove 1270, the lifting heights of the sensor assemblies 1120 and 1130 in the magnetic field sensor 1100, and the depth of the second groove 1280, respectively.

As described above, the magnetic field sensor 1100 is inserted into the first groove 1270, and the conductive line 1230 is buried in the second groove 1280. In this case, the depths of the first and second grooves 1270 and 1280 are determined to the extent that the conductive line 1230 is provided on the same plane as those of the sensor assemblies 1120 and 1130 formed in the magnetic field sensor 1100.

Therefore, due to the arrangement of the conductive line 1230 and the sensor assemblies 1120 and 1130, the magnetic field 1290 may be generated perpendicularly to the sensor assemblies 1120 and 1130.

Meanwhile, alternatively, as shown in FIG. 20, the magnetic field sensor 1100 may be directly attached onto the package body 1210. In other words, the groove 1270 may be omitted.

In this case, in order to form the sensor assemblies 1120 and 1130 of the magnetic field sensor 1100 and the conductive line 1230 on the same plane, a protrusion 1215 may be formed in the package body 1210.

The protrusion 1215 is provided in a space where the conductive line 1230 is formed, and the conductive line 1230 and the sensor assemblies 1120 and 1130 are provided on the same plane.

To this end, the height of the protrusion 1215 is equal to the lifting heights of the sensor assemblies 1120 and 1130 in the magnetic field sensor 1100.

Meanwhile, the conductive line 1230 extends in a linear shape, and the extending direction of the conductive line 1230 is parallel to the arrangement direction of the sensor assemblies 1120 and 1130 constituting the magnetic field sensor 1100.

However, even if the conductive line 1230 is at a predetermined distance from the sensor assemblies 1120 and 1130 and formed on the same plane as an arrangement plane of the sensor assemblies 1120 and 1130, and the extending direction of the conductive line is perpendicular to the arrangement directions of the sensor assemblies 1120 and 1130, the magnetic field generated from the conductive line 1230 acts perpendicularly to the sensor assemblies 1120 and 1130.

Accordingly, at the position of the control device shown in FIG. 18, the conductive line 1230 may be formed perpendicularly to the arrangement directions of the sensor assemblies 1120 and 1130.

According to the embodiment of the disclosure, as the arrangement of the conductive line through which the current to be measured flows and the arrangement of the sensor assembly are optimized, the magnetic field is generated perpendicularly to the sensor assemblies, thereby minimizing the loss in the intensity of the magnetic field required to generate the Lorentz force.

In addition, according to the embodiment of the disclosure, the direction of the magnetic field is formed perpendicularly to a reference current conductive line of the driving electrode, thereby obtaining a stable output value while reducing a probability that the driving electrode receives the Lorentz force in a different direction instead of the horizontal direction to abnormally drive.

In addition, according to the embodiment of the disclosure, the Lorentz force is horizontally concentrated, so that the displacement of the driving electrode can be maximized. Accordingly, the output value can be maximized for an equal amount of current and an equal intensity of the magnetic field, so that the resolution can be improved.

Since the magnetic field sensor shown in FIG. 21 has been described with reference to FIG. 4, the details thereof will be omitted.

FIGS. 22 to 25 are views to explain a method of fabricating the magnetic field sensor package shown in FIGS. 18 and 19 in process sequence.

First, referring to FIG. 22, a package body 210 serving as a base to fabricate the magnetic field sensor package is prepared.

The package body 1210, which serves as a support substrate, may be formed of an insulating material. Specifically, the package body 1210 may include multi-layer ceramic (MIX), a glass substrate, a resin substrate, or a heavily-doped silicon substrate.

In addition, referring to FIG. 23, the first and second grooves 1270 and 1280 are formed in the prepared package body 1210.

The first and second grooves 1270 and 1280 may be formed through mechanically drilling or a layer.

In this case, the first and second grooves 1270 and 1280 are formed with mutually different depths. In other words, the first groove 1270 has a first depth D1 and the second groove 1280 has a second depth D2.

The first and second grooves 1270 and 1280 have depths to form the sensor assemblies 1120 and 1130 in the magnetic field sensor 1100 and the conductive line 1230 on the same plane.

In other words, the depth of the second groove 1280 may be determined depending on the depth of the first groove 1270 and the heights at which the sensor assemblies 1120 and 1130 are formed in the magnetic field sensor 1100.

Since this has described above in detail, the details thereof will be omitted.

Next, referring to FIG. 24, the magnetic field sensor 1100 is inserted into the first groove 1270 to fix the inserted magnetic field sensor 1100 into the first groove.

Thereafter, the conductive line 1230 is formed to be filled in the second groove 1280.

In this case, the second groove 1280 is formed by extending in a substantially linear shape, so that a plurality of conductive line pads formed on the package body 1210 are connected with each other. The conductive line 1230 is formed to be filled in the second groove 1280 extending in the linear shape.

The conductive line 1230 may be formed by performing a sputtering process or a plating process with respect to a conductive metallic material.

Thereafter, referring to FIG. 25, a protective layer 1260 is formed to cover an upper portion of the package body 1210.

As described above, the conductive line 1230 and the sensor assemblies 1120 and 1130 are arranged on the same plane in parallel to each other so that the magnetic field is generated from the conductive line 1230 perpendicularly to the sensor assemblies 1120 and 1130.

As described above, the magnetic field sensor 1100 is inserted into the first groove 1270, and the conductive line 1230 is filled into the second groove 1280. In this case, the depths of the first and second grooves 1270 and 1280 are determined to the extent that the conductive line 1230 is provided on the same plane as those of the sensor assemblies 1120 and 1130 formed in the magnetic field sensor 1100.

Accordingly, due to the arrangements of the conductive line 1230 and the sensor assemblies 1120 and 1130, the magnetic field 1290 may be generated perpendicularly to the sensor assemblies 1120 and 1130.

FIG. 26 is a top view showing a MEMS magnetic field sensor package according to a third embodiment of the disclosure. FIG. 27 is an enlarged top view showing a conductor and a sensor assembly shown in FIG. 20. FIG. 28 is a second sectional view taken along line A-A' of the magnetic field sensor package of FIG. 26.

Referring to FIG. 26, the MEMS magnetic field sensor package according to the third embodiment of the disclosure includes a magnetic field sensor 1100, a package body 1210, a wire pad 1220, a conductive line 1430, a control device 1240, a connection line 1250, and a protective layer 1260.

In the MEMS magnetic field sensor package 1400 shown in FIG. 26 according to the third embodiment of the disclosure, the same reference numerals will be assigned to the same components of those of the MEMS magnetic field sensor shown in FIG. 18 according to the first embodiment of the disclosure.

Since the magnetic field sensor 1100, the package body 1210, the wire pad 1220, the control device 1240, the connection line 1250, and the protective layer 1260 constituting the magnetic field sensor package 1400 are substantially the same as components included in the MEMS magnetic field sensor package 1300 shown in FIG. 18, the details thereof will be omitted.

The conductive line 1430 is formed under the magnetic field sensor 1100.

To this end, the package body 1210 is formed therein with a groove into which the conductive line 1430 is inserted, and the conductive line 1430 is filled in the formed groove.

In addition, the magnetic field sensor 1100 is attached to a top surface of the package body 1210.

In this case, different from the conductive line 1230 according to the second embodiment, the conductive line 1430 according to the third embodiment is arranged on a plane different from a plane where the magnetic field sensor, clearly, the sensor assemblies 1120 and 1130 included in the magnetic field sensor 1100 are arranged.

In this case, since the conductive line 1430 and the sensor assemblies 1120 and 1130 are formed on the mutually different planes, if the conductive line 1430 is formed in a shape the same as that of the second embodiment, the magnetic field is generated from the conductive line 1430 in the horizontal direction instead of the direction perpendicular to the sensor assemblies 1120 and 1130.

Therefore, according to the third embodiment of the disclosure, the magnetic field is generated from the conductive line 1430 perpendicularly to the sensor assemblies 1120 and 1130 by changing the shape of the conductive line 1430.

To this end, referring to FIG. 27, the conductive line 1430 includes a first part 1432 connected with one conductive line pad 1220, a second part 1434 extending from the first part 1432 to surround a lower portion of the magnetic field sensor 1100, and a third part 1436 extending from the second part 1434 to be connected with the other conductive line pad 1220.

The first part 1432 and the third part 1436 of the conductive line 1430 are used for the connection with the conductive line pads 1220. Accordingly, the shapes or the locations of the first and third parts 1432 and 1436 are not limited to those shown in FIG. 27, but modified.

According to the third embodiment of the disclosure, the conductive line 1430 includes the second part 1434, so that the magnetic field is generated from the conductive line 1430 perpendicularly to the sensor assemblies 1120 and 1130.

The second part 1434 is formed to surround a first region R1. In this case, the first region R1 is determined based on the second region where the magnetic field sensor 1100 is formed.

In other words, the first region R1 is located under the second region. In this case, the first region R1 is vertically located under the second region.

In other words, when viewed from the top or the bottom, at least a portion of the first region R1 is overlapped with at least a portion of the second region.

In this case, when viewed from the top or the bottom, the first region R1 may be located inward from the second region. On the contrast, the second region may be located inward of the first region R1.

In other words, the first region R1 is overlapped with the second region. In this case, the size of the first region R1 may be larger than that of the second region. Accordingly, the first region R1 may include a first-first region overlapped with the second region, and a first-second region extending from the first-first region and located at a peripheral region vertically under the second region.

Accordingly, the magnetic field sensor 1100 and the conductive line 1430 are formed on planes different from each other. In this case, a portion of the conductive line 1430 may be formed on the same plane as that of the magnetic field sensor 1100. In other words, the first part 1432 and the third part 1436 constituting the conductive line 1430 may be formed on the same plane as that of the magnetic field sensor 1100. However, the second part 1434 constituting the conductive line 1430 is formed to surround the first region R1.

In this case, the second part 1434 may make contact with the magnetic field sensor 1100.

In other words, as shown in FIG. 26, the top surface of the second part 1434 may make contact with the bottom surface of the magnetic field sensor 1100. However, although this is provided for the illustrative purpose, the second part 1434 may be formed in a region at a predetermined distance from the magnetic field sensor 1100 vertically under the magnetic field sensor 100.

As shown in FIG. 26, the second part 1434 may have a rectangular shape. In addition, the magnetic field sensor 1100 is provided vertically over the inner region surrounded by second part 434 having the rectangular shape Meanwhile, preferably, the first region R1 serving as a reference for the formation of the second part 1434 is formed largely than a third region of the magnetic field sensor 1100 in which the sensor assemblies 1120 and 1130 are formed.

In other than, the entire portion of the third region is included in the first region WI. Accordingly, the second part 1434 is not overlapped with the lower portion of the third region.

Therefore, the magnetic field is generated from the second part 1434 of the conductive line 1430 perpendicularly to the sensor assemblies 1120 and 1130 under the sensor assemblies 1120 and 1130.

Meanwhile, the first region in which the second part 1434 is partially formed is overlapped with the third region. In this case, if the second part 1434 surrounds the portion of the first region partially overlapped with the third region, the second part 1434 is provided at a lower region overlapped with the third region in which the sensor assemblies 1120 and 1130 are formed.

In this case, the magnetic field generated from the second part 1434 may act in the direction perpendicular to the sensor assemblies 1120 and 1130.

However, when the second part 1434 is formed in a region that is not overlapped with the first region formed therein with the magnetic field sensor 1100 is formed (in this case, the entire portion of the second region is included in the first region, and the first region is larger than the second region), when the second part 1434 is formed in a region overlapped with the third region (in this case, the entire portion of the first region is included in the third region, and the third region is larger than the first region), the intensity of the magnetic field is more reduced as compared to the cases under the disclosed conditions.

Accordingly, the second part 1434 is provided in a region that is overlapped with the first region formed therein with the magnetic field sensor 1100, and not overlapped with the third region formed therein with the sensor assemblies 1120 and 1130, so that the magnetic field having a stronger intensity may be generated perpendicularly to the sensor assemblies 1120 and 1130.

FIG. 29 is a top view showing a MEMS magnetic field sensor package according to a fourth embodiment of the disclosure. FIG. 30 is a sectional view taken along line A-A' of the MEMS magnetic field sensor package of FIG. 29. FIG. 31 is a sectional view showing the modification of the MEMS magnetic field sensor package of FIG. 29.

Referring to FIG. 29, a MEMS magnetic field sensor package 1500 according to the fourth embodiment of the disclosure includes a magnetic field sensor 1100, a package body 1210, a wire pad 1220, a conductive line 1530, a control device 1240, a connection line 1250, and protective layer 1260.

In the MEMS magnetic field sensor package 1500 shown in FIG. 29 according to the fourth embodiment of the disclosure, the same reference numerals will be assigned to the same components of those of the MEMS magnetic field sensor shown in FIGS. 18 and 26 according to the second and third embodiments of the disclosure.

Since the magnetic field sensor 1100, the package body 1210, the wire pad 1220, the control device 1240, the connection line 1250, and the protective layer 1260 constituting the MEMS magnetic field sensor package 1500 are substantially the same as components included in the MEMS magnetic field sensor package 1300 shown in FIG. 18, the details thereof will be omitted.

The conductive line 1530 is formed under the magnetic field sensor 1100.

In other words, although the conductive line 1430 is formed under the magnetic field sensor 1100 in the third embodiment of the disclosure, the conductive line 1530 is formed over the magnetic field sensor 1100 in the fourth embodiment of the disclosure.

To this end, the package body 1210 is formed therein with a plurality of protrusions 1540 and 1550 on which the conductive line 1530 is mounted. Accordingly, in the state that the conductive line 1530 is mounted on the protrusions 1540 and 1550, the conductive line 1530 is provided over the magnetic field sensor 1100.

In this case, the shape of the conductive 1530 has the same shape as that of the conductive line 1430 according to the third embodiment of the disclosure as shown in FIGS. 26 and 27.

Accordingly, the conductive line 1530 includes a first part 1532 connected with one conductive line pad 1220, a second part 1534 extending from the first part 1532 to surround a lower region of the magnetic field sensor 1100, and a third part 1536 extending from the second part 1534 to be connected with the other conductive line pad 1220.

The first and third parts 1532 and 1536 of the conductive line 1530 are formed for the connection with the conductive line pads 1220. Accordingly, the shape or the location of the first part 1532 or the third part 1536 is not limited to those shown in FIGS. 19 and 30, but modified.

In other words, as shown in FIG. 31, the conductive line pads 1220 may be exposed to the outside of the protective layer 1260, so that the first and third parts 1532 and 1536 may be connected with the conductive line pads 1220 while vertically extending to the inner part of the protective layer 1260.

In addition, according to the fourth embodiment of the disclosure, the conductive line 1530 includes a part such as the second part 1534, so that the magnetic field is generated from the conductive line 1530 perpendicularly to the sensor assemblies 1120 and 1130.

The second part 1534 is formed to surround a first region R1. In this case, the first region R1 is determined based on the second region where the magnetic field sensor 1100 is formed.

In other words, the virtual first region R1 is located over the second region. In this case, the first region R1 is vertically located over the second region.

In other words, when viewed from the top or the bottom, at least a portion of the first region R1 is overlapped with at least a portion of the second region.

In this case, when viewed from the top or the bottom, the first region R1 may be located inward from the second region. On the contrast, the second region may be located inward of the first region R1.

In other words, the first region is overlapped with the second region. In this case, the size of the first region may be larger than that of the second region.

Accordingly, the magnetic field sensor 1100 and the conductive line 1530 are formed on plans different from each other.

In this case, the first and third parts 1532 and 1536 of the conductive line 1530 are mounted on the protrusions 1540 and 1550, and the second part 1534 extends from the first and third parts 1532 and 1536. Accordingly, the second part 1534 is formed while being lifted over the region in which the magnetic field sensor 1100 is formed.

The second part 1534 may have a rectangular shape as shown in FIG. 29.

Meanwhile, the first region in which the second part 1534 is formed may be partially overlapped with a third region in which the sensor assemblies 1120 and 1130 are formed in the magnetic field sensor 1100.

As a result, although the second part 1436 is formed vertically under the magnetic field sensor 1100 in the third embodiment of the disclosure, the second part 1534 of the conductive line 1530 is formed vertically over the magnetic field sensor 1100 in the fourth embodiment of the disclosure.

In this case, the magnetic field generated from the second part 1436 according to the third embodiment is different from the magnetic field generated from the second part 1534 according to the fourth embodiment only in that they act upward and downward, respectively, and both of the magnetic fields act in a vertical direction when viewed from the sensor assemblies 1120 and 1130 of the magnetic field sensor 1100.

FIG. 32 is a top view showing a MEMS magnetic field sensor package according to a fifth embodiment of the disclosure.

Referring to FIG. 32, a MEMS magnetic field sensor package 1600 according to the fifth embodiment of the disclosure includes a magnetic field sensor 1100, a package body 1210, a wire pad 1220, a conductive line 1630, a control device 1240, a connection line 1250, and protective layer 1260.

In the MEMS magnetic field sensor package 1600 shown in FIG. 32 according to the fifth embodiment of the disclosure, the same reference numerals will be assigned to the same components of those of the MEMS magnetic field sensor shown in FIG. 26 according to the third embodiment of the disclosure.

Since the magnetic field sensor 1100, the package body 1210, the wire pad 1220, the control device 1240, the connection line 1250, and the protective layer 1260 constituting the MEMS magnetic field sensor package 1600 are substantially the same as components included in the MEMS magnetic field sensor package 1400 shown in FIG. 26, the details thereof will be omitted.

The conductive line 1630 is formed under the magnetic field sensor 1100.

To this end, the package body 1210 is formed therein with a groove into which the conductive line 1530 is inserted, and the conductive line 1630 is filled in the groove.

In addition, the magnetic field sensor 1100 is attached to the top surface of the package body 1210.

In addition, a bending part included in the conductive line 1630 is formed to surround the first region as described above. In this case, the first region is determined based on the second region in which the magnetic field sensor 1100 is formed. In other words, the first region is located under the second region. In this case, the first region is located vertically under the second region.

In other words, when viewed from the top or the bottom, at least a portion of the first region is overlapped with at least a portion of the second region.

In this case, when viewed from the top or the bottom, the first region may be located inward from the second region. On the contrast, the second region may be located inward of the first region.

However, although the second part of the conductive line 1430 shown in FIG. 26 has a rectangular shape, the second part of the conductive line 1630 according to the fifth embodiment of the disclosure has a circular shape.

FIG. 33 is a top view showing a MEMS magnetic field sensor package according to a sixth embodiment of the disclosure.

Referring to FIG. 33, a MEMS magnetic field sensor package 1700 according to the sixth embodiment of the disclosure includes a magnetic field sensor 1100, a package body 1210, a wire pad 1220, a conductive line 1730, a control device 1240, a connection line 1250, and protective layer 1260.

In the MEMS magnetic field sensor package 1700 shown in FIG. 33 according to the third embodiment of the disclosure, the same reference numerals will be assigned to the same components of those of the MEMS magnetic field sensor shown in FIG. 29 according to the first embodiment of the disclosure.

Since the magnetic field sensor 1100, the package body 1210, the wire pad 1220, the control device 1240, the connection line 1250, and the protective layer 1260 constituting the magnetic field sensor package 1700 are substantially the same as components included in the MEMS magnetic field sensor package 1500 shown in FIG. 29, the details thereof will be omitted.

The conductive line 1730 is formed over the magnetic field sensor 1100.

The second part of the conductive line according to the fourth embodiment of the disclosure is formed in a rectangular shape over the magnetic field sensor 1100.

However, the second part of the conductive line according to the sixth embodiment of the disclosure is formed in the circular shape over the magnetic field sensor 1100.

Meanwhile, the above conductive line may have a triangular shape, an oval shape, or a polygonal shape having at least one bending portion, as well as the circular shape or the rectangular shape.

Hereinafter, the MEMS magnetic field sensor package according to the seventh embodiment of the disclosure will be described with reference to FIGS. 34 to 37.

FIG. 34 is a top view showing a MEMS magnetic field sensor package according to a seventh embodiment of the disclosure. FIG. 35 is a top view showing a MEMS magnetic field sensor package according to an eighth embodiment of the disclosure. FIG. 36 is a sectional view taken along line A-A' of the MEMS magnetic field sensor package of FIGS. 34 and 35. FIG. 37 is a top view showing a magnetic field sensor in the magnetic field sensor package of FIG. 34.

Referring to FIGS. 34 to 36, the MEMS magnetic field sensor package 2300 according to the seventh and eighth embodiments of the disclosure includes a package body 2210, a conductive line pad 2220, a conductive line 2230, a coil 223, a first connection line 2237, a control device 2240, a second connection line 2250, a protective layer 2260, and a magnetic substance 2270.

The package body 2210, which serves as a support substrate, may be formed of an insulating material. Specifically, the package body 2210 may include multi-layer ceramic (MLC), a glass substrate, a resin substrate, or a heavily-doped silicon substrate.

The package body 2210 is provides therein with a plurality of devices. In other words, the devices are attached onto the package body 2210 and electrically connected with each other through the first connection line 2250.

The devices may include a magnetic field sensor 2100 and a control device 2240.

The magnetic field sensor 2100 and the control device 2240 may be arranged in line with each other as shown in FIG. 34, but the disclosure is not limited thereto. In other words, the magnetic field sensor 2100 and the control device 2240 may be variously arranged depending on designs.

The magnetic field sensor 2100 includes sensor components to sense the magnetic field, and the sensor components include the sensor assemblies 2120 and 2130, the displacement of which is varied depending on the intensities of the magnetic field. The magnetic field sensor 2100 may be connected with the adjacent control device 2240 through the second connection line 2250 to transceive a signal Preferably, the control device 2240 may be arranged adjacent to a plurality of sensing electrodes 2113, 2114, 2118, and 2119 constituting the magnetic field sensor 2100, and electrically connected with the sensing electrodes 2113, 2114, 2118, and 2119.

Alternatively, the control device 2240 may be arranged adjacent to a plurality of power electrodes 2111, 2112, 2116, and 2117 constituting the magnetic field sensor 2100, and electrically connected with the power electrodes 2111, 2112, 2116, and 2117.

The control device 2240 is connected with the magnetic field sensor 2100 to supply reference power to the magnetic field sensor 2100, to receive a sensing signal from the magnetic field sensor 2100, and to analyze the sensing signal to create a magnetic field signal.

Although FIGS. 34 and 36 show that the magnetic field sensor 2100 is connected with one control device 2240 through one second connect on line 2250, the disclosure is not limited thereto. In other words, the magnetic field sensor 2100 may be connected with the control device 40 through a plurality of second connection lines 2250.

The second connection line 2250 may include a wire as shown in FIGS. 34 and 35, but the disclosure is not limited thereto. In other words, the second connection line 2250 may be realized using an electrode formed in the magnetic field sensor 2100 and a conductive line pad traversing the electrode of the control device 2240 (not shown).

The protective layer 2260 is formed on the package body 2210. Preferably, the protective layer 2260 is formed on the package body 2210 to surround the magnetic field sensor 2100 and the control device 2240.

The protective layer 2260 is formed on the package body 2210 as shown in FIG. 35 to seal the upper space of the package body 2210.

A conductive line 2230 is formed in the package body 2210 to transfer current to be measured. Preferably, the conductive line 2230 generates a magnetic field to be sensed by the magnetic field sensor 2100.

A plurality of conductive line pads 2220 are formed in the package body 210. In this case, one end of the conductive line 2230 is connected with one conductive line pad 2220, and an opposite end of the conductive line 2230 is connected with another conductive line pad 2220.

In this case, the conductive line 2230 according to the fifth embodiment of the disclosure extends in a substantially linear shape, so that one end of the conductive line 2230 is connected with the one conductive line pad 2220, and an opposite end of the conductive line 2230 is connected with another conductive line pad 2220.

The conductive line 2230 is formed to traverse the groove 2280 formed in the package body 2210, and not formed on the groove 2280. Accordingly, the conductive line 2230 includes a plurality of parts spaced apart from each other by a predetermined distance.

The current to be measured flows through the conductive line 2230. If the current to be measured flows through the conductive line 2230, a magnetic field is generated around the conductive line 2230.

Meanwhile, if reference current is applied to the magnetic field sensor 2100, the sensor assemblies 2120 and 2130 constituting the magnetic field sensor 2100 react to the magnetic field generated from the conductive line 30 and displaced.

In other words, Lorentz force based on the direction and the intensity of the magnetic field generated from the conductive line 2230 is applied to the sensor assemblies 2120 and 2130, and the sensor assemblies 2120 and 2130 moves by the generated Lorentz force. In this case, variation occurs in the distance and the overlap area between the sensor assemblies 2120 and 2130, so that variation occurs in capacitance.

Accordingly, the control device 2240 detects the intensity of current by detecting the variation in the capacitance or the electrical signal varying corresponding to the capacitance.

In this case, the intensity of the magnetic field generated by the current flowing through the conductive line 2230 is expressed as the above equation 1.

As described above, as the distance between the magnetic field sensor 2100 and the conductive line 2230 is decreased, the intensity of the magnetic field generated from the conductive line 2230 is increased. Accordingly, the distance between the conductive line 2230 and the magnetic field sensor 2100 may satisfy the range of 5 μm to 20 μm, preferably, the range of 10 μm to 15 μm.

Meanwhile, when the Lorentz force applied to the magnetic field sensor 2100 acts horizontally to the sensor assemblies 2120 and 2130 constituting the magnetic field sensor 2100, the displacement of the sensor assemblies 2120 and 2130 may be maximized even under the equal intensity of the magnetic field.

In this case, the acting direction of the Lorentz force is determined depending on the direction of the magnetic field generated from the conductive line 2230.

Therefore, according to the disclosure, a magnetic substrate 2270 is formed in such a manner that the Lorentz force acts horizontally, or the direction of the magnetic field is perpendicularly to the magnetic field sensor 2100.

The magnetic substance 2270 is inserted into the groove 70 formed in the package body 2210.

In other words, the direction of the magnetic field is determined depending on the direction of current flowing through the conductive line 2230. In other words, according to the Ampere's law, if the conductive line 2230 through which current flows is gripped with aright hand, and a thumb points in a direction that the current flows, the other fingers indicate the direction of a magnetic field. In this case, the magnetic field is represented in the shape of a concentric circle on the plane perpendicular to the direction of the current, and the direction of the magnetic field becomes a direction of turning a right handed screw when the right handed screw bores the way thereof in the direction of the current.

In this case, the magnetic substance 2270 transfers the magnetic field generated by the current flowing through the conductive line 2230 to the magnetic field sensor 2100.

In this case, the magnetic field is transferred in a direction perpendicular to the sensor assemblies 2120 and 2130 constituting the magnetic field sensor 2100. To this end, the groove 2270 is located vertically under the first region formed therein with the sensor assemblies 2120 and 2130, and the magnetic substance 2270 is inserted into the groove 2270 located vertically under the first region.

In this case, the magnetic substance 2270 may be inserted into the groove 2270 in an erected state so that the magnetic substance 2270 is perpendicular to the sensor assemblies 2120 and 2130.

In other words, the magnetic substance 2270 is formed perpendicularly to the extension direction of the sensor assemblies 2120 and 2130. For example, since the sensor assemblies 2120 and 2130 are arranged in a laid state on the package body 2210, the magnetic substance 2270 is arranged in the erected state in the groove 2280.

A coil 2235 is wound around the magnetic substance 2270.

The coil 2235 may be formed of the same material as that of the conductive line 2230 and with a thickness equal to that of the conductive line 2230. Alternatively, the coil 2235 and the conductive line 2230 may be formed with mutually different thicknesses.

In this case, the intensity of the magnetic field generated by the magnetic substance 70 is expressed as follows.

$$B=(\mu*N*I)/d \qquad \text{Equation 3}$$

In this case, μ=magnetic permeability, N=a winding number, I=current, and d=the length of an electromagnet.

In other words, the intensity of the magnetic field generated by the magnetic substance 2270 may be adjusted depending on the permeability and the length of the magnetic substance 2270, and the winding number of the coil 2235 as described above. Accordingly, electric fields having mutually different intensities are generated depending on the winding number of the coil wound around the magnetic substance 2270 under the same current.

Accordingly, the winding number of the coil 2235 wound around the magnetic substance 2270, the length of the magnetic substance 2270, and the permeability of the magnetic substance 2270 are appropriately adjusted to increase the intensity of the magnetic field so that the intensity of the magnetic field is measurable even with respect to microcurrent.

As described above, according to the disclosure, the magnetic substance 2270 around which the conductive line 2230 (the conductive is substantially a coil. In this case, the conductive line and the coil are distinguished therebetween for the convenience of explanation, but are the same components) wound is provided under the magnetic field sensor 2100 to increase the intensity of the magnetic field generated by the current flowing through the conductive line 2230, thereby maximizing the output signal of the magnetic field sensor 2100. The output signal of the magnetic field sensor 2100 is maximized by increasing the intensity of the magnetic field generated by the current flowing through the conductive line 2230.

In addition, the magnetic substance 2270 is provided perpendicularly to the sensor assemblies 2120 and 2130 under the sensor assemblies 2120 and 2130 constituting the magnetic field sensor 2100, so that the magnetic field output from the magnetic substance 2270 is applied to the sensor assemblies 2120 and 2130 perpendicularly to the sensor assemblies 2120 and 2130, thereby more exactly detecting the intensity of the magnetic field.

Meanwhile, the coil 2235 wound around the magnetic substance 2270 may be directly connected with the conductive line pad 2220. In other words, the first connection line 2237 connects the conductive line pad 2220 with the coil 2235 wound around the magnetic substance 2270. Alternatively, the conductive line 2230 connected with the conductive line pad 2220 is primarily formed on the package body 2210, so that the conductive line 230 may be connected with the coil 2235 wound around the magnetic substance 2270 using the first connection line 2237.

In this case, as shown in FIG. 34, the magnetic substance 270 may have a cylinder shape. As described above, when the magnetic substance 270 has the cylinder shape, the groove 2280, into which the magnetic substance 2270 is inserted, is formed to have the cylinder shape corresponding to the shape of the magnetic substance 2270.

In addition, as shown in FIG. 35, the magnetic substance 2270 may have a rectangular column. When the magnetic substance 2270 has a rectangular prism shape as described above, the groove 2280 into which the magnetic substance 2270 is inserted is formed to have the rectangular prism shape corresponding to the shape of the magnetic substance 2270.

However, the shape of the magnetic substance 2270 is provided only for the illustrative purpose according to one embodiment of the disclosure, and the magnetic substance 2270 may have various shapes as well as the shape shown in drawings. For example, the magnetic substance 2270 may have a triangular prism shape or a polygonal prism shape.

The groove 2280 may preferably have a width wider than that of the magnetic substance 2270 2270.

In other words, the coil 2235 is wound around the magnetic substance 2270. The first connection line 2237 to connect the coil 2235 with the conductive line 2230 must be formed in the groove 2280. Accordingly, the width of the groove 2280 is preferably determined in consideration of the width of the magnetic substance 2270, the thickness of the wound coil 2235, and a space for the formation of the first connection line 2237.

Meanwhile, although a component to transfer the magnetic field, which is generated by the current flowing through the conductive line 2230, to the sensor assemblies 2120 and 2130 is limited to the magnetic substance 2270 in the above, the disclosure is not limited thereto.

In other words, the magnetic substance 2270 may be substituted with another component that does not absorb the magnetic field, but allows the magnetic field to smoothly flow while providing a transfer path of the magnetic field. For example, the magnetic substance 2270 may be substituted with a permanent magnet or an electromagnet.

According to the embodiment of the disclosure, an electromagnet is provided between a conductive line through which the current to be measured flows and the sensor assembly to increase the intensity of the magnetic field under the same current, so that the output signal of the magnetic field sensor can be maximized.

In addition, according to the embodiment of the disclosure, the magnetic substance is arranged perpendicularly to the sensor assembly, thereby obtaining a stable output value while reducing a probability that the sensor assembly receives the Lorentz force in a different direction instead of the horizontal direction to abnormally drive.

In addition, according to the embodiment of the disclosure, the Lorentz force is horizontally concentrated, so that the displacement of the driving electrode can be maximized. Accordingly, the output value can be maximized for the same current and an equal intensity of the magnetic field, so that the resolution can be improved.

FIG. 37 is a top view showing a magnetic field sensor in the magnetic field sensor package of FIGS. 34 and 35. In this case, since the detailed structure of the magnetic substance 2270 has been described with reference to FIG. 4, the details thereof will be omitted.

FIGS. 38 to 43 are flowcharts to explain a method of fabricating a MEMS magnetic field sensor package shown in FIGS. 34 and 36.

First, referring to FIG. 38, a package body 2210 serving as abase to fabricate the magnetic field sensor package is prepared.

The package body 2210, which serves as a support substrate, may be formed of an insulating material Specifically, the package body 2210 may include multi-layer ceramic (MLC), a glass substrate, a resin substrate, or a heavily-doped silicon substrate.

Thereafter, referring to FIG. 39, the conductive line 2230 is formed on the top surface of the package body 2210.

In this case, the conductive line 2230 may be formed by forming a metallic layer on the package body 2210 through a plating process for a metallic material, and patterning the metallic layer.

In addition, the conductive line 2230 may be a conductive line pad 2220. In other words, the conductive line 2230 and the coil 2235 are substantially the same components. Accordingly, the conductive line 2230 may be wound around only the magnetic substance 2270. Alternatively, the conductive line 2230 may be additionally formed on the top surface of the package body 2210.

In this case, when the conductive line 2230 is formed on the package body 2210, the conductive line 2230 may have the shape of extending in a substantially linear shape, so that a plurality of conductive line pads 2220 are connected with each other.

Thereafter, the package body 2210 is formed therein with the groove 2280.

The groove 2280 may be formed through one of mechanically machining, a laser, and chemical treatment.

When the groove 2280 is formed through the mechanically machining, milling, drilling, and routing may be used. When the groove 2280 is formed through the laser, a UV or CO2 laser method may be formed. When the groove 2280 is formed through chemical treatment, the package body 2210 may be open using chemicals including aminosilane or ketones.

Meanwhile, according to the laser machining, optical energy is concentrated on a surface of a material, so that a portion of the material can be cut in a desirable form by melting and evaporating the portion of the material, and a complex form of a material can be easily processed through a computer program.

In addition, according to the laser machining, the material may be cut until the diameter of the material becomes at least 0.005 mm. Further, the laser machining provides the wide machinable thickness range.

Next, referring to FIG. 40, the magnetic substance 2270 is inserted into the groove 2280.

In this case, the magnetic substance 2270 is formed with the permeability and the length that satisfy the condition required to obtain a magnetic field having the desirable intensity.

In other words, the magnetic substance 2270 is formed of a metallic material. The permeability difference is made according to the types of metallic materials constituting the magnetic substance 2270, and the difference in the intensity of the magnetic field is made according to the permeability difference.

The relative permeability according to metallic materials constituting the magnetic substance 2270 are shown in Table 1.

TABLE 1

| Material | Relative permeability |
| --- | --- |
| Iron | 5000 |
| Cobalt | 250 |
| Nickel | 600 |
| Silicon steel | 7000 |
| Permalloy | 100,000 |

In addition, the coil 2235 is wound around the magnetic substance 2270. The coil 223 is connected with the conductive line 2230 to provide the path of the current flowing through the conductive line 2230.

Thereafter, referring to FIG. 41, the first connection line 2237 is formed to connect the coil 2235 wound around the magnetic substance 2270 and the conductive line 2230 formed on the package body 2210.

The first connection line 2237 may be formed through soldering.

Next, referring to FIG. 42, the magnetic field sensor 2100 is attached to the package body 2210. In this case, the magnetic field sensor 2100 may be formed in contact with the top surface of the package body 2210.

In this case, the magnetic field sensor 2100 may make contact with the magnetic substance 2270. In addition, the magnetic field sensor 2100 is arranged in such a manner that the magnetic field generated by the magnetic substance 2270 is perpendicular to the arrangement direction of the magnetic field sensor 2100.

In more detail, the sensor assemblies 2120 and 2130 constituting the magnetic field sensor 2100 are arranged perpendicularly to the magnetic substance 2270.

In general, the sensor assemblies 2120 and 2130 are arranged in a horizontal state within the magnetic field sensor 2100.

Accordingly, preferably, the magnetic substance 2270 is inserted into the groove 7780 in a vertically erected state.

In this case, it is preferred that the magnetic substance 2270 is located vertically under the magnetic substance 2270. In more detail, the magnetic substance 2270 is formed at the first region, In this case, the first region is determined based on the second region where the magnetic field sensor 2100 is formed.

The first region is located under the second region. In this case, the first region is located vertically under the second region. In this case, the first region is partially overlapped with at least a portion of the second region.

In this case, preferably, the region where the sensor assemblies 2120 and 2130 provided in the magnetic field sensor 2100 are formed is located vertically over the first region, and the first region may be overlapped with the entire region where the sensor assemblies 120 and 2130 are formed.

Due to the above arrangement, the magnetic field generated by the magnetic substance 2270 is transferred to the sensor assemblies 2120 and 2130. In this case, the magnetic field is generated perpendicularly to the sensor assemblies 2120 and 2130 and transferred to the sensor assemblies 2120 and 2130.

Next, referring to FIG. 43, the protective layer 2260 is formed to cover an upper portion of the package body 2210.

As described above, according to the seventh and eighth embodiments of the disclosure, the magnetic substance 2270 is arranged vertically under the sensor assemblies 2120 and 2130 constituting the magnetic field sensor 2100.

In this case, the coil 2235 is wound around the magnetic substance 2270, and current flows through the wound coil 2235. In addition, the intensity of the magnetic field generated by the flowing current is increased by the magnetic substance 2270.

In this case, the magnetic substance 2270 is located vertically under the sensor assemblies 2120 and 2130. The magnetic substance 2270 is inserted into the groove 2280 in the erected state so that the magnetic substance 2270 is perpendicular to the extension directions of the sensor assemblies 2120 and 2130.

Accordingly, the magnetic field is generated by the magnetic substance 2270 perpendicularly to the sensor assemblies 2120 and 2130.

According to the embodiment of the disclosure, an electromagnet is provided between the conductive line through which the current to be measured flows and the sensor assembly to increase the intensity of the magnetic field under the same current, so that the output signal of the magnetic field sensor can be maximized.

In addition, according to the embodiment of the disclosure, the magnetic substance is arranged perpendicularly to the sensor assembly, thereby obtaining a stable output value while reducing a probability that the sensor assembly receives the Lorentz force in a different direction instead of the horizontal direction to abnormally drive.

In addition, according to the embodiment of the disclosure, the Lorentz force is horizontally concentrated, so that the displacement of the driving electrode can be maximized. Accordingly, the output value can be maximized for the same current and an equal intensity of the magnetic field, so that the resolution can be improved.

FIG. 44 is a top view showing a MEMS magnetic field sensor package according to a ninth embodiment of the disclosure. FIG. 45 is a second sectional view taken along line A-A' of the magnetic field sensor package of FIG. 44. FIG. 46 is an enlarged view showing a conductive line shown in FIGS. 44 and 45.

Referring to FIGS. 44 to 46, the MEMS magnetic field sensor package according to the ninth embodiment of the disclosure includes a body 2410, a conductive line pad 2420, a conductive line 2430, a control device 2440, a connection line 2450, a protective layer 2460, and a magnetic substance 2470.

In the following description of components shown in FIGS. 44 and 46, the details of the same components as those shown in FIGS. 34 to 36 will be omitted.

That is to say, in the MEMS magnetic field sensor package according to the ninth embodiment of the disclosure, the package body 2410, the conductive line pad 2420, the control device 2440, the connection line 2450, and the protective layer 2460 are substantially the same as components disclosed in the MEMS magnetic field sensor package according to the seventh and eighth embodiments of the disclosure.

The package body 2410 is formed therein with the groove 2480.

The groove 2480 is located vertically under the region for the formation of the magnetic field sensor 2100 attached onto the package body 2410.

In this case, as described above, the groove 2480 has an up-down width wider than a left-right width so that the magnetic substance 2470 inserted into the groove 2480 is arranged perpendicularly to the extension direction of the magnetic field sensor 2100. In other words, the groove 2480 may have one of a triangular prim shape, a cylindrical shape, a rectangular prism shape, and a polygonal prim shape.

The magnetic substance 2470 is inserted into the groove 2480.

In this case, different from those of the seventh and eighth embodiments of the disclosure, a coil or a conductive line is not wound around an outer circumferential surface of the magnetic substance 2470.

In addition, the conductive line 2430 is spaced apart from the magnetic field sensor 2470 by a predetermined distance while surrounding the magnetic substance 2470.

In this case, the magnetic substance 2470 has a prism shape. Accordingly, the conductive line 2430 includes a plurality of layers.

In other words, the magnetic substance 2470 may be divided into a plurality of regions. For example, the magnetic substance 2470 may include an upper region, a lower region, and a central region interposed between the upper and lower regions. In this case, the central region may be divided into a plurality of regions.

Accordingly, the magnetic substance 2470 may be divided into five regions of an upper region, a first central region, a second central region, a third central region, and a lower region. In this case, although the magnetic substance 2470 is divided into five regions for the illustrative purpose, the division regions of the magnetic substance 2470 may be increased or decreased.

In addition, the conductive line 2430 includes a first conductive line 2431 to surround a lower region of the magnetic substance 2470, a second conductive line 2432 to surround the first central region of the magnetic substance 2470, a third conductive line 2433 to surround the second central region of the magnetic substance 2470, a fourth conductive line 2434 to surround the third central region of the magnetic substance 2470, and a fifth conductive line 2435 to surround the upper region of the magnetic substance 2470.

In this case, the first conductive line 2431, the second conductive line 2432, the third conductive line 2433, the fourth conductive line 2434, and the fifth conductive line 455 are formed at a predetermined distance from the outer circumferential surface of the magnetic substance 2470. Accordingly, the groove 2480 has a width wider than that of the magnetic substance 2470.

The lateral sides of the first conductive 2431, the second conductive line 2432, the third conductive line 2433, the fourth conductive line 2434, and the fifth conductive line 2455 are exposed through the inner wall of the groove 2480. Accordingly, the magnetic field formed by the current flowing through the first conductive line 2431, the second conductive line 2432, the third conductive line 2433, the fourth conductive line 2434, and the fifth conductive line 2455 is transferred into the groove 2480. Accordingly, the magnetic field transferred into the groove 2480 is increased through the magnetic substance 2470 and transferred to the magnetic field sensor 2100.

In this case, the first conductive line 2431, the second conductive line 2432, the third conductive line 2433, the fourth conductive line 2434, and the fifth conductive line 2455 are mutually connected with each other. To this end, the conductive line 2430 includes a first connection conductive line 2436 to connect the first conductive line 2431 with the second conductive line 2432, a second connection conductive line 2437 to connect the second conductive line 2432 with the third conductive line 2433, a third conductive line 2438 to connect the third conductive line 2433 with the fourth conductive line 2434, and a fourth connection conductive line 2439 to connect the fourth conductive line 2434 with the fifth conductive line 2435.

In addition, the first conductive line 2431, the second conductive line 2432, the third conductive line 2433, the fourth conductive line 2434, and the fifth conductive line 455 may be connected with the conductive line pad 2420 through an additional conductive line formed on the package body 2410.

Referring to FIG. 46, the shape of the conductive line 2430 including the first conductive line 2431, the second conductive line 2432, the third conductive line 2433, the fourth conductive line 2434, and the fifth conductive line 2455 may have a swing shape.

As a result, although current to be measured flows in the state that the conductive line is wound around the magnetic substance 2470 according to the seventh and eighth embodiments of the disclosure, the conductive line 2430 is formed to surround the magnetic substance 2470 at a predetermined distance from the magnetic substance 2470 according to the ninth embodiment of the disclosure.

In addition, the lateral side of the conductive line 2430 is exposed through the groove 2489 into which the magnetic substance 2470 is inserted, so that the magnetic field is concentrated into the groove 2480 and transferred to the magnetic substance 2470.

Since the magnetic substance 2470 is inserted into the groove 2480 perpendicularly to the extension direction of the sensor assemblies 2120 and 2130, the magnetic field is increased perpendicularly to the sensor assemblies 2120 and 2130 and transferred to the sensor assemblies 2120 and 2130.

Meanwhile, the first conductive line 2431, the second conductive line 2432, the third conductive line 2433, the fourth conductive line 2434, and the fifth conductive line 2435 have shapes corresponding to the sectional shapes of the magnetic substance 2470.

For example, when the magnetic substance 2470 has a circular shape when viewed in a cross-sectional view, the first conductive line 2431, the second conductive line 2432, the third conductive line 2433, the fourth conductive line 2434, and the fifth conductive line 2435 may be formed in a ring shape at a peripheral portion of the magnetic substance 2470, when the magnetic substance 2470 has a rectangular shape when viewed in a cross-sectional view, the first conductive line 2431, the second conductive line 2432, the third conductive line 2433, the fourth conductive line 2434, and the fifth conductive line 2435 may be formed in a rectangular shape at a peripheral portion of the magnetic substance 2470.

Meanwhile, although a component to transfer the magnetic field generated by current flowing through the conductive line 2430 to the sensor assemblies 2120 and 2130 is limited to the magnetic substance 2470 in the above, the disclosure is not limited thereto.

In other words, the magnetic substance 2470 may be substituted with another component that does not absorb the magnetic field, but allows the magnetic field to smoothly flow while providing a transfer path of the magnetic field. For example, the magnetic substance 2470 may be substituted with a permanent magnet or an electromagnet.

According to the embodiment of the disclosure, an electromagnet is provided between the conductive line through which the current to be measured flows and the sensor assembly to increase the intensity of the magnetic field under the same current, so that the output signal of the magnetic field sensor can be maximized.

In addition, according to the embodiment of the disclosure, the magnetic substance is arranged perpendicularly to the sensor assembly, thereby obtaining a stable output value while reducing a probability that the sensor assembly receives the Lorentz force in a different direction instead of the horizontal direction to abnormally drive.

In addition, according to the embodiment of the disclosure, the Lorentz force is horizontally concentrated in, so that the displacement of the driving electrode can be maximized. Accordingly, the output value can be maximized for the same current and an equal intensity of the magnetic field, so that the resolution can be improved.

FIG. 47 is a top view showing a MEMS magnetic field sensor package according to a tenth embodiment of the disclosure. FIG. 48 is an enlarged view showing a conductive line shown in FIG. 47. FIG. 49 is a sectional view taken along line A-A' of the magnetic field sensor package of FIG. 47. FIG. 50 is a view showing a deformation of FIG. 49.

Referring to FIGS. 47 to 50, the MEMS magnetic field sensor package 2500 according to the tenth embodiment of the disclosure includes a magnetic field sensor 2100, a package body 2510, a conductive line pad 2520, a conductive line 2530, a control device 2540, a connection line 2550, a protective layer 2560, and a magnetic substance 2570.

Since the magnetic field sensor 2100, the package body 2510, the wire pad 2520, the control device 2540, the connection line 2550, and the protective layer 2560 constituting the MEMS magnetic field sensor package 2500 are substantially the same as components included in the MEMS magnetic field sensor package the previous embodiment, the details thereof will be omitted.

The conductive line 2530 is formed under the magnetic field sensor 2100.

To this end, the package body 2510 is formed therein with a groove into which the conductive 2530 is inserted, and the conductive line 2530 is filled in the groove.

In addition, the magnetic field sensor 2100 is formed at an upper portion of the package body 2510.

In this case, the magnetic substance 2570 is formed under the package body 2510. The magnetic substance 2570 is arranged vertically under the sensor assemblies 2120 and 2130, which are provided in the magnetic field sensor 2100, in a direction perpendicular to the extension directions of the sensor assemblies 2120 and 2130.

In this case, the magnetic substance 2570 may protrude from the top surface of the package body 2510. Alternatively, the magnetic substance 2570 may be inserted into the groove formed in the package body 2510.

When the magnetic substance 2570 protrudes upward from the surface of the package body 2510, the conductive line 2530 and the magnetic substance 2570 are formed at mutually different layers. Alternatively, when the magnetic substance 2570 is inserted into the groove formed in the package body 2510, the magnetic substance 2570 and the conductive line 2530 are formed on the same plane.

Referring to FIG. 48, the conductive line 2530 includes a first part 2532 connected with one conductive line pad 2520, a second part 2534 extending from the first part 2532 to surround a lower portion of the magnetic field sensor 2100, and a third part 2536 extending from the second part 2534 to be connected with the other conductive line pad 2520.

The first part 2532 and the third part 2536 of the conductive line 2530 are used for the connection with the conductive line pads 2520. Accordingly, the shapes or the locations of the first and third parts 2532 and 2536 are not limited to those shown in FIGS. 47 and 49, hut modified.

In addition, according to the tenth embodiment of the disclosure, the conductive line 2530 includes the second part 2534, so that the magnetic field is generated from the conductive line 2530 perpendicularly to the sensor assemblies 2120 and 2130.

The second part 2534 is formed to surround a first region. In this case, the first region is determined according to the embodiments. In other words, the first region is varied depending on whether the magnetic substance 2570 is inserted into the package body 2510 or protrudes.

Referring to FIG. 49, the first region is determined based on the second region where the magnetic field sensor 2570 is formed.

In other words, the first region is located under the second region. In this case, the first region is located vertically under the second region.

In other words, when viewed from the top or the bottom, at least a portion of the first region is overlapped with at least a portion of the second region.

In this case, when viewed from the top or the bottom, the first region may be located inward from the second region. On the contrast, the second region may be located inward of the first region.

Meanwhile, the second region is located vertically under the third region where the magnetic field sensor 2100 is formed. Preferably, the second region is located vertically under a region where the sensor assemblies 2120 and 2130 are formed in the magnetic field sensor 2100.

Accordingly, the first region is located vertically under the third region and the region where the sensor assemblies 2120 and 2130 are formed.

The magnetic substance 2570 and the magnetic field sensor 2100 are arranged vertically upward of an inner region (which may be the first region) of the second part 2534 of the conductive line 2530.

In this case, the magnetic field is generated in the first region perpendicularly to the sensor assemblies 2120 and 2130 by the current flowing through the conductive line 2530. Accordingly, the magnetic field in the first region is transferred to the magnetic substance 2570 located vertically over the first region.

In addition, the magnetic field transferred to the magnetic substance 2570 is transferred to the sensor assemblies 2120 and 2130.

In this case, since the magnetic substance 2570 is arranged perpendicularly to the extension directions of the sensor assemblies 2120 and 2130, the magnetic field is generated by the magnetic substance 2570 perpendicularly to the sensor assemblies 2120 and 2130.

Accordingly, due to the conductive line 2530 having the above shape, the magnetic field is generated perpendicularly to the sensor assemblies 2120 and 2130, thereby minimizing the loss in the intensity of the magnetic field required to generate the Lorentz force. In addition, an additional magnetic substance 2570 is provided perpendicularly to the sensor assemblies 2120 and 2130 to increase the intensity of the magnetic field, so that the more stable output value may be obtained.

Next, referring to FIG. 50, the first region is a region where the magnetic substance 2570 is formed.

In other words, the second part 2534 of the conductive line 2530 surrounds the outer circumferential surface of the magnetic substance 2570. In this case, the second part 2534 of the conductive line 2530 does not directly make contact with the outer circumferential surface of the magnetic substance 2570, but surrounds the magnetic substance 2570 at a predetermined distance from the outer circumferential surface of the magnetic substance 2570.

The magnetic field sensor 2100 is provided on the magnetic substance 2570.

In this case, the magnetic field sensor 2100 is located vertically over the magnetic substance 2570.

Accordingly, the first region is located vertically under the region where the magnetic field sensor 2100 is formed. In addition, the first region is located under the region where the magnetic field sensor 2100 is formed. In addition, the magnetic substance 2570 is provided in the first region.

The magnetic field formed by the current flowing through the second part 2534 of the conductive line 2530 is transferred to the magnetic substance 2570 provided in the inner part by the current flowing through the conductive line 2530.

The magnetic field transferred to the magnetic substance 2570 is transferred to the sensor assemblies 2120 and 2130.

In this case, since the magnetic substance 2570 is provided perpendicularly to the extension direction of the sensor assemblies 2120 and 130, the magnetic field is generated by the magnetic substance 2570 perpendicularly to the sensor assemblies 2120 and 2130.

Accordingly, due to the conductive line 2530 having the above shape, the magnetic field is generated perpendicularly to the sensor assemblies 2120 and 2130, thereby minimizing the loss in the intensity of the magnetic field required to generate the Lorentz force. In addition, an additional magnetic substance 2570 is provided perpendicularly to the sensor assemblies 2120 and 2130 to increase the intensity of the magnetic field, so that the more stable output value may be obtained.

FIG. 51 is atop view showing a MEMS magnetic field sensor package according to an eleventh embodiment of the disclosure.

Referring to FIG. 51, the MEMS magnetic field sensor package 2600 according to the eleventh embodiment of the disclosure includes a magnetic field sensor 2100, a package body 2610, a conductive line pad 2620, a conductive line 2630, a control device 2640, a connection line 2650, a protective layer 2660, and a magnetic substance 2670.

In this case, the MEMS magnetic field sensor package 2600 according to the eleventh embodiment of the disclosure shown in FIG. 51 is substantially the same as the MEMS magnetic field sensor package according to the tenth embodiment of the disclosure shown in FIG. 47 except for the shape of the conductive line.

In other words, although the conductive lit 2530 in the MEMS magnetic field sensor package shown in FIG. 47 has a circular shape, the conductive lit shown in FIG. 51 has a rectangular shape.

Meanwhile, the conductive line (actually, the second part of the conductive line) may have various shapes including the circular shape or the rectangular shape as long as the conductive line surrounds the first region defined as described above. For example, the conductive line may have a triangular shape or a polygonal shape.

According to the embodiment of the disclosure, an electromagnet is provided between a conductive line through which the current to be measured flows and the sensor assembly to increase the intensity of the magnetic field under the same current, so that the output signal of the magnetic field sensor can be maximized.

In addition, according to the embodiment of the disclosure, the magnetic substance is arranged perpendicularly to the sensor assembly, thereby obtaining a stable output value while reducing a probability that the sensor assembly receives the Lorentz force in a different direction instead of the horizontal direction to abnormally drive.

In addition, according to the embodiment of the disclosure, the Lorentz force is concentrated in the horizontal direction, so that the displacement of the driving electrode can be maximized. Accordingly, the output value can be maximized for the same current and an equal intensity of the magnetic field, so that the resolution can be improved.

The invention claimed is:

1. A magnetic field sensor package comprising:
   a package body;
   a conductive line provided on the package body to allow current to be measured to flow;
   a magnetic field sensor provided on the package body, comprising a sensor assembly displaced by a magnetic field, a first driving electrode having a path that reference current flows and movable by the magnetic field of the current to be measured, and a second driving electrode having the path that the reference current flows and movable by the magnetic field of the current to be measured, and sensing the magnetic field generated by the current to be measured, wherein variation in a capacitance formed as the first driving electrode and the second driving electrode move while floating is measured;
   a magnetic substance formed at a peripheral part of the conductive line to transfer a magnetic field generated through the conductive line to the magnetic field sensor, and
   a protective layer on the package body to surround the magnetic field sensor and the conductive line.

2. The magnetic field sensor package of claim 1, wherein the conductive line is spaced apart from the sensor assembly in the magnetic field sensor.

3. The magnetic field sensor package of claim 2, wherein the magnetic field sensor is disposed on the conductive line and the magnetic substance.

4. The magnetic field sensor package of claim 3, wherein a bottom part of the magnetic field sensor comprises
   a first part directly contacted with the conductive line, and
   a second part directly contacted with the magnetic substance.

5. The magnetic field sensor package of claim 4, wherein the magnetic substance is formed vertically under the sensor assembly in a direction perpendicular to an extension direction of the sensor assembly.

6. The magnetic field sensor package of claim 5, wherein a top surface of the magnetic substance is located vertically under a region formed therein with the sensor assembly and overlapped with the region formed therein with the sensor assembly.

7. The magnetic field sensor package of claim 5, further comprising a conductive line pad on the package body and directly connected with the conductive line.

8. The magnetic field sensor package of claim 7, wherein the package body is formed therein with a groove, and the magnetic substance is inserted into the groove while being vertically erected.

9. The magnetic field sensor package of claim 8, wherein a top surface of the magnetic substance is exposed through a surface of the package body, and the magnetic field sensor is attached to the exposed top surface of the magnetic substance and a top surface of the conductive line.

10. The magnetic field sensor package of claim 8, further comprising a coil wound around the magnetic substance.

11. The magnetic field sensor package of claim 10, wherein the coil is formed of a same material as that of the conductive line and with a thickness equal to that of the conductive line.

12. The magnetic field sensor package of claim 8, wherein the conductive line is spaced apart from the magnetic substance inserted into the groove by a predetermined distance to surround a peripheral part of the magnetic substance.

13. The magnetic field sensor package of claim 8, further comprising a connection line disposed in the groove and to connect the conductive line with the coil.

14. The magnetic field sensor package of claim 5, wherein the conductive line is formed to partially circle around a first region formed in the package body, and the first region is located vertically under a second region formed therein with the sensor assembly to be overlapped with at least a portion of the second region when viewed from a top of the package body.

15. The magnetic field sensor package of claim 14, wherein the magnetic substance is buried in the first region, and the conductive line is spaced apart from the magnetic substance by a predetermined distance to surround a peripheral part of the magnetic substance.

16. The magnetic field sensor package of claim 14, wherein the conductive line is located vertically under the second region and arranged in a region that is not overlapped with the second region.

17. The magnetic field sensor package of claim 2, further comprising a control device provided on the package body and adjacent to the magnetic field sensor.

18. The magnetic field sensor package of claim 2, wherein the magnetic field sensor further comprises
   a substrate.

19. The magnetic field sensor package of claim 1, wherein the conductive line generates a magnetic field applied perpendicularly to the sensor assembly.

* * * * *